US006602645B1

(12) United States Patent
Nakamura et al.

(10) Patent No.: US 6,602,645 B1
(45) Date of Patent: Aug. 5, 2003

(54) PHOTOSENSITIVE COMPOSITION AND PLANOGRAPHIC PRINTING PLATE BASE USING SAME

(75) Inventors: Tatsuo Nakamura, deceased, late of Shizuoka-ken (JP); by Kunio Nakamura, legal representative, Tokyo (JP); Kazuto Kunita, Shizuoka-ken (JP); Katsuji Kitatani, Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 09/573,159

(22) Filed: May 19, 2000

(30) Foreign Application Priority Data

May 21, 1999 (JP) .......................................... 11-141993
Jun. 11, 1999 (JP) .......................................... 11-165506

(51) Int. Cl.[7] ................................................ G03F 7/039

(52) U.S. Cl. .................... 430/270.1; 430/302; 430/964; 101/467

(58) Field of Search ............................. 430/270.1, 302, 430/303, 964; 101/467

(56) References Cited

U.S. PATENT DOCUMENTS

| | | | | |
|---|---|---|---|---|
| 5,166,025 A | * | 11/1992 | Kaieda et al. | 430/78 |
| 5,840,449 A | * | 11/1998 | Zambounis et al. | 430/7 |
| 6,066,729 A | * | 5/2000 | Fujita et al. | 540/125 |
| 6,090,532 A | * | 7/2000 | West et al. | 430/326 |
| 6,106,996 A | * | 8/2000 | Van Damme et al. | 430/271.1 |
| 6,140,022 A | * | 10/2000 | Van Damme et al. | 430/302 |
| 6,143,471 A | * | 11/2000 | Takata et al. | 430/281.1 |
| 6,174,646 B1 | * | 1/2001 | Hirai et al. | 430/302 |
| 6,232,038 B1 | * | 5/2001 | Takasaki et al. | 430/281.1 |

FOREIGN PATENT DOCUMENTS

| | | | |
|---|---|---|---|
| EP | 406 001 A2 * | 1/1991 | G03G/5/06 |
| EP | 0887182 | 12/1998 | |
| EP | 0916513 A2 | 5/1999 | |
| EP | 0 978 375 A2 | 2/2000 | |
| WO | WO97/39894 | 10/1997 | |
| WO | WO99/11458 | 3/1999 | |

* cited by examiner

*Primary Examiner*—Rosemary Ashton
*Assistant Examiner*—Barbara Gilliam
(74) *Attorney, Agent, or Firm*—Burns, Doane, Swecker & Mathis, LLP

(57) ABSTRACT

The present invention provides a photosensitive composition for an infrared laser used for direct plate making, which has high sensitivity and good developing latitude and storage stability, and provides a planographic printing plate in which this composition is used. The positive-type photosensitive composition of the present invention has (a) a macromolecular compound having alkali-soluble groups and (b) a compound that has a phthalocyanine skeleton and has in its molecule at least one group which can form a bond by interaction with an alkali-soluble group in the macromolecular compound (a).

6 Claims, No Drawings

PHOTOSENSITIVE COMPOSITION AND PLANOGRAPHIC PRINTING PLATE BASE USING SAME

BACKGROUND OF THE INVENTION

1. Field of the Invention

The present invention relates to a photosensitive composition that is favorable as a positive image formation material, and to a planographic printing plate base in which this composition is used, and more particularly relates to a photosensitive composition that forms a positive image through the solubilization of an infrared irradiation portion, which is favorable for a planographic printing plate base that is writable by means of heart from an infrared laser, thermal head, or the like, and particularly one that is used in so-called direct plate making, with which a plate can be produced directly from the digital signals of a computer or the like, and to a planographic printing plate base that makes use of this composition.

2. Description of the Related Art

As advances have been made in recent years in solid state lasers and semiconductor lasers having an emission band ranging from near infrared to infrared, there has been a great deal of interest in systems for direct plate making from the digital data of a computer, in which these infrared lasers are used.

Japanese Patent Application Laid-Open (JP-A) No. H7-285275 discloses a positive-type planographic printing plate material for an infrared laser used in direct plate making. This invention is an image recording material produced by adding a substance that absorbs light and generates heat, and a positive-type photosensitive compound such as a quinone diazide compound to an alkali aqueous solution-soluble resin. In the image portion, the positive-type photosensitive compound serves as a dissolution inhibitor that substantially lowers the solubility of the alkali aqueous solution-soluble resin, and in the non-image portion this photosensitive compound is decomposed by heat and rendered incapable of inhibiting dissolution, and can be removed by developing, thereby forming an image.

Meanwhile, onium salts and alkali-insoluble hydrogen-bondable compounds are also known to have an alkali dissolution inhibiting action on alkali-soluble polymers. It is stated in WO97/39894 that with an image formation material corresponding to this type of infrared laser, a positive action is exhibited by a composition in which a cationic infrared absorbing colorant is used as the dissolution inhibitor for an alkali aqueous solution-soluble polymer. This positive action is such that the infrared absorbing colorant absorbs the laser light, and the heat thus generated eliminates the dissolution inhibiting effect of the polymer film in the irradiated portion, allowing an image to be formed.

In this case, the image formability is adequate on the laser irradiated surface of the photosensitive material, but a satisfactory effect is not obtained in the deep part of the material due to heat diffusion, and it is therefore difficult for the alkali developing to be turned on and off in the exposed and unexposed portions, which is a problem in that a good image is not obtained (low sensitivity and a narrow developing latitude). The term "developing latitude" as used here refers to a tolerance range in which a good image can be formed when the alkali concentration is varied in the alkali developing solution.

A cyanine-based infrared absorbing colorant has usually been used as the substance that absorbs laser light and converts it to heat in these image formation materials that form a positive image, but while these [colorants] do have high sensitivity, they are susceptible to degradation by heat and light, which poses storage stability problems.

SUMMARY OF THE INVENTION

It is an object of the present invention to provide photosensitive composition which has high sensitivity and good developing latitude and storage stability, and a positive-type planographic printing plate base for direct plate making, which makes use of this photosensitive composition and allows an image to be formed at high sensitivity with an infrared laser.

The inventors conducted diligent research aimed at achieving better image formability, that is, sensitivity and storage stability. As a result, they discovered as the first aspect of the present invention that excellent sensitivity and storage stability can be achieved by using an infrared absorbent having a specific phthalocyanine skeleton.

Specifically, the first photosensitive composition of the present invention contains (a) a macromolecular compound having alkali-soluble groups, and (b) a compound that has a phthalocyanine skeleton and has in its molecule at least one group which can form a bond by interaction with an alkali-soluble group in said macromolecular compound (a), wherein [the photosensitive composition] becomes soluble in an alkali aqueous solution upon irradiation with infrared rays.

It is preferable for the compound (b) that has a phthalocyanine skeleton used here to be expressed by the following General Formula 1.

General Formula 1

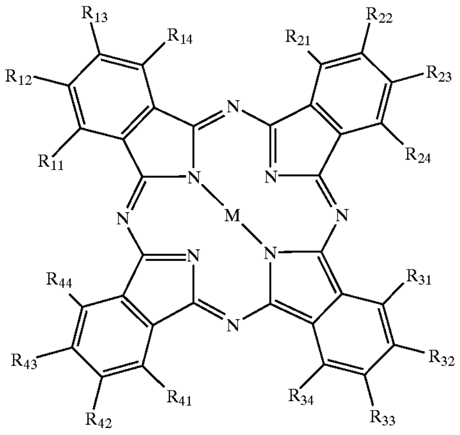

Here, $R_{11}$ to $R_{14}$, $R_{21}$ to $R_{24}$, $R_{31}$ to $R_{34}$ and $R_{41}$ to $R_{44}$ each independently represent substitutable hydrogen atom, halogen atom, cyano group, alkyl group, aryl group, alkenyl group, alkynyl group, hydroxyl group, carbonyl group, thio group, sulfonyl group, sulfinyl group, oxy group, amino group, or onium salt structure, and at least one of these $R_{11}$ to $R_{14}$, $R_{21}$ to $R_{24}$, $R_{31}$ to $R_{34}$ and $R_{41}$ to $R_{44}$ groups is selected from the group consisting of an amino group, hydroxyl group, thio group, carbonyl group, sulfonyl group, sulfinyl group, oxy group, and onium salt structure. Two or more of the $R_{11}$ to $R_{14}$, $R_{21}$ to $R_{24}$, $R_{31}$ to $R_{34}$ and $R_{41}$ to $R_{44}$ groups may be bonded together to form a ring. M represents two hydrogen atoms or a metal atom, halometal group, or oxymetal group.

The action of the present invention is not entirely clear, but it is believed that the presence of the alkali-soluble groups in the (a) macromolecular compound having alkali-soluble groups, and the groups which can form a bond by interaction with these alkali-soluble groups, which are present in the (b) compound having a phthalocyanine skeleton (hereinafter referred to as "phthalocyanine compound"), results in the formation of bonds between the two, preventing the association of the (b) phthalocyanine compound molecules in a coating film composed of this photosensitive composition, suppressing fluctuations in their association with the (a) macromolecular compound, and enhancing storage stability.

It is also believed that a phthalocyanine compound makes it possible through this interaction for the heat converted from light to be transmitted more efficiently to a coating film composed of the macromolecular compound. This probably results in a desirable effect in terms of better sensitivity.

Examples of bonds that can be formed by interaction between these functional groups include ionic bonds (including interaction between acid group and basic group), hydrogen bonds, coordination bonds, electrostatic interaction, and charge transfer interaction. Ionic bonds and hydrogen bonds are particularly favorable.

Most phthalocyanine compounds are prone to association and have low solvent solubility, so they are commonly used as pigments, but due to problems including print soiling attributable to the developing gas, these compounds have usually been considered unsuited to use in photosensitive compositions such as that of the present invention. A phthalocyanine compound has nitrogen atoms in its own skeleton, but it is believed that by additionally introducing substituents capable of forming bonds through interaction into the molecules as in the present invention, bonds are formed and the solubility of the phthalocyanine compound itself is also increased, resulting in the excellent effect characteristic of the present invention.

As a result of diligent research aimed at enhancing image formability (sensitivity and developing latitude) and storage stability, the inventors discovered as the second characteristic of the present invention that image formation with high discrimination (a large difference in dissolution rate between the exposed and unexposed portions) is possible by using a specific pyrylium salt-based colorant.

Specifically, the second photosensitive composition of the present invention is a positive-type photosensitive composition containing a macromolecular compound having acidic groups and an infrared absorbent expressed by the following General Formula 2, wherein the alkali aqueous solution solubility of the photosensitive composition is suppressed prior to infrared irradiation, but [said photosensitive composition] becomes soluble in an alkali aqueous solution upon infrared irradiation.

General Formula 2

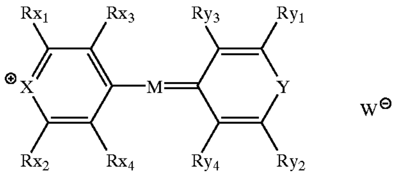

(In General Formula 2, X and Y represent each an oxygen atom, sulfur atom, selenium atom, or tellurium atom. M represents a methine chain with at least five conjugated carbons. Rx1 to Rx4 and Ry1 to Ry4 may be the same or different and are each a hydrogen atom, halogen atom, cyano group, alkyl group, aryl group, alkenyl group, alkynyl group, carbonyl group, thio group, sulfonyl group, sulfinyl group, oxy group, or amino group. W— is an anion.)

The reason that the favorable result mentioned above (high discrimination) is obtained is not exactly clear, but it is believed that because a specific end group (pyrylium) is used, the efficiency at which light is converted into heat (light-heat conversion efficiency) is higher than with a cyanine-based colorant or the like.

The planographic printing plate base pertaining to the present invention is characterized in that a photosensitive layer composed of the above-mentioned photosensitive composition of the present invention is provided over a support.

DESCRIPTION OF THE PREFERRED EMBODIMENTS

The first embodiment of the present invention will now be described.

The photosensitive composition in this embodiment is characterized by having (a) a macromolecular compound having alkali-soluble groups and (b) a compound that has a phthalocyanine skeleton and has in its molecule at least one group which can form a bond by interaction with an alkali-soluble group in this macromolecular compound (a). The phthalocyanine compound that is a characteristic component of this embodiment will now be described.

(b) Phthalocyanine Compound

Any type of phthalocyanine compound can be used favorably in this embodiment as long as it has in its molecule a group which can form a bond by interaction with an alkali-soluble group in the concurrently used macromolecular compound (a), but a compound that is soluble is preferred in this embodiment. As an index of the solubility thereof, it is preferable for this compound to exhibit solubility of at least 0.001 wt % with respect to the various solvents used in coating (discussed below). Solubility of at least 0.01 wt % is even better, and solubility of at least 0.1 wt % is best.

Examples of phthalocyanine compounds that can be used to advantage in this embodiment include those expressed by the above-mentioned General Formula 1.

In General Formula 1, $R_{11}$ to $R_{14}$, $R_{21}$ to $R_{24}$, $R_{31}$ to $R_{34}$ and $R_{41}$ to $R_{44}$ each independently represent a substitutable hydrogen atom, halogen atom, cyano group, alkyl group, aryl group, alkenyl group, alkynyl group, hydroxyl group, carbonyl group, thio group, sulfonyl group, sulfinyl group, oxy group, amino group, or onium salt structure, and at least one of these $R_1$, to $R_{14}$, $R_{21}$ to $R_{24}$, $R_{31}$ to $R_{34}$ and $R_{41}$ to $R_{44}$ groups is selected from the group consisting of an amino group, hydroxyl group, thio group, carbonyl group, sulfonyl group, sulfinyl group, oxy group, and onium salt structure. Two or more of the $R_{11}$, to $R_{14}$, $R_{21}$ to $R_{24}$, $R_{31}$ to $R_{34}$ and $R_{41}$ to $R_{44}$ groups may be bonded together to form a ring. M represents two hydrogen atoms or a metal atom, halometal group, or oxymetal group.

Specifically, it is preferable for a substituent for increasing the solubility of the above-mentioned phthalocyanine compound to be introduced therein, and it is preferable for this substituent itself to have a group capable of interacting with the alkali-soluble groups present in the macromolecular compound (a). Conversely, a substituent that is bulky but does not interact, such as a t-butyl group or pentyl group, is undesirable because it has poor miscibility with the macromolecular compound and will therefore be prone to association over time and have low storage stability.

Examples of bonds that can be formed by interaction include ionic bonds (including interaction between acid group and basic group), hydrogen bonds, coordination bonds, electrostatic interaction, and charge transfer interaction. Examples of favorable interacting substituents include weakly basic groups (such as an amino group) and hydrogen-bondable groups (such as a hydroxyl group, carbonyl group, oxy group, thio group, sulfonyl group, sulfinyl group, or a group having an onium salt structure). The structures of these interacting groups are shown below, but of these, amino groups and groups having an onium salt structure are particularly favorable from the standpoint of ease of interaction.

amino group $—NH_2$ or —NH— or

hydroxyl group —OH, carbonyl group

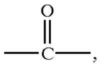

oxy group —O—, thio group —SH or —S— sulfonyl group —SO—, sulfinyl group —SO—

When any of the $R_{11}$, to $R_{14}$, $R_{21}$ to $R_{24}$, $R_{31}$ to $R_{34}$ and $R_{41}$ to $R_{44}$ groups is an alkyl group, examples of this alkyl group include linear, branched, and cyclic alkyl groups with from 1 to 20 carbon atoms. Specific examples include the methyl group, ethyl group, propyl group, butyl group, pentyl group, hexyl group, heptyl group, octyl group, noryl group, decyl group, undecyl group, dodecyl group, tridecyl group, hexadecyl group, octadecyl group, eicosyl group, isopropyl group, isobutyl group, s-butyl group, t-butyl group, isopentyl group, neopentyl group, 1-methylbutyl group, isohexyl group, 2-ethylhexyl group, 2-methylhexyl group, cyclohexyl group, cyclopentyl group, and 2-norbornyl group of these, alkyl groups that are linear and have from 1 to 12 carbon atoms, are branched and have from 3 to 12 carbon atoms, and are cyclic and have from 5 to 10 carbon atoms are preferable.

These alkyl groups may have a substituent, and any monovalent non-metal atom group except for hydrogen can be used as this substituent. Favorable examples include a halogen atom (—F, —Br, —Cl, —I), hydroxyl group, alkoxy group, aryloxy group, mercapto group, alkylthio group, arylthio group, alkyldithio group, aryldithio group, amino group, N-alkylamino group, N,N-dialkylamino group, N-arylamino group, N,N-diarylamino group, N-alkyl-N-arylamino group, acyloxy group, carbamoyloxy group, N-alkylcarbamoyloxy group, N-arylcarbamoyloxy group, N,N-dialkylcarbamoyloxy group, N,N-diarylcarbamoyloxy group, N-alkyl-N-arylcarbamoyloxy group, alkylsulfoxy group, arylsulfoxy group, acylthio group, acylamino group, N-alkylacylamino group, N-arylacylamino group, ureido group, N'-alkylureido group, N',N'-dialkylureido group, N'-arylureido group, N',N'-diarylureido group, N'-alkyl-N'-arylureido group, N-alkylureido group, N-arylureido group, N'-alkyl-N-alkylureido group, N'-alkyl-N-arylureido group, N',N'-dialkyl-N-alkylureido group, N',N'-dialkyl-N-arylureido group, N'-aryl-N-alkylureido group, N'-aryl-N-arylureido group, N',N'-diaryl-N-alkylureido group, N',N'-diaryl-N-arylureido group, N'-alkyl-N'-aryl-N-alkylureido group, N'-alkyl-N'-aryl-N-arylureido group, alkoxycarbonylamino group, aryloxycarbonylamino group, N-alkyl-N-alkoxycarbonylamino group, N-alkyl-N-aryloxycarbonylamino group, N-aryl-N-alkoxycarbonylamino group, N-aryl-N-aryloxycarbonylamino group, formyl group, acyl group, carboxyl group and conjugated base group thereof (hereinafter referred to as "carboxylato group"), alkoxycarbonyl group, aryloxycarbonyl group, carbamoyl group, N-alkylcarbamoyl group, N,N-dialkylcarbamoyl group, N-arylcarbamoyl group, N,N-diarylcarbamoyl group, N-alkyl-N-arylcarbamoyl group, alkylsulfinyl group, arylsulfinyl group, alkylsulfonyl group, arylsulfonyl group, sulfo group ($—SO_3H$) and conjugated base group thereof (hereinafter referred to as "sulfonato group"), alkoxysulfonyl group, aryloxysulfonyl group, sulfinamoyl group, N-alkylsulfinamoyl group, N,N-dialkylsulfinamoyl group, N-arylsulfinamoyl group, N,N-diarylsulfinamoyl group, N-alkyl-N-arylsulfinamoyl group, sulfamoyl group, N-alkylsulfamoyl group, N,N-dialkylsulfamoyl group, N-arylsulfamoyl group, N,N-diarylsulfamoyl group, N-alkyl-N-arylsulfamoyl group, N-acrylsulfamoyl group and conjugated base group thereof, N-alkylsulfonylsulfamoyl group ($—SO_2NHSO_2R$, where R is an alkyl group) and conjugated base group thereof, N-arylsulfonylsulfamoyl group ($—SO_2NHSO_2Ar$, where Ar is an aryl group) and conjugated base group thereof, N-alkylsulfonylcarbamoyl group ($—CONHSO_2R$, where R is an alkyl group) and conjugated base group thereof, N-arylsulfonylcarbamoyl group ($—CONHSO_2Ar$, where Ar is an aryl group) and conjugated base group thereof, alkoxysilyl group ($—Si(OR)_3$, where R is an alkyl group), aryloxysilyl group ($—Si(OAr)_3$, where Ar is an aryl group), hydroxysilyl group ($—Si(OH)_3$) and conjugated base group thereof, phosphono group ($—PO_3H_2$) and conjugated base group thereof (hereinafter referred to as "phosphonato group"), dialkylphosphono group ($—PO_3R_2$, where R is an alkyl group), diarylphosphono group ($—PO_3Ar_2$, where Ar is an aryl group), alkylarylphosphono group ($—PO_3(R)(Ar)$, where R is an alkyl group and Ar is an aryl group), monoalkylphosphono group ($—PO_3H(R)$, where R is an alkyl group) and conjugated base group thereof (hereinafter referred to as "alkylphosphonato group"), monoarylphosphono group ($—PO_3H(Ar)$, where Ar is an aryl group) and conjugated base group thereof (hereinafter referred to as "arylphosphonato group"), phosphono-oxy group ($—OPO_3H_2$) and conjugated base group thereof (hereinafter referred to as "phosphonato-oxy group"), dialkylphosphono-oxy group ($—OPO_3(R)_2$, where R is an alkyl group), diarylphosphono-oxy group ($—OPO_3(Ar)$, where Ar is an aryl group), alkylarylphosphono-oxy group ($—OPO_3(R)(Ar)$, where R is an alkyl group and Ar is an aryl group), monoalkylphosphono-oxy group ($—OPO_3H(R)$, where R is an alkyl group) and conjugated base group thereof (hereinafter referred to as "alkylphosphonato-oxy group"), monoarylphosphono-oxy group ($—OPO_3H(Ar)$, where Ar is an aryl group) and conjugated base group thereof (hereinafter referred to as "arylphosphonato-oxy group"), cyano group, nitro group, aryl group, alkenyl group, and alkynyl group. Specific examples of the alkyl groups in these substituents include the alkyl groups already listed as examples of $R_{11}$, to $R_{14}$, $R_{21}$ to $R_{24}$, $R_{31}$ to $R_{34}$ and $R_{41}$ to $R_{44}$ and specific examples of the aryl groups include the phenyl group, biphenyl group, naphthyl group, tolyl group, xylyl group, mesityl group, cumenyl group, fluorophenyl group, chlorophenyl group, bromophenyl group, chloromethylphenyl group, hydroxyphenyl group, methoxyphenyl group, ethoxyphenyl group, phenoxyphenyl group, acetoxyphenyl group, benzoyloxyphenyl group, methylthiophenyl group, phenylthiophenyl group, methylaminophenyl group, dimethylaminophenyl group, acetylaminophenyl group, carboxyphenyl group, methoxycarbonylphenyl group, ethoxycarbonylphenyl group, phenoxycarbonylphenyl group, N-phenylcarbamoylphenyl group, nitrophenyl group, cyanophenyl group, sulfophenyl group, sulfonatophenyl group, phosphonophenyl group, and phosphonatophenyl group. Examples of alkenyl groups include the vinyl group, 1-propenyl group, 1-butenyl group, cinnamyl group, and 2-chloro-1-ethenyl group. Examples of alkynyl groups include the ethynyl group, 1-propynyl group, 1-butynyl group, trimethylsilylethynyl group, and phenylethynyl group. Examples of the above-mentioned acyl group (R1CO—) include those in which R1 is a hydrogen atom or one of the above-mentioned alkyl groups, aryl groups, alkenyl groups, or alkynyl groups.

Of these substituents, particularly favorable examples include a halogen atom (—F, —Br, —Cl, —I), alkoxy group, aryloxy group, alkylthio group, arylthio group, N-alkylamino group, N,N-dialkylamino group, acyloxy group, N-alkylcarbamoyloxy group, N-arylcarbamoyloxy group, acylamino group, formyl group, acyl group, carboxyl group, alkoxycarbonyl group, aryloxycarbonyl group, carbamoyl group, N-alkylcarbamoyl group, N,N-dialkylcarbamoyl group, N-arylcarbamoyl group, N-alkyl-N-arylcarbamoyl group, sulfo group, sulfonato group, sulfamoyl group, N-alkylsulfamoyl group, N,N-dialkylsulfamoyl group, N-arylsulfamoyl group, N-alkyl-N-arylsulfamoyl group, phosphono group, phosphonato group, dialkylphosphono group, diarylphosphono group, monoalkylphosphono group, alkylphosphonato group, monoarylphosphono group, arylphosphonato group, phosphono-oxy group, phosphonato-oxy group, aryl group, and alkenyl group.

Meanwhile, examples of the alkylene groups in the substituted alkyl groups include the above-mentioned C1 to C20 alkyl groups in which one of the hydrogen atoms has been removed, leaving a divalent organic residue. Preferable examples include alkylene groups that are linear and have from 1 to 12 carbon atoms, are branched and have from 3 to 12 carbon atoms, and are cyclic and have from 5 to 10 carbon atoms. Specific, favorable examples of substituted alkyl groups obtained by combining these substituents and alkylene groups include the chloromethyl group, bromomethyl group, 2-chloroethyl group, trifluoromethyl group, methoxymethyl group, methoxyethoxyethyl group, allyloxymethyl group, phenoxymethyl group, methylthiomethyl group, tolylthiomethyl group, ethylaminoethyl group, diethylaminopropyl group, morpholinopropyl group, acetyloxymethyl group, benzoyloxymethyl group, N-cyclohexylcarbamoyloxyethyl group, N-phenylcarbamoyloxyethyl group, acetylaminoethyl group, N-methylbenzoylaminopropyl group, 2-oxoethyl group, 2-oxopropyl group, carboxypropyl group, methoxycarbonylethyl group, methoxycarbonylmethyl group, methoxycarbonylbutyl group, allyloxycarbonylbutyl group, chlorophenoxycarbonylmethyl group, carbamoylmethyl group, N-methylcarbamoylethyl group, N,N-dipropylcarbamoylmethyl group, N-(methoxyphenyl)carbamoylethyl group, N-methyl-N-(sulfophenyl)carbamoylmethyl group, sulfopropyl group, sulfobutyl group, sulfonatobutyl group, sulfamoylbutyl group, N-ethylsulfamoylmethyl group, N,N-dipropylsulfamoylpropyl group, N-tolylsulfamoylpropyl group, N-methyl-N-(phosphonophenyl)sulfamoyloctyl group, phosphonobutyl group, phosphonohexyl group, diethylphosphonobutyl group, diphenylphosphonopropyl group, methylphosphonobutyl group, methylphosphonatobutyl group, tolylphosphonohexyl group, tolylphosphonatohexyl group, phosphono-oxypropyl group, phosphonatooxybutyl group, benzyl group, phenethyl group, α-methylbenzyl group, 1-methyl-1-phenylethyl group, p-methylbenzyl group, cinnamyl group, allyl group, 1-propenylmethyl group, 2-butenyl group, 2-methylallyl group, 2-methylpropenylmethyl group, 2-propynyl group, 2-butynyl group, and 3-butynyl group.

When any of the $R_{11}$, to $R_{14}$, $R_{21}$ to $R_{24}$, $R_{31}$ to $R_{34}$ and $R_{41}$ to $R_{44}$ groups represents an aryl group, examples of this aryl group include those in which from one to three benzene rings have formed a condensed ring, and those in which a benzene ring and a five-member unsaturated ring have formed a condensed ring. Specific examples include the phenyl group, naphthyl group, anthryl group, phenanthryl group, indenyl group, acenaphthenyl group, and fluorenyl group of these, the phenyl group and naphthyl group are particularly favorable.

The substituted aryl group is one having a monovalent non-metal atom group other than hydrogen as the substituent on the ring-forming carbon atoms of the above-mentioned aryl groups. Examples of preferable substituents include the above-mentioned alkyl groups, substituted alkyl groups, and groups listed as substituents in these substituted alkyl groups.

Specific, favorable examples of substituted aryl groups include the biphenyl group, tolyl group, xylyl group, mesityl group, cumenyl group, chlorophenyl group, bromophenyl group, fluorophenyl group, chloromethylphenyl group, trifluoromethylphenyl group, hydroxyphenyl group, methoxyphenyl group, methoxyethoxyphenyl group, allyloxyphenyl group, phenoxyphenyl group, methylthiophenyl group, tolylthiophenyl group, phenylthiophenyl group, ethylaminophenyl group, diethylaminophenyl group, morpholinophenyl group, acetyloxyphenyl group, benzoyloxyphenyl group, N-cyclohexylcarbamoyloxyphenyl group, N-phenylcarbamoyloxyphenyl group, acetylaminophenyl group, N-methylbenzoylaminophenyl group, carboxyphenyl group, methoxycarbonylphenyl group, allyloxycarbonylphenyl group, chlorophenoxycarbonylphenyl group, carbamoylphenyl group, N-methylcarbamoylphenyl group, N,N-dipropylcarbamoylphenyl group, N-(methoxyphenyl)carbamoylphenyl group, N-methyl-N-(sulfophenyl)carbamoylphenyl group, sulfophenyl group, sulfonatophenyl group, sulfamoylphenyl group, N-ethylsulfamoylphenyl group, N,N-dipropylsulfamoylphenyl group, N-tolylsulfamoylphenyl group, N-methyl-N-(phosphonophenyl)sulfamoylphenyl group, phosphonophenyl group, phosphonatophenyl group, diethylphosphonatophenyl group, diphenylphosphonophenyl group, methylphosphonophenyl group, methylphosphonatophenyl group, tolylphosphonophenyl group, tolylphosphonatophenyl group, allyl group, 1-propenylmethyl group, 2-butenyl group, 2-methylallylphenyl group, 2-methylpropenylphenyl group, 2-propynylphenyl group, 2-butynylphenyl group, and 3-butynylphenyl group.

When any of $R_{11}$ to $R_{14}$, $R_{21}$ to $R_{24}$, $R_{31}$ to $R_{34}$ and $R_{41}$ to $R_{44}$ represents an alkenyl group or alkynyl group, examples of alkenyl groups, substituted alkenyl groups, alkynyl groups, and substituted alkynyl groups (—C(R7)=C(R8)(R9) and —C≡C(R10)) that can be used are those in which R7, R8, R9, and R10 are monovalent non-metal atom groups. Favorable examples of R7, R8, R9, and R10 include a hydrogen atom, halogen atom, alkyl group, substituted alkyl group, aryl group, and substituted aryl group. Specific examples of these are the same as listed above. Examples of favorable substituents for R7, R8, R9, and R10 include a hydrogen atom, halogen atom, or linear, branched, or cyclic alkyl group with 1 to 10 carbon atoms.

Specific examples of these $R_{11}$ to $R_{14}$, $R_{21}$ to $R_{24}$, $R_{31}$ to $R_{34}$ and $R_{41}$ to $R_{44}$ groups include the methyl group, ethyl group, propyl group, butyl group, pentyl group, hexyl group, heptyl group, octyl group, nonyl group, decyl group, undecyl group, dodecyl group, tridecyl group, hexadecyl group, octadecyl group, eicosyl group, isopropyl group, isobutyl group, s-butyl group, t-butyl group, isopentyl group, neopentyl group, 1-methylbutyl group, isohexyl group, 2-ethylhexyl group, allyl group, 1-propenylmethyl group, 2-butenyl group, 2-methylallyl group, 2-methylpropenyl group, 2-propynyl group, 2-butynyl group, 3-butynyl group, benzyl group, phenethyl group, α-methylbenzyl group, 1-methyl-1-phenethyl group, p-methylbenzyl group, cinnamyl group, hydroxyethyl group, methoxyethyl group, phenoxydiethyl group, allyloxyethyl group, methoxyethoxyethyl group, ethoxyethoxyethyl group, morpholinoethyl group, morpholinopropyl group, sulfopropyl group, sulfonatopropyl group, sulfobutyl group, sulfonatobutyl group, carboxydimethyl group, carboxydiethyl group, carboxypropyl group, methoxycarbonylethyl group, 2-ethylhexyloxycarbonylethyl group, phenoxycarbonylmethyl group, methoxycarbonylpropyl group, N-methylcarbamoylethyl group, N,N-ethylaminocarbamoylmethyl group, N-phenylcarbamoylpropyl group, N-tolylsulfamoylbutyl group, p-trienesulfonylaminopropyl group, benzoylaminohexyl group, phosphonomethyl group, phosphonoethyl group, phosphonopropyl group, p-phosphonobenzylaminocarbonylethyl group, phosphonatomethyl group, phosphonatopropyl group, phosphonatobutyl group, p-phosphonatobenzylaminocarbonylethyl group, vinyl group, and ethynyl group.

A substituted carbonyl (R11CO—) group corresponding to $R_{11}$ to $R_{14}$, $R_{21}$ to $R_{24}$, $R_{31}$ to $R_{34}$ and $R_{41}$ to $R_{44}$ can be one in which R11 is a monovalent non-metal atom group. Favorable examples of substituted carbonyl groups include the formyl group, acyl group, carboxyl group, alkoxycarbonyl group, aryloxycarbonyl group, carbamoyl group, N-alkylcarbamoyl group, N,N-dialkylcarbamoyl group, N-arylcarbamoyl group, N,N-dialkylcarbamoyl group, and N-alkyl-N-arylcarbamoyl group. Examples of the alkyl groups and aryl groups in these include those listed above as examples of alkyl groups, substituted alkyl groups, aryl groups, and substituted aryl groups. of these, examples of preferred substituents include a formyl group, acyl group, carboxyl group, alkoxycarbonyl group, aryloxycarbonyl group, carbamoyl group, N-alkylcarbamoyl group, N,N-dialkylcarbamoyl group, and N-arylcarbamoyl group, and especially favorable examples include a formyl group, acyl group, alkoxycarbonyl group, and aryloxycarbonyl group. Specific examples of favorable substituents include a formyl group, acetyl group, benzoyl group, carboxyl group, methoxycarbonyl group, allyloxycarbonyl group, N-methylcarbamoyl group, N-phenylcarbamoyl group, N,N-diethylcarbamoyl group, and morpholinocarbonyl group.

A substituted thio group (R14S—) can be one in which R14 is a monovalent non-metal atom group other than hydrogen. Examples of favorable substituted thio groups include an alkylthio group, arylthio group, alkyldithio group, aryldithio group, and acylthio group. Examples of the alkyl groups and aryl groups in these include those listed above as examples of alkyl groups, substituted alkyl groups, aryl groups, and substituted aryl groups. Of these, alkylthio groups and arylthio groups are preferred. Specific examples of favorable substituted thio groups include a methylthio group, ethylthio group, phenylthio group, ethoxyethylthio group, carboxyethylthio group, and methoxycarbonylthio group.

A substituted sulfonyl group ($R19SO_2$—) can be one in which R19 is a monovalent non-metal atom group. Preferred examples include alkylsulfonyl groups and arylsulfonyl groups. Examples of the alkyl groups and aryl groups in these include those listed above as examples of alkyl groups, substituted alkyl groups, aryl groups, and substituted aryl groups. Specific examples of substituted sulfonyl groups include a butylsulfonyl group and chlorophenylsulfonyl group.

A substituted sulfinyl group (R18SO—) can be one in which R18 is a monovalent non-metal atom group. Preferred examples include an alkylsulfinyl group, arylsulfinyl group, sulfinamoyl group, N-alkylsulfinamoyl group, N,N-dialkylsulfinamoyl group, N-arylsulfinamoyl group, N,N-diarylsulfinamoyl group, and N-alkyl-N-arylsulfinamoyl group. Examples of the alkyl groups and aryl groups in these include those listed above as examples of alkyl groups, substituted alkyl groups, aryl groups, and substituted aryl groups. Of these, preferred examples include alkylsulfinyl groups and arylsulfinyl groups. Specific examples of these substituted sulfinyl groups include a hexylsulfinyl group, benzylsulfinyl group, and tolylsulfinyl group.

A substituted oxy group (R12O—) can be one in which R12 is a monovalent non-metal atom group other than hydrogen. Examples of favorable substituted oxy groups include an alkoxy group, aryloxy group, acyloxy group, carbamoyloxy group, N-alkylcarbamoyloxy group, N-arylcarbamoyloxy group, N,N-dialkylcarbamoyloxy group, N,N-diarylcarbamoyloxy group, N-alkyl-N-arylcarbamoyloxy group, alkylsulfoxy group, arylsulfoxy group, phosphono-oxy group, and phosphonato-oxy group. Examples of the alkyl groups and aryl groups in these include those listed above as examples of alkyl groups, substituted alkyl groups, aryl groups, and substituted aryl groups. Examples of the acyl group (R13CO—) in the acyloxy groups include those in which R13 is of the above-mentioned alkyl groups, substituted alkyl groups, aryl groups, or substituted aryl groups. of these substituents, alkoxy groups, aryloxy groups, acyloxy groups, and arylsulfoxy groups are preferred. Specific examples of favorable substituted oxy groups include the methoxy group, ethoxy group, propyloxy group, isopropyloxy group, butyloxy group, pentyloxy group, hexyloxy group, dodecyloxy group, benzyloxy group, allyloxy group, phenethyloxy group, carboxyethyloxy group, methoxycarbonylethoxy group, ethoxycarbonylethyloxy group, methoxyethoxy group, phenoxyethoxy group, methoxyethoxyethoxy group, ethoxyethoxyethoxy group, morpholinoethoxy group, morpholinopropyloxy group, allyloxyethoxyethoxy group, phenoxy group, tolyloxy group, xylyloxy group, mesityloxy group, cumenyloxy group, methoxyphenyloxy group, ethoxyphenyloxy group, chlorophenyloxy group, bromophenyloxy group, acetyloxy group, benzoyloxy group, naphthyloxy group, phenylsulfonyloxy group, phosphono-oxy group, and phosphonato-oxy group.

A substituted amino group (R15NH—, (R16) (R17)N—) can be one in which R15, R16, and R17 represent each a monovalent non-metal atom group other than hydrogen. Examples of favorable substituted amino groups include an N-alkylamino group, N,N-dialkylamino group, N-arylamino group, N,N-diarylamino group, N-alkyl-N-arylamino group, acylamino group, N-alkylacylamino group, N-arylacylamino group, ureido group, N'-alkylureido group, N',N'-dialkylureido group, N'-arylureido group, N',N'-diarylureido group, N'-alkyl-N'-arylureido group, N-alkylureido group, N-arylureido group, N'-alkyl-N-alkylureido group, N'-alkyl-N-arylureido group, N',N'-dialkyl-N-alkylureido group, N',N'-dialkyl-N-arylureido group, N'-aryl-N-alkylureido group, N'-aryl-N-arylureido group, N',N'-diaryl-N-alkylureido group, N',N'-diaryl-N-arylureido group, N'-alkyl-N'-aryl-N-alkylureido group, N'-alkyl-N'-aryl-N-arylureido group, alkoxycarbonylamino group, aryloxycarbonylamino group, N-alkyl-N-alkoxycarbonylamino group, N-alkyl-N-aryloxycarbonylamino group, N-aryl-N-alkoxycarbonylamino group, and N-aryl-N-aryloxycarbonylamino group. Examples of the alkyl groups and aryl groups in these include those listed above as examples of alkyl groups, substituted alkyl groups, aryl groups, and substituted aryl groups, and R13 of the acyl group (R13CO—) in the acylamino group, N-alkylacylamino group, and N-arylacylamino group is defined as above. Of these, favorable examples include N-alkylamino groups, N,N-dialkylamino groups, N-arylamino groups, and acylamino groups. Specific examples of favorable substituted amino groups include a methylamino group, ethylamino group, diethylamino group, morpholino group, piperidino group, pyrrolidino group, phenylamino group, benzoylamino group, acetylamino group, and onium salt.

The "onium salt" listed here as an example of a substituent refers to an organic group including an onium salt structure. Examples of onium salt structures include ammonium salts, phosphonium salts, oxonium salts, sulfonium salts, selenonium salts, carbonium salts, diazonium salts, iodonium salts, and so forth having the structures shown below.

ammonium salts

 or 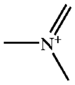

phosphonium salts

 or 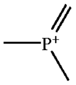

oxonium salts

 or 

sulfonium salts

 or 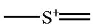

selenonium salts

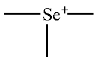 or 

carbonium salts

 or 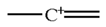

diazonium salts

iodonium salts

These onium salts may have substituents, examples of which are the same as the substituents listed above. An onium salt may be bonded to the phthalocyanine compound directly or via a linking group. Examples of linking groups that can be used here include the above-mentioned substituents from which at least one hydrogen has been removed.

The counter ion in the case of an onium salt structure may be of any type, such as an anion, but an anion that is not highly nucleophilic is preferable. The ion may be monovalent or polyvalent.

Specific examples of anions include halogen ions such as $ClO_4$—, $IO_4$—, or $BF_4$—, $Ph_4B$—, $SO_4^{2}$—, a carbonate (such as $CF_3CO_3$—), an alkylsulfonate (such as methane sulfonate), an aryl sulfonate (such as p-toluene sulfonate), and $SbCl_6$—. Examples of the alkyl group in the alkylsulfonate and the aryl group in the arylsulfonate include those listed above as examples of alkyl groups, substituted alkyl groups, aryl groups, and substituted aryl groups.

Two or more of these $R_{11}$, to $R_{14}$, $R_{21}$ to $R_{24}$, $R_{31}$ to $R_{34}$ and $R_{41}$ to $R_{44}$ groups in General Formula 1 may be bonded together to form a ring. Ring structures that can be formed include one in which a single hydrogen has been removed from the mutual structure of the above-mentioned $R_{11}$ to $R_{14}$, $R_{21}$ to $R_{24}$, $R_{31}$ to $R_{34}$ and $R_{41}$ to $R_{44}$ groups to create a bond with the other $R_{11}$ to $R_{14}$, $R_{21}$ to $R_{24}$, $R_{31}$ to $R_{34}$ and $R_{41}$ to $R_{44}$ groups, but there are no particular restrictions on the ring structure. When an aromatic ring is formed by this bonding, it is possible to greatly vary the absorption wavelength of the phthalocyanine compound, which in most cases is increased.

In the above-mentioned General Formula 1, M represents two hydrogen atoms or a metal atom, halometal group, or oxymetal group. Examples of metal atoms included therein are atoms from Groups IA, IIA, IIIB, and IVB of the Periodic Table, transition metals from the first, second, and third period, and lanthanoid elements. Copper, magnesium, iron, zinc, cobalt, aluminum, titanium, and vanadium are preferred. Vanadium copper, magnesium, zinc, and cobalt are particularly favorable, and vanadium and copper are the most favorable.

The halogen atoms included in the halometal group are chlorine, fluorine, bromine, and iodine, with chlorine, fluorine, and bromine being preferred.

The "oxy" in the oxymetal group refers to an oxygen atom or hydroxyl group.

When the image formation material of this embodiment is used for an infrared laser, the phthalocyanine compound must exhibit absorption in the band in which this laser light is absorbed. Although it will vary with the emission wavelength of the infrared laser, when a laser of 830 nm is used, for instance, it is preferable for the absorption maximum to be at least 700 nm, and an absorption maximum of at least 750 nm is even better.

Examples of phthalocyanine compounds that can be used in this embodiment include the compounds discussed, for example, in JP-A's H8-134389, H8-60008, H8-17610, H8-317737, H8-217737, and H8-217738, and EP 0782164.

Specific examples of the phthalocyanine compounds that can be used in this embodiment will be given below by giving the structure thereof or substituents in the formulas, but the phthalocyanine compounds that are applicable to this embodiment are not limited to these specific examples. Of the example compounds listed below, particularly favorable are those containing amino groups and indicated as (IR2-1) to (IR2-5) and (IR3-1) to (IR3-19), or those having an onium salt structure and indicated as (IR4-1) to (IR4-3) and (IR5-1) to (IR5-50).

-continued
Chemical Formula 5
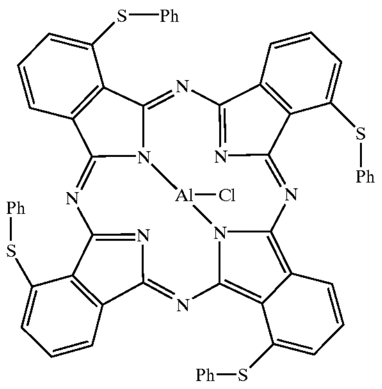
(IR1-1)
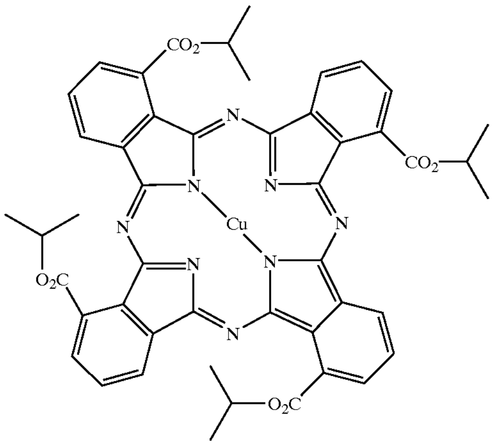
(IR1-2)
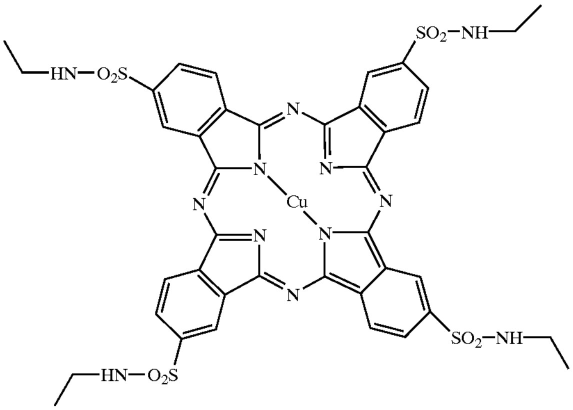
(IR1-3)
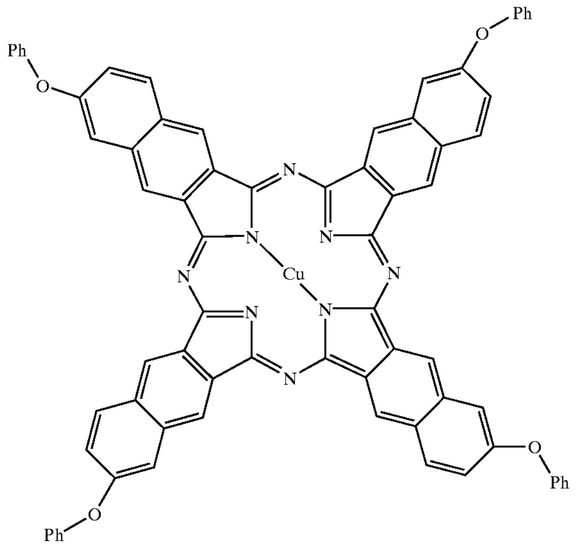
(IR1-4)
Chemical Formula 6
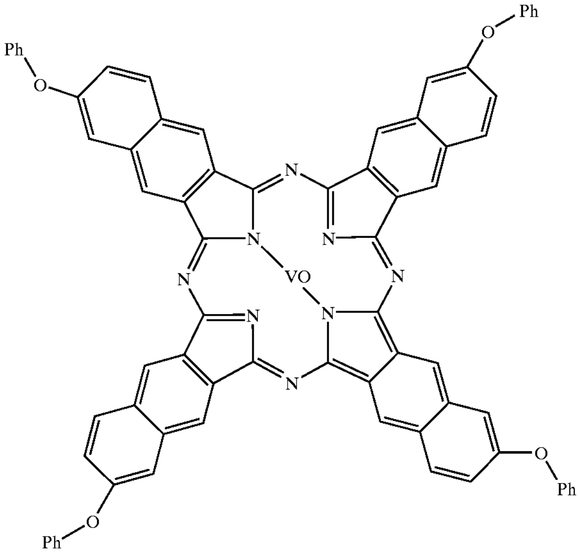
(IR1-5)

-continued
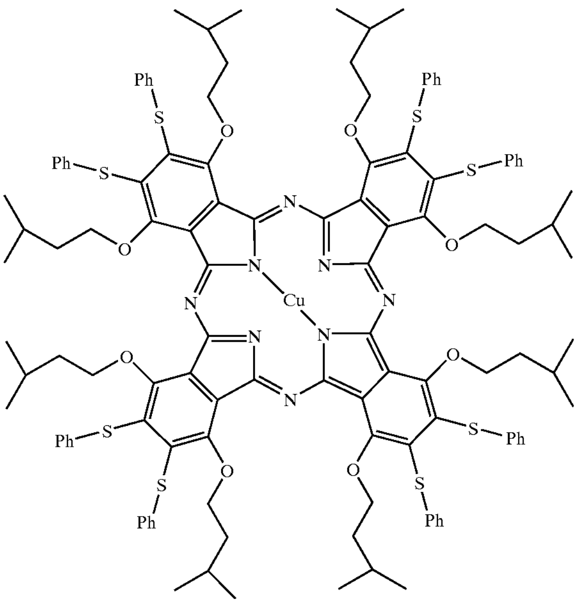
(IR1-6)
Chemical Formula 7
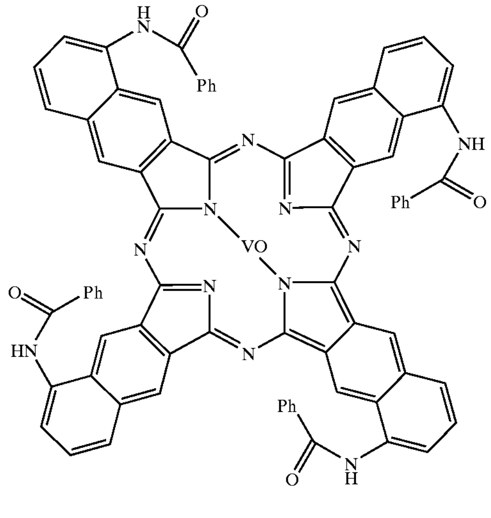
(IR1-7)
-continued
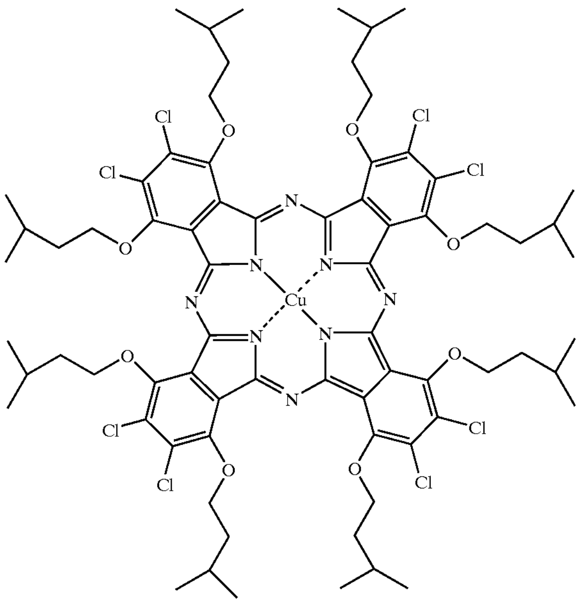
(IR1-8)
Chemical Formula 8
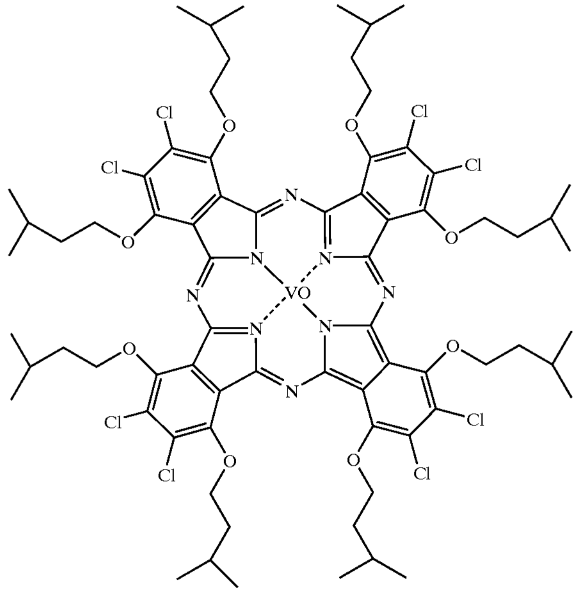
(IR1-9)

-continued
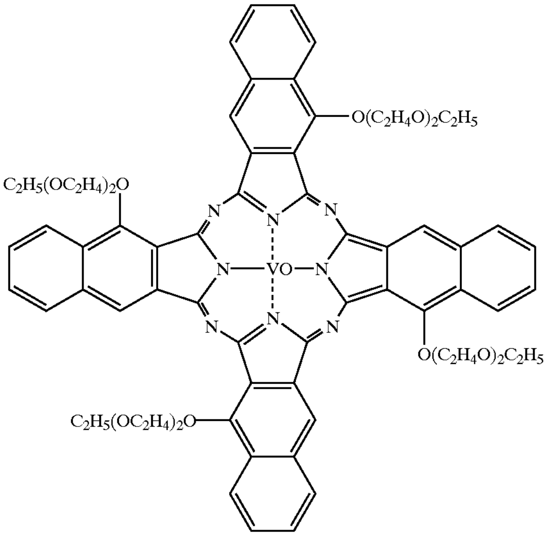
(IR1-10)
Chemical Formula 9
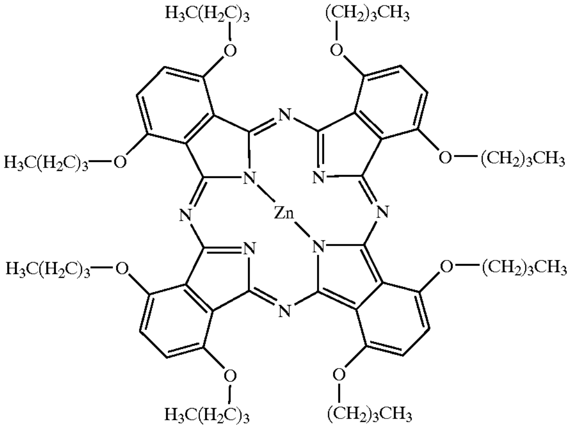
(IR1-11)
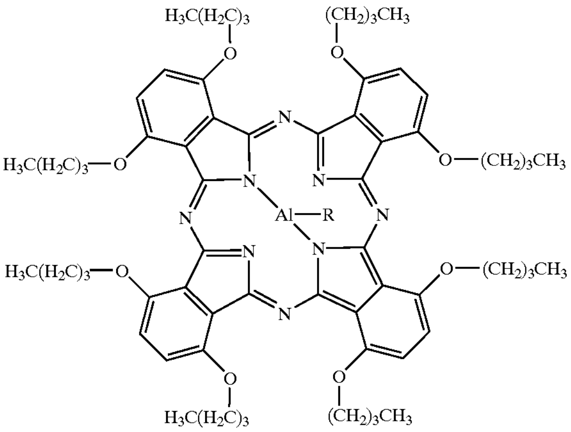
R = $OSi(CH_2CH_3)_3$
-continued
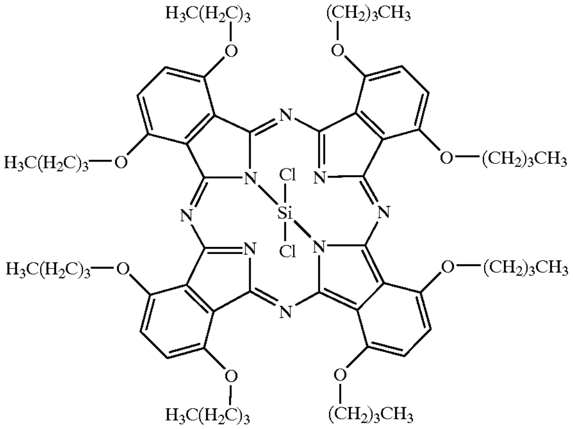
(IR1-13)
Chemical Formula 10
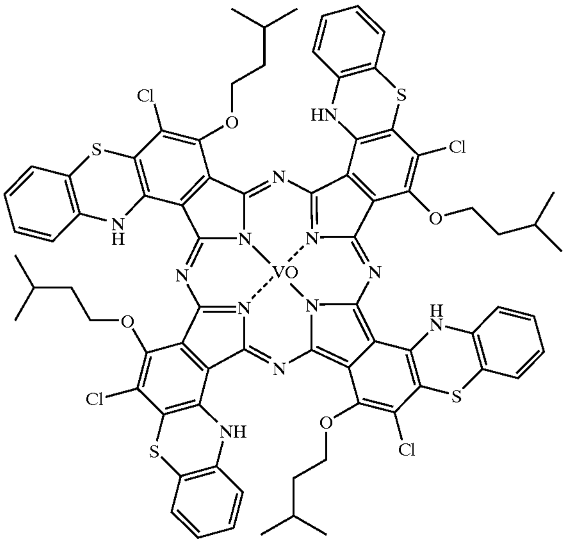
(IR2-1)

-continued
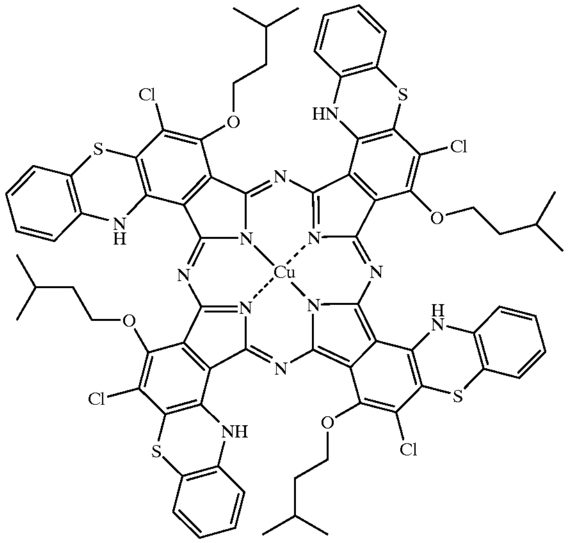
(IR2-2)
Chemical Formula 11
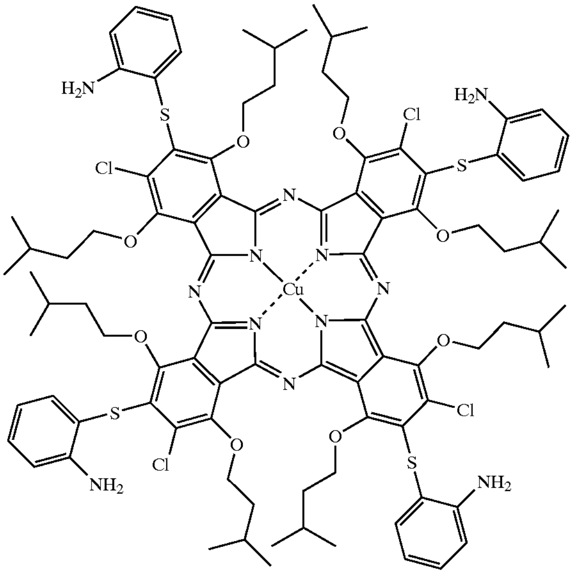
(IR2-3)
-continued
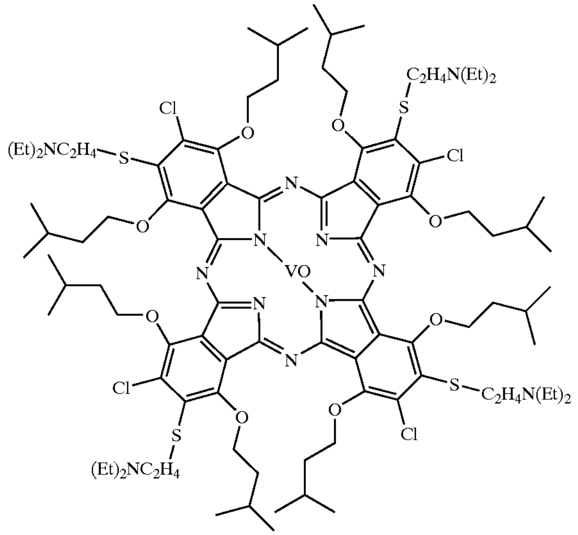
(IR2-4)
Chemical Formula 12
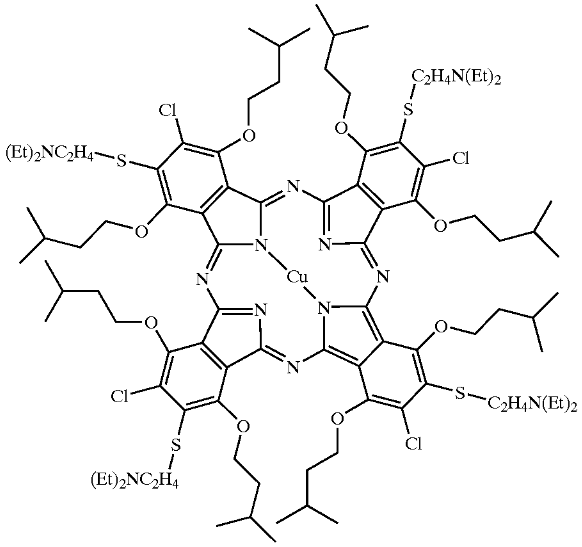
(IR2-5)

Chemical Formula 13
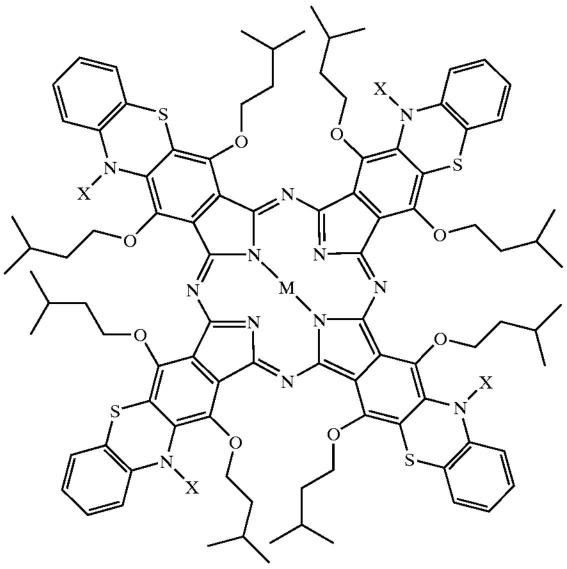
(IR: 3)
TABLE 1
| | X | M |
|---|---|---|
| IR3-1 | $CH_3$ | VO |
| IR3-2 | $C_2H_5$ | VO |
| IR3-3 | $C_6H_{13}$ | VO |
| IR3-4 | $C_2H_4OCH_3$ | VO |
| IR3-5 | $C_2H_4OC_2H_4OCH_3$ | VO |
| IR3-6 | $COCH_3$ | VO |
| IR3-7 | $COC_3H_7$ | VO |
| IR3-8 | $C_2H_4N(C_2H_5)_2$ | VO |
| IR3-9 | Ph | VO |
| IR3-10 | 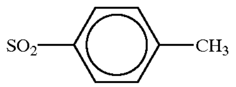 | VO |
| IR3-11 | $CH_3$ | Zn |
| IR3-12 | $C_8H_{17}$ | Cu |
| IR3-13 | $COC_2H_5$ | Ni |
| IR3-14 | $C_8H_{17}$ | Pd |
| IR3-15 | $C_2H_4Ph$ | TiO |
| IR3-16 | $C_2H_4N(CH_3)_2$ | Al—Cl |
| IR3-17 | $C_2H_4N(CH_3)(CH_2Ph)$ | $SnCl_2$ |
| IR3-18 | $C_2H_5$ | FeCl |
| IR3-19 | $COC_2H_5$ | MnOH |
Chemical Formula 14
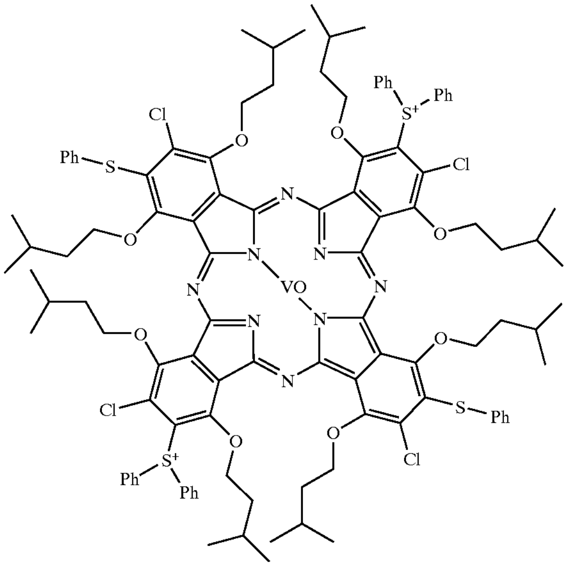
(IR4-1)
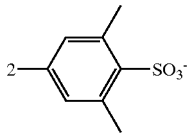
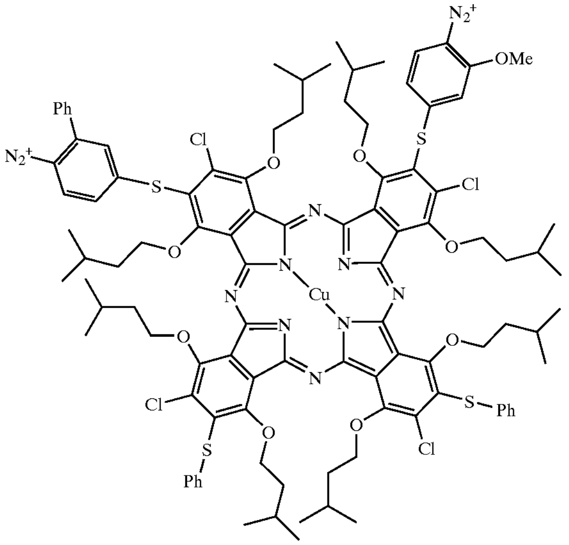
$2CF_3CO_2^-$
(IR4-1)

Chemical Formula 15

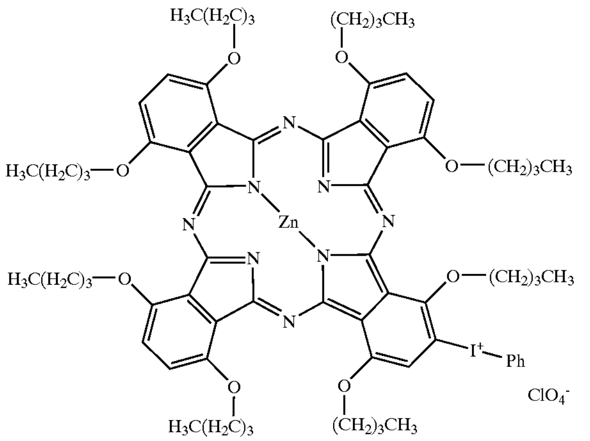

(IR4-3)

Other examples of favorable phthalocyanine compounds that can be used in this embodiment include those having an onium salt structure, specific examples of which are phthalocyanine compounds having the ammonium salt structure expressed by the following General Formula 3.

General Formula 3

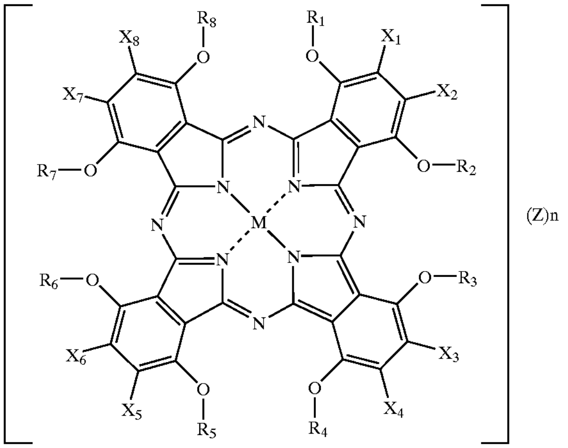

Specific examples of the phthalocyanine compounds expressed by the above General Formula 3 are given below, but do not limit the scope of these compounds.

Example Compound (IR5-1)

A compound in which, in the above General Formula 3, R1=R2=R3=R4=R5=R6=R7=R8=iso-pentyl group, X1=(either X3 or X4)=(either X5 or X6)=(either X7 or X8)=chlorine atom, X2=(the other of X3 and X4)=(the other of X5 and X6)=(the other of X7 and X8)=2-(diethylmethylammonium)ethylthio group, M=VO, Z=p-toluene sulfonate, and n=4.

Similarly, specific examples of the functional groups in the above General Formula 3 will be given to give specific examples of the example compounds.

Example Compound (IR5-2)

R1=R2=R3=R4=R5=R6=R7=R8=iso-pentyl group

X1=(either X3 or X4)=(either X5 or X6)=(either X7 or X8)=chlorine atom

X2=(the other of X3 and X4)=(the other of X5 and X6)=(the other of X7 and X8)=2-(diethylbenzylammonium)ethylthio group M=VO, Z=p-toluene sulfonate, n=4

Example Compound (IR5-3)

R1=R2=R3=R4=R5=R6=R7=R8=iso-pentyl group

X1=(either X3 or X4)=(either X5 or X6)=(either X7 or X8)=chlorine atom

X2=(the other of X3 and X4)=(the other of X5 and X6)=(the other of X7 and X8)=2-(diethylbenzylammonium)ethylthio group M=Zn, Z=p-toluene sulfonate, n=4

Example Compound (IR5-4)

R1=R2=R3=R4=R5=R6=R7=R8=iso-pentyl group

X1=(either X3 or X4)=(either X5 or X6)=(either X7 or X8)=chlorine atom

X2=(the other of X3 and X4)=(the other of X5 and X6)=(the other of X7 and X8)=2-(diethylmethylammonium)ethylthio group M=Ni, Z=p-toluene sulfonate, n=4

Example Compound (IR5-5)

R1=R2=R3=R4=R5=R6=R7=R8=iso-pentyl group

X1=(either X3 or X4)=(either X5 or X6)=(either X7 or X8)=chlorine atom

X2=(the other of X3 and X4)=(the other of X5 and X6)=(the other of X7 and X8)=2-(diethylmethylammonium)ethylthio group M=Co, Z=p-toluene sulfonate, n=4

Example Compound (IR5-6)

R1=R2=R3=R4=R5=R6=R7=R8=iso-pentyl group

X1=(either X3 or X4)=(either X5 or X6)=(either X7 or X8)=chlorine atom

X2=(the other of X3 and X4)=(the other of X5 and X6)=(the other of X7 and X8)=2-(diethylmethylammonium)ethylthio group M=Pd, Z=p-toluene sulfonate, n=4

Example Compound (IR5-7)

R1=R2=R3=R4=R5=R6=R7=R8=iso-pentyl group

X1=(either X3 or X4)=(either X5 or X6)=(either X7 or X8)=chlorine atom

X2=(the other of X3 and X4)=(the other of X5 and X6)=(the other of X7 and X8)=2-(diethylmethylammonium)ethylthio group M=Pb, Z=p-toluene sulfonate, n=4

Example Compound (IR5-8)

R1=R2=R3=R4=R5=R6=R7=R8=iso-pentyl group

X1=(either X3 or X4)=(either X5 or X6)=(either X7 or X8)=chlorine atom

X2=(the other of X3 and X4)=(the other of X5 and X6)=(the other of X7 and X8)=2-(diethylmethylammonium)ethylthio group M=VO, $Z=I^-$, n=4

Example Compound (IR5-9)

R1=R2=R3=R4=R5=R6=R7=R8=iso-pentyl group

X1=(either X3 or X4)=(either X5 or X6)=(either X7 or X8)=chlorine atom

X2=(the other of X3 and X4)=(the other of X5 and X6)=(the other of X7 and X8)=2-(diethylmethylammonium)ethylthio group M=VO, Z=$BF4^-$, n=4

Example Compound (IR5-10)

R1=R2=R3=R4=R5=R6=R7=R8=iso-pentyl group

X1=(either X3 or X4)=(either X5 or X6)=(either X7 or X8)=chlorine atom

X2=(the other of X3 and X4)=(the other of X5 and X6)=(the other of X7 and X8)=2-(diethylmethylammonium)ethylthio group M=VO, Z=$ClO_4^-$, n=4

Example Compound (IR5-11)

R1=R2=R3=R4=R5=R6=R7=R8=iso-pentyl group

X1=(either X3 or X4)=(either X5 or X6)=(either X7 or X8)=chlorine atom

X2=(the other of X3 and X4)=(the other of X5 and X6)=(the other of X7 and X8)=2-(diethylmethylammonium)ethylthio group M=VO, Z=$PF_6^-$, n=4

Example Compound (IR5-12)

R1=R2=R3=R4=R5=R6=R7=R8=iso-pentyl group

X1=(either X3 or X4)=(either X5 or X6)=(either X7 or X8)=chlorine atom

X2=(the other of X3 and X4)=(the other of X5 and X6)=(the other of X7 and X8)=2-(diethylmethylammonium)ethylthio group M=VO, Z=$CF_3CO_2^-$, n=4

Example Compound (IR5-13)

R1=R2=R3=R4=R5=R6=R7=R8=iso-pentyl group

X1=(either X3 or X4)=(either X5 or X6)=(either X7 or X8)=chlorine atom

X2=(the other of X3 and X4)=(the other of X5 and X6)=(the other of X7 and X8)=2-(diethylmethylammonium)ethylthio group M=VO, Z=$CH_3SO_3^-$, n=4

Example Compound (IR5-14)

R1=R2=R3=R4=R5=R6=R7=R8=iso-pentyl group

X1=(either X3 or X4)=(either X5 or X6)=(either X7 or X8)=chlorine atom

X2=(the other of X3 and X4)=(the other of X5 and X6)=(the other of X7 and X8)=2-(diethylmethylammonium)ethylthio group M=VO, Z=$Br^-$, n=4

Example Compound (IR5-15)

R1=R2=R3=R4=R5=R6=R7=R8=iso-pentyl group

X1=(either X3 or X4)=(either X5 or X6)=(either X7 or X8)=chlorine atom

X2=(the other of X3 and X4)=(the other of X5 and X6)=(the other of X7 and X8)=2-(diethylmethylammonium)ethylthio group, where the amino groups in two 2-dimethylaminoethylthio groups are methylated to form an ammonium cation M=VO, Z=p-toluene sulfonate, n=2

Example Compound (IR5-16)

R1=R2=R3=R4=R5=R6=R7=R8=iso-pentyl group

X1=(either X3 or X4)=(either X5 or X6)=(either X7 or X8)=chlorine atom

X2=(the other of X3 and X4)=(the other of X5 and X6)=(the other of X7 and X8)=2-(diethylmethylammonium)ethylthio group, where the amino groups in two 2-dimethylaminoethylthio groups are n-butylated to form an ammonium cation M=VO, Z=p-toluene sulfonate, n=2

Example Compound (IR5-17)

R1=R2=R3=R4=R5=R6=R7=R8=iso-pentyl group

X1=(either X3 or X4)=(either X5 or X6)=(either X7 or X8)=chlorine atom

X2=(the other of X3 and X4)=(the other of X5 and X6)=(the other of X7 and X8)=2-(diethylmethylammonium)ethylthio group, where the amino groups in two 2-dimethylaminoethylthio groups are n-octylated to form an ammonium cation M=VO, Z=p-toluene sulfonate, n=2

Example Compound (IR5-18)

R1=R2=R3=R4=R5=R6=R7=R8=pentyl group

X1=(either X3 or X4)=(either X5 or X6)=(either X7 or X8)=chlorine atom

X2=(the other of X3 and X4)=(the other of X5 and X6)=(the other of X7 and X8)=2-(diethylmethylammonium)ethylthio group, where the amino groups in two 2-dimethylaminoethylthio groups are methylated to form an ammonium cation M=VO, Z=$I^-$, n=2

Example Compound (IR5-19)

R1=R2=R3=R4=R5=R6=R7=R8=ethyl group

X1=X2=X3=X4=X5=X6=X7=X8=2-(diethylammonium) ethylthio group

M=VO, Z=p-toluene sulfonate, n=8

Example Compound (IR5-20)

R1=R2=R3=R4=R5=R6=R7=R8=n-pentyl group

X1=X2=X3=X4=X5=X6=X7=X8=2-diethylaminoethylthio group, where the amino groups in four 2-diethylaminoethylthio groups are methylated to form an ammonium cation M=TiO, Z=p-toluene sulfonate, n=4

Example Compound (IR5-21)

R1=R2=R3=R4=R5=R6=R7=R8=n-octyl group

X1=(either X3 or X4)=(either X5 or X6)=(either X7 or X8)=bromine atom

X2=(the other of X3 and X4)=(the other of X5 and X6)=(the other of X7 and X8)=2-diethylaminoethylthio group, where the amino groups in four 2-diethylaminoethylthio groups are methylated to form an ammonium cation M=AlCl, $Z=I^-$, n=4

Example Compound (IR5-22)

R1=R2=R3=R4=R5=R6=R7=R8=n-decyl group

X1=X2=X3=X4=X5=X6=X7=X8=2-dimethylaminoethylthio group, where four of the 2-dimethylaminoethylthio groups are methylated to form an ammonium cation M=VO, $Z=ClO_4^-$, n=4

Example Compound (IR5-23)

R1=R2=R3=R4=R5=R6=R7=R8=dimethylaminoethyl group, where four of the 2-dimethylaminoethyl groups are methylated to form an ammonium cation X1=X2=X3=X4=X5=X6=X7=X8=chlorine atom M=VO, Z=p-toluene sulfonate, n=4

Example Compound (IR5-24)

R1=R2=R3=R4=R5=R6=R7=R8=dimethylaminoethyl group, where two of the 2-dimethylaminoethyl groups are methylated to form an ammonium cation X1=X2=X3=X4=X5=X6=X7=X8=hydrogen atom M=VO, Z=p-toluene sulfonate, n=2

Example Compound (IR5-25)

R1=R2=R3=R4=R5=R6=R7=R8=trimethylammoniumethyl group

X1=X2=X3=X4=X5=X6=X7=X8=methylthio group

M=Cu, Z=p-toluene sulfonate, n=8

Example Compound (IR5-26)

R1=R2=R3=R4=R5=R6=R7=R8=trimethylammoniumethyl group

X1=X2=X3=X4=X5=X6=X7=X8=phenylthio group

M=Cu, Z=p-toluene sulfonate, n=8

Example Compound (IR5-27)

R1=R2=R3=R4=R5=R6=R7=R8=trimethylammoniumethyl group

X1=X2=X3=X4=X5=X6=X7=X8=phenyloxy group

M=Ni, Z=p-toluene sulfonate, n=8

Example Compound (IR5-28)

R1=R2=R3=R4=R5=R6=R7=R8=n-butyldimethylammoniumethyl group

X1=X2=X3=X4=X5=X6=X7=X8=3-chlorophenyloxy group

M=Ni, $Z=SbF_6^-$, n=8

Example Compound (IR5-29)

R1=R2=R3=R4=R5=R6=R7=R8=diethyl(n-octyl) ammoniumethyl group

X1=X2=X3=X4=X5=X6=X7=X8=4-methoxyphenyloxy group $M=SnCl_2$, $Z=Cl^-$, n=8

Example Compound (IR5-30)

R1=R2=R3=R4=R5=R6=R7=R8=ethyl group

X1=(either X3 or X4)=(either X5 or X6)=(either X7 or X8)=chlorine atom

X2=(the other of X3 and X4)=(the other of X5 and X6)=(the other of X7 and X8)=4-diethylaminophenylthio group, where the amino groups in three 2-diethylaminophenylthio groups are methylated to form an ammonium cation M=InCl, $Z=CF_3CO_2^-$, n=3

Example Compound (IR5-31)

R1=R2=R3=R4=R5=R6=R7=R8=methylthiopropyl group

X1=(either X3 or X4)=(either X5 or X6)=(either X7 or X8)=chlorine atom

X2=(the other of X3 and X4)=(the other of X5 and X6)=(the other of X7 and X8)=4-dimethylaminophenylthio group, where the amino groups in three 2-dimethylaminophenylthio groups are methylated to form an ammonium cation M=FeCl, $Z=BF_4^-$, n=3

Example Compound (IR5-32)

R1=(either R3 or R4)=(either R5 or R6)=(either R7 or R8)=2-methoxyethyl group

R2=(the other of R3 or R4)=(the other of R5 or R6)=(the other of R7 or R8)=2-trimethylammoniumethyl group X1=X2=X3=X4=X5=X6=X7=X8=chlorine atom M=VO, $Z=ClO_4^-$, n=4

Example Compound (IR5-33)

R1=(either R3 or R4)=(either R5 or R6)=(either R7 or R8)=2-ethoxyethyl group

R2=(the other of R3 or R4)=(the other of R5 or R6)=(the other of R7 or R8)=2-trimethylammoniumethyl group X1=X2=X3=X4=X5=X6=X7=X8=phenylthio group M=VO, $Z=ClO_4^-$, n=4

Example Compound (IR5-34)

R1=(either R3 or R4)=(either R5 or R6)=(either R7 or R8)=methyl group

R2=(the other of R3 or R4)=(the other of R5 or R6)=(the other of R7 or R8)=2-trimethylammoniumethyl group X1=X2=X3=X4=X5=X6=X7=X8=methylthio group M=VO, Z=p-toluene sulfonate, n=4

Example Compound (IR5-3[5])

R1=(either R3 or R4)=(either R5 or R6)=(either R7 or R8)=methyl group

R2=(the other of R3 or R4)=(the other of R5 or R6)=(the other of R7 or R8)=2-trimethylammoniumethyl group X1=X2=X3=X4=X5=X6=X7=X8=hydrogen atom M=Cu, Z=p-toluene sulfonate, n=4

Example Compound (IR5-36)

R1=(either R3 or R4)=(either R5 or R6)=(either R7 or R8)=methyl group

R2=(the other of R3 or R4)=(the other of R5 or R6)=(the other of R7 or R8)=2-trimethylammoniumethyl group X1=(either X3 or X4)=(either X5 or X6)=(either X7 or X8)=chlorine atom X2=(the other of X3 and X4)=(the other of X5 and X6)=(the other of X7 and X8)=4-methylphenylthio group M=MnOH, Z=p-toluene sulfonate, n=4

Example Compound (IR5-37)

R1=R2=R3=R4=R5=R6=R7=R8=ethyl group

X1=(either X3 or X4)=(either X5 or X6)=(either X7 or X8)=chlorine atom

X2=(the other of X3 and X4)=(the other of X5 and X6)=(the other of X7 and X8)=3-trimethylammoniumphenylthio group M=VO, Z=p-toluene sulfonate, n=4

Example Compound (IR5-38)

R1=R2=R3=R4=R5=R6=R7=R8=ethyl group

X1=(either X3 or X4)=(either X5 or X6)=(either X7 or X8)=chlorine atom

X2=(the other of X3 and X4)=(the other of X5 and X6)=(the other of X7 and X8)=3-triethylammoniumphenyloxy group M=VO, $Z=I^-$, n=4

Example Compound (IR5-39)

R1=R2=R3=R4=R5=R6=R7=R8=methoxyethyl group

X1=(either X3 or X4)=(either X5 or X6)=(either X7 or X8)=chlorine atom

X2=(the other of X3 and X4)=(the other of X5 and X6)=(the other of X7 and X8)=3-diethylmethylammoniumphenyloxy group M=VO, $Z=ClO_4^-$, n=4

Example Compound (IR5-40)

R1=R2=R3=R4=R5=R6=R7=R8=ethoxyethoxyethyl group

X1=(either X3 or X4)=(either X5 or X6)=(either X7 or X8)=chlorine atom

X2=(the other of X3 and X4)=(the other of X5 and X6)=(the other of X7 and X8)=2-trimethylammoniumphenylthio group M=VO, $Z=ClO_4^-$, n=4

Example Compound (IR5-41)

R1=R2=R3=R4=R5=R6=R7=R8=tetrahydrofurfuryl group

X1=(either X3 or X4)=(either X5 or X6)=(either X7 or X8)=fluorine atom

X2=(the other of X3 and X4)=(the other of X5 and X6)=(the other of X7 and X8)=trimethylammoniumethylthio group M=VO, $Z=ClO_4^-$, n=4

Example Compound (IR5-42)

R1=R2=R3=R4=RS=R6=R7=R8=ethyl group

X1=(either X3 or X4)=(either X5 or X6)=(either X7 or X8)=4-methylphenylthio group X2=(the other of X3 and X4)=(the other of X5 and X6)=(the other of X7 and X8)=trimethylammoniumethylthio group M=VO, $Z=ClO_4^-$, n=4

Example Compound (IR5-43)

R1=R2=R3=R4=R5=R6=R7=R8=ethyl group

X1=(either X3 or X4)=(either X5 or X6)=(either X7 or X8)=3,4-dimethylphenylthio group X2=(the other of X3 and X4)=(the other of X5 and X6)=(the other of X7 and X8)=trimethylammoniumethylthio group M=VO, $Z=ClO_4^-$, n=4

Example Compound (IR5-44)

R1=R2=R3=R4=RS=R6=R7=R8=ethyl group

X1=(either X3 or X4)=(either X5 or X6)=(either X7 or X8)=n-butoxy group

X2=(the other of X3 and X4)=(the other of X5 and X6)=(the other of X7 and X8)=3-(di-n-butylmethylammonium)-phenyloxy group M=VO, $Z=ClO_4^-$, n=4

Example Compound (IR5-45)

R1=R2=R3=R4=R5=R6=R7=R8=butyl group

X1=(either X3 or X4)=(either X5 or X6)=(either X7 or X8)=n-octyloxy group

X2=(the other of X3 and X4)=(the other of X5 and X6)=(the other of X7 and X8)=3-(diethylmethylammonium)phenylthio group M=VO, $Z=BF_4^-$, n=4

Example Compound (IR5-46)

R1=R2=R3=R4=R5=R6=R7=R8=ethyl group

X1=(either X3 or X4)=(either X5 or X6)=(either X7 or X8)=n-octylthio group

X2=(the other of X3 and X4)=(the other of X5 and X6)=(the other of X7 and X8)=3-(di-ethylmethylammonium)phenyloxy group M=Zn, $Z=I^-$, n=4

Example Compound (IR5-47)

R1=R2=R3=R4=R5=R6=R7=R8=ethyl group

X1=X2=X3=X4=X5=X6=X7=X8=dimethylaminoethylthio group, where the amino groups in six methylaminoethylthio groups are methylated to form an ammonium cation M=Cu, Z=p-toluene sulfonate, n=6

Example Compound (IR5-48)

R1=R2=R3=R4=R5=R6=R7=R8=ethyl group

X1=X2=X3=X4=X5=X6=X7=X8=dimethylaminoethylthio group, where the amino groups in four methylaminoethylthio groups are methylated to form an ammonium cation M=VO, Z=p-toluene sulfonate, n=4

Example Compound (IR5-49)

R1=R2=R3=R4=R5=R6=R7=R8=1,3-dioxolan-2-ylethyl group

X1=X2=X3=X4=X5=X6=X7=X8=dimethylaminoethylthio group, where the amino groups in four methylaminoethylthio groups are methylated to form an ammonium cation M=VO, Z=p-toluene sulfonate, n=4

Example Compound (IR5-50)

R1=(either R3 or R4)=(either R5 or R6)=(either R7 or R8)=2-methoxyethyl group

R2=(the other of R3 or R4)=(the other of R5 or R6)=(the other of R7 or R8)=1,3-dioxolan-2-ylethyl group X1=(either X3 or X4)=(either X5 or X6)=(either X7 or X8)=chlorine atom X2=(the other of X3 and X4)=(the other of X5 and X6)=(the other of X7 and X8)=3-(diethylmethylammonium)phenylthio group M=Cu, Z=$ClO_4^-$, n=4

Preferred examples of the counter ions expressed by the above General Formula 3 are those with an onium salt structure. Here, ammonium salts are listed primarily as the onium salts, but the same effect will be realized with a diazonium salt, oxonium salt, sulfonium salt, selenonium salt, phosphonium salt, carbonium salt, iodonium salt, or other onium salt.

A phthalocyanine compound (b) that is useful in this embodiment can be synthesized by a variety of methods, but as an example, the methods discussed in the following publications can be used: "Phthalocyanine," pp. 14–17 (ed. by Organic Electronics Research Society, Masao Tanaka and Shoji Koma, Bunshin Publishing), "The Phthalocyanines," pp. 5–15 (Frank H. Moser and Arther L. Thomas, CRC Press), "Phthalocyanine Materials," pp. 12–30 (Neil B. McKeown, Cambridge University Press), "Phthalocyanine, Its Chemistry and Functions," pp. 1–61 (ed. by Hiroyoshi Shirai and Nagao Kobayashi, IPC Publishing).

In this embodiment, these phthalocyanine compounds can be added in a proportion of 0.01 to 50 wt %, and preferably 0.1 to 20 wt %, and even more preferably 0.5 to 15 wt %, with respect to the total solids of the photosensitive composition. An image cannot be formed with this photosensitive composition if the added amount is less than 0.01 wt %, but if 50 wt % is exceeded, there is the danger that the non-image portions will be soiled when [the composition] is used for the photosensitive layer of a planographic printing plate base.

Other pigments or dyes that exhibit infrared absorption can be added to the photosensitive composition in this embodiment along with the phthalocyanine compound in order to enhance image formability.

This pigment can be commercially available pigments any pigment discussed in a "handbook of color index (C.I.)", "Handbook of Latest Pigments" (Japan Pigment Technology Society, 1977), "Latest Pigment Application Technology" (CMC Publishing, 1986), or "Printing Ink Technology" (CMC Publishing, 1984).

Examples of types of pigment include black pigment, yellow pigment, orange pigment, brown pigment, red pigment, violet pigment, blue pigment, green pigment, fluorescent pigment, metal powder pigment, and polymer bonded colorants. Specific substances that can be used include insoluble azo pigment, azo lake pigment, condensed azo pigment, chelate azo pigment, phthalocyanine-based pigment, anthraquinone-based pigment, perylene- and perinone-based pigment, thioindigo-based pigment, quinacrylidone-based pigment, dioxazine-based pigment, isoindolinone-based pigment, quinophthalone-based pigment, dyed lake pigment, azine pigment, nitroso pigment, nitro pigment, natural pigment, fluorescent pigment [sic], inorganic pigment, and carbon black.

These pigments may be used either with or without undergoing a surface treatment. Surface treatment can be accomplished, for example, by a method in which the surface is coated with a resin or wax, a method in which a surfactant is made to adhere, and a method in which a reactive substance (such as a silane coupling agent, an epoxy compound, or a polyisocyanate) is bonded to the pigment surface. The above surface treatment methods are discussed in (Properties and Applications of Metallic Soaps" (Koshobo), "Printing Ink Technology" (CMC Publishing, 1984), and "Latest Pigment Application Technology" (CMC Publishing, 1986).

It is preferable for the particle diameter of the pigment to be between 0.01 and 10 μm, with a range of 0.05 to 1 μm being preferable, and a range of 0.1 to 1 μm being particularly favorable. It is undesirable for the particle diameter of the pigment to be less than 0.01 μm because the stability of the dispersion in the photosensitive layer coating liquid will be poor, but exceeding 10 μm is also undesirable in terms of the uniformity of the photosensitive layer.

Any known dispersion technique used in the manufacture of ink, toner, or the like can be employed to disperse the pigment. Examples of dispersing machines include an ultrasonic disperser, sand mill, attriter, pearl mill, super mill, ball mill, impeller, disperser, KD mill, colloidal mill, dynatron, triple roll mill, and pressure kneader. Details are given in "Latest Pigment Application Technology" (CMC Publishing, 1986).

Commercially available dyes and those known from publications (such as "Handbook of Dyes," ed. by Organic Synthetic Chemistry Association, 1970) can be utilized. Specific examples include azo dyes, metal complex azo dyes, pyrazolone azo dyes, anthraquinone dyes, phthalocyanine dyes, carbonium dyes, quinoneimine dyes, methine dyes, and cyanine dyes.

In this embodiment, it is preferable in terms of being suitable for use with a laser that emits infrared or near infrared light for these pigments or dyes to be ones that absorb infrared or near infrared light.

Carbon black can be used to advantage as a pigment that absorbs infrared or near infrared light. Examples of dyes that absorb infrared or near infrared light include the cyanine dyes discussed in JP-A Nos. S58-125246, S59-84356, S59-202829, S60-78787, and elsewhere, the methine dyes discussed in JP-A Nos. S58-173696, S58-181690, S58-194595, and elsewhere, the naphthoquinone dyes discussed in JP-A Nos. S58-112793, S58-224793, S59-48187, S59-73996, S60-52940, S60-63744, and elsewhere, the squarylium dyes discussed in JP-A No. S58-112792 and elsewhere, the cyanine dyes discussed in British Patent 434,875, and the dihydropyrimidinesquarylium coloring material discussed in U.S. Pat. No. 5,380,635.

The near infrared absorption sensitizer discussed in U.S. Pat. No. 5,156,938 can be used favorably as a dye, and it is particularly favorable to use the arylbenzo(thio)pyrylium salt discussed in U.S. Pat. No. 3,881,924, the trimethinepyrylium salts discussed in JP-A No. S57-142645 (U.S. Pat. No. 4,327,169), the pyrylium compounds discussed in JP-A Nos. S58-181051, S58-220143, S59-41363, S59-84248, S59-84249, S59-146063, and S59-146061, the cyanine coloring material discussed in JP-A No. S59-216146, the pentamethinethiopyrylium salt discussed in U.S. Pat. No. 4,283,475, the pyrylium compound discussed in Japanese Patent Publications H5-13514 and H5-19702, Epolight III-178, Epolight III-130, Epolight III-125, Epolight IV-162A, and the like.

Other examples of particularly favorable dyes include the near infrared absorbing dyes given by Formulas I and II in the Specification of U.S. Pat. No. 4,756,993.

These pigments and dyes can be added to the printing plate material in a proportion of 0.01 to 50 wt %, and preferably 0.1 to 10 wt %, with respect to the total solids of the plate material. In the case of a dye, it is particularly favorable for this proportion to be 0.5 to 10 wt %, and in the case of a pigment, 3.1 to 10 wt %. Sensitivity will be low if the pigment or dye is added in an amount less than 0.01 wt %, but if 50 wt % is exceeded, the uniformity of the photosensitive layer will be low and the durability of the recording layer will be poor.

These dyes or pigments may be added to the photosensitive composition and added to the photosensitive layer along with other components, or they may be added to a layer beside the photosensitive layer in the production of the planographic printing plate base. Just one type of these dyes or pigments may be added, or a mixture of two or more types may be used.

(a) Macromolecular Compound Having Alkali-Soluble Groups

The "(a) macromolecular compound having alkali-soluble groups" used in this embodiment (hereinafter sometimes referred to as "alkali-soluble macromolecular compound") refers to a compound having one of the following alkali-soluble groups (acid group structure) on the main chain or a side chain of a macromolecular compound.

Phenolic hydroxyl groups (—Ar—OH), carboxylic acid group ($—CO_3H$), sulfonic acid group ($—SO_3H$), phosphoric acid group ($—OPO_3H$), sulfonamide groups ($—SO_2NH—R$), substituted sulfonamide-based groups (active imide groups) ($—SO_2NHCOR$, $—SO_2NHSO_2R$, $—CONHSO_2R$).

Here, Ar is a divalent aryl group that may have a substituent, and R is a hydrocarbon group that may have a substituent.

Of these, examples of preferable acid groups include (a-1) phenolic hydroxyl groups, (a-2) sulfonamide groups, and (a-3) active imide groups, and an alkali aqueous solution-soluble resin having (a-1) phenolic hydroxyl groups (hereinafter referred to as a "resin having phenolic hydroxyl groups") can be used most favorably.

Examples of macromolecular compounds having (a-1) phenolic hydroxyl groups include polycondensates of phenol and formaldehyde (hereinafter referred to as "phenol formaldehyde resins"), polycondensates of m-cresol and formaldehyde (hereinafter referred to as "m-cresol formaldehyde resins"), polycondensates of p-cresol and formaldehyde, polycondensates of mixed m- and p-cresol and formaldehyde, polycondensates of phenol, cresol (m-, p-, or a mixture of m- and p-), and formaldehyde, and other such novolac resins, and polycondensates of pyrogallol and acetone. Alternatively, a copolymer obtained by copolymerizing a monomer having phenol groups on a side chain can also be used. Examples of monomers having phenol groups include acrylamide, methacrylamide, acrylic esters, methacrylic esters, hydroxystyrene, and the like that have phenol groups. Specific examples of compounds that can be used to advantage include N-(2-hydroxyphenyl)acrylamide, N-(3-hydroxyphenyl)acrylamide, N-(4-hydroxyphenyl) acrylamide, N-(2-hydroxyphenyl)methacrylamide, N-(3-hydroxyphenyl)methacrylamide, N-(4-hydroxyphenyl) methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl) ethyl acrylate, 2-(4-hydroxyphenyl)ethyl acrylate, 2-(2-hydroxyphenyl)ethyl methacrylate, 2-(3-hydroxyphenyl) ethyl methacrylate, and 2-(4-hydroxyphenyl)ethyl methacrylate. In terms of image formability, it is preferable for the weight average molecular weight of the polymer to be $5.0\times10^2$ to $2.0\times10^4$, and for the number average molecular weight to be $2.0\times10^2$ to $1.0\times10^4$. These resins can be used either singly or in combinations of two or more types. When a combination is used, a polycondensate of t-butylphenol and formaldehyde as discussed in the Specification of U.S. Pat. No. 4,123,279, or a polycondensate of formaldehyde and a phenol (such as a polycondensate of octyl phenol and formaldehyde) having C3 to C8 alkyl groups as substituents may be used concurrently.

It is preferable for these resins having phenolic hydroxyl groups to have a weight average molecular weight of 500 to 20,000, and a number average molecular weight of 200 to 10,000.

Furthermore, a polycondensate of formaldehyde and a phenol having C3 to C8 alkyl groups as substituents, such as a t-butylphenol formaldehyde resin or octylphenol formaldehyde resin, may be used concurrently as discussed in the Specification of U.S. Pat. No. 4,123,279. These resins having phenolic hydroxyl groups may be used singly or in combinations of two or more types.

In the case of an alkali aqueous solution-soluble macromolecular compound having (a-2) sulfonamide groups, examples of the monomer having (a-2) sulfonamide groups (the main monomer that makes up this macromolecular compound) include monomers composed of low-molecular weight compounds having in their molecule at least one polymerizable unsaturated bond and at least one sulfonamide group in which at least one hydrogen atom is bonded to a nitrogen atom. Of these, preferable low-molecular weight compounds are those having an acryloyl group, allyl group, or vinyloxy group and a substituted or monosubstituted aminosulfonyl group or substituted sulfonylimino group.

The compounds expressed by the following General Formulas 4 to 8 are examples of these compounds.

(4)

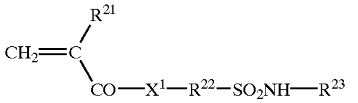

(5)

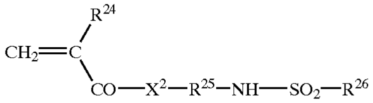

(6)

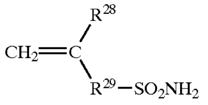

(7)

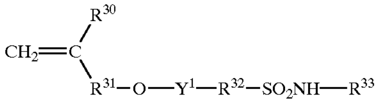

(8)

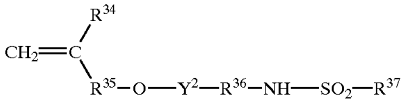

In the formulas, X1 and X2 are each —O— or —NR17—. R21 and R24 are each a hydrogen atom or $—CH_3$. R22, R25, R29, R32, and R36 are each a substitutable (this term means that "the group may have a substituent group" here) C1 to C12 alkylene group, cycloalkylene group, arylene group, or aralkylene group. R23, R26, and R33 are each a hydrogen atom or a substitutable C1 to C12 alkyl group, cycloalkyl group, aryl group, or aralkyl group. R37 is a substitutable C1 to C12 alkyl group, cycloalkyl group, aryl group, or aralkyl group. R28, R30, and R34 are each a hydrogen atom or —$CH_3$. R31 and R35 are each a single bond or a substitutable C1 to C12 alkylene group, cycloalkylene group, arylene group, or aralkylene group. Y1 and Y2 are each a single bond or —CO—.

More specifically, m-aminosulfonylphenyl methacrylate, N-(p-aminosulfonylphenyl)methacrylamide, N-(p-aminosulfonylphenyl)acrylamide, or the like can be used favorably.

In the case of an alkali aqueous solution-soluble macromolecular compound having (a-3) active imide groups, this compound has in its molecule an active imide group expressed by the following formula. Examples of monomers having (a-3) active imide groups (the main monomer that makes up this macromolecular compound) include monomers composed of low-molecular weight compounds having in their molecule at least one polymerizable unsaturated bond and an active imino group expressed by the following formula.

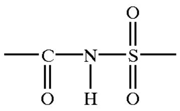

More specifically, N-(p-toluenesulfonyl)methacrylamide, N-(p-toluenesulfonyl)acrylamide, and the like can be used favorably as this compound.

As to alkali aqueous solution-soluble resins that can be used in this embodiment, the monomers including alkali-soluble groups of the above-mentioned (a-1) to (a-3) need not be used as a single type, and two or more types of monomer having the same alkali-soluble groups, or two or more types of monomer having different alkali-soluble groups may be copolymerized.

A known copolymerization method, such as graft copolymerization, block copolymerization, or random copolymerization, can be employed.

The above-mentioned copolymer contains preferably at least 10 mol %, and more preferably at least 20 mol % monomer having the alkali-soluble groups of (a-1) to (a-3) as a copolymerization component. If the copolymerization component is contained in an amount of less than 10 mol %, interaction with the resin having phenolic hydroxyl groups will be inadequate, and there will be an inadequate increase in developing latitude, which is the whole point of using the copolymerization component.

This copolymer may also contain other copolymerization components beside the monomer containing the above-mentioned alkali-soluble groups (a-1) to (a-3).

Examples of monomers that can be used as copolymerization components include the following monomers (1) to (12).

(1) Acrylic esters and methacrylic esters having aliphatic hydroxyl groups, such as 2-hydroxyethyl acrylate or 2-hydroxyethyl methacrylate (2) Alkyl acrylates, such as methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate, and N-dimethylaminoethyl acrylate (3) Alkyl methacrylates, such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate, and N-dimethylaminoethyl methacrylate (4) Acrylamides and methacrylamides, such as acrylamide, methacrylamide, N-methylolacrylamide, N-ethylacrylamide, N-hexylacrylamide, N-cyclohexylacrylamide, N-hydroxyethylacrylamide, N-phenylacrylamide, N-nitrophenylacrylamide, and N-ethyl-N-phenylacrylamide (5) Vinyl ethers, such as ethyl vinyl ether, 2-chloroethyl vinyl ether, hydroxyethyl vinyl ether, propyl vinyl ether, butyl vinyl ether, octyl vinyl ether, and phenyl vinyl ether (6) Vinyl esters, such as vinyl acetate, vinyl chloroacetate, vinyl butyrate, and vinyl benzoate (7) Styrenes, such as styrene, α-methylstyrene, methylstyrene, and chloromethylstyrene (8) Vinyl ketones, such as methyl vinyl ketone, ethyl vinyl ketone, propyl vinyl ketone, and phenyl vinyl ketone (9) Olefins, such as ethylene, propylene, isobutylene, butadiene, and isoprene

(10) N-vinylpyrrolidone, N-vinylcarbasol, 4-vinylpyridine, acrylonitrile, methacrylonitrile, and the like

(11) Unsaturated imides, such as maleimide, N-acryloylacrylamide, N-acetylmethacrylamide, N-propionylmethacrylamide, and N-(p-chlorobenzoyl) methacrylamide

(12) Unsaturated carboxylic acids, such as acrylic acid, methacrylic acid, maleic anhydride, and itaconic acid Regardless of whether it is a homopolymer or a copolymer, the alkali aqueous solution-soluble macromolecular compound in this embodiment should have a weight average molecular weight of at least 2000 and a number average molecular weight of at least 500 for the sake of film strength. It is even better for the weight average molecular weight to be from 5000 to 300,000 and the number average molecular weight from 800 to 250,000, and for the degree of dispersion (weight average molecular weight÷number average molecular weight) to be from 1.1 to 10.

For the sake of developing latitude, it is preferable for the weight ratio in which the monomer having alkali-soluble groups of (a-1) to (a-3) is compounded with other monomers to be between 50:50 and 5:95, and a range of 40:60 to 10:90 is even better.

These alkali aqueous solution-soluble macromolecular compounds may each be used singly or in combinations of two or more types, and added in an amount of 30 to 99 wt %, and preferably 40 to 95 wt %, and even more preferably 50 to 90 wt %, with respect to the total solids content of the photosensitive composition. The durability of the recording layer will suffer if the alkali aqueous solution-soluble macromolecular compound is added in an amount less than 30 wt %, but exceeding 99 wt % is undesirable in terms of both sensitivity and durability.

Other Components

Various other additives can be added to the photosensitive composition of this embodiment as needed. For instance, from the standpoint of improving the dissolution inhibiting effect of the image portion in the developing solution, it is favorable to concurrently use a substance that is pyrolytic and substantially lowers the solubility of the alkali aqueous solution-soluble macromolecular compound in a nondecomposed state, such as an aromatic sulfone compound or an aromatic sulfonic ester compound.

Cyclic acid anhydrides, phenols, and organic acids can also be used for the purpose of further increasing sensitivity. The phthalic anhydride, tetrahydrophthalic anhydride, hexahydrophthalic anhydride, 3,6-endoxy-Δ4-tetrahydrophthalic anhydride, tetrachlorophthalic anhydride, maleic anhydride, chloromaleic anhydride, α-phenylmaleic anhydride, succinic anhydride, pyromellitic anhydride, and the like discussed in the Specification of U.S. Pat. No. 4,115,128 can be used as cyclic acid anhydrides. Examples of phenols include bisphenol A, p-nitrophenol, 2,4,4'-trihydroxybenzophenone, 2,3,4-trihydroxybenzophenone, 4-hydroxybenzophenone, 4,4',4"-trihydroxytriphenylmethane, and 4,4',3",4"-tetrahydroxy-3,5,3',5'-tetramethyltriphenylmethane. Examples of organic acids include the sulfonic acids, sulfinic acids, alkylsulfuric acids, phosphonic acids, phosphoric esters, carboxylic acids, and the like discussed in Japanese Patent Applications Laid-Open S60-88942 and H2-96755 and elsewhere. Specific examples include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid.

The proportion of the printing plate material accounted for by the above-mentioned cyclic acid anhydrides, phenols, and organic acids is preferably 0.05 to 20 wt %, with 0.1 to 15 wt % being even better, and 0.1 to 10 wt % being particularly favorable.

In order to achieve stability over a wider range of developing conditions, a nonionic surfactant such as those discussed in Japanese Patent Applications Laid-Open S62-251740 and H3-208514, or an amphoteric surfactant such as those discussed in Japanese Patent Applications Laid-Open S59-121044 and H4-13149 can be added to the printing plate material in this embodiment.

Specific examples of nonionic surfactants include sorbitan tristearate, sorbitan monopalmitate, sorbitan trioleate, stearic acid monoglyceride, and polyoxyethylene nonylphenyl ether.

Specific examples of amphoteric surfactants include alkyldi(aminoethyl)glycines, alkylpolyaminoethylglycine hydrochlorides, 2-alkyl-N-carboxyethyl-N-hydroxyethyl imidazolinium betaines, and N-tetradecyl-N,N-betaine types (such as "Amorgen K," trade name of Daiichi Kogyo).

The proportion of the printing plate material accounted for by the above-mentioned nonionic and amphoteric surfactants should be 0.05 to 15 wt %, and preferably 0.1 to 5 wt %.

A printing agent for obtaining a visible image immediately after heating through exposure to light, or a dye or pigment that serves as an image colorant can be added to the printing plate material in this embodiment.

A typical example of a printing agent is a combination of a compound that releases an acid when heated through exposure to light (optical acid releaser) and an organic dye capable of forming a salt. Specific examples include the combination of an o-naphthoquinonediazide-4-sulfonic acid halogenide and a salt-forming organic dye discussed in Japanese Patent Applications Laid-Open Nos. S50-36209 and S53-8128, and the combination of a trihalomethyl compound and a salt-forming organic dye discussed in JP-A Nos. S53-36223, S54-74728, S60-3626, S61-143748, S61-151644, and S63-58440. Such trihalomethyl compounds include oxazole compounds and triazine compounds, both of which have excellent storage stability and give a sharp printed image.

In addition to the above-mentioned salt-forming organic dyes, other dyes can also be used as a colorant for an image. Including salt-forming organic dyes, favorable dyes include oil-soluble dyes and basic dyes. Specific examples include Oil Yellow #101, Oil Yellow #103, Oil Pink #312, Oil Green BG, Oil Blue BOS, Oil Blue #603, Oil Black BY, Oil Black BS, Oil Black T-505 (the above are made by Orient Chemical Industries), Victoria Pure Blue, Crystal Violet (CI 42555), Methyl Violet (CI 42535), Ethyl Violet, rhodamine B (CI 145170B), Malachite Green (CI 42000), and Methylene Blue (CI 52015). The dyes discussed in JP-A No. S62-293247 are particularly favorable. These dyes can be added to the printing plate material in a proportion of 0.01 to 10 wt %, and preferably 0.1 to 3 wt %, with respect to the total solids content of the printing plate material. A plasticizer is further added as needed to the printing plate material of this embodiment in order to impart flexibility to the coating film, for instance. Examples include butylphthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomers and polymers of acrylic acid or methacrylic acid.

In addition to these, epoxy compounds, vinyl ethers, the phenol compounds having hydroxymethyl groups and phenol compounds having alkoxymethyl groups discussed in JP-A No. H8-276558, the crosslinkable compounds having an alkali dissolution inhibiting action discussed in Japanese Patent Application H9-328937 (previously submitted by the present inventors), and the like can be added as needed.

A planographic printing plate base can be manufactured by coating a suitable support with a photosensitive layer coating solution containing the photosensitive composition of this embodiment, or with a solution produced by dissolving the coating solution components of a desired layer, such as a protective layer, in a solvent.

In this Specification, the term "planographic printing plate base" refers to a plate material in a state in which the image formation pattern has yet to be formed in the ink receiving and non-ink receiving portions, and "planographic printing plate" refers to a plate material in a state in which the image formation pattern has been formed in the ink receiving and non-ink receiving portions, making the plate ready to print.

Examples of the solvent used in the production of the coating solution in this embodiment include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-metylpyrrolidone, dimethyl sulfoxide, sulfolane, y-butyrolactone, toluene, and water, although this list is not comprehensive. These solvents can be used alone or as a mixture. The concentration of the above-mentioned components (total solids including additives) in the solvent is preferably 1 to 50 wt %. The coating amount (solids) on the support obtained after coating and drying will vary with the application, but for a photosensitive printing plate, for instance, 0.5 to 5.0 g/$m^2$ is generally favorable.

A variety of coating methods can be employed, but examples include bar coater coating, spin coating, spray coating, curtain coating, dip coating, air knife coating, blade coating, and roll coating. As the coating amount goes down, the apparent sensitivity increases, but the cover film characteristics of the photosensitive layer are diminished.

A surfactant for improving coatability, such as the fluorine-based surfactant discussed in JP-A No. S62-170950, can be added to the photosensitive layer coating solution containing the photosensitive composition in this embodiment. The preferred addition amount is 0.01 to 1 wt %, and even more preferably 0.05 to 0.5 wt %, of the total printing plate material.

The support used for the planographic printing plate base in this embodiment is a dimensionally stable, flat material, examples of which include paper, paper laminated with plastic (such as polyethylene, polypropylene, or polystyrene), sheet metal (such as aluminum, zinc, or copper), plastic film (such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, or polyvinyl acetal), and paper or plastic laminated or vapor deposited with a metal, as above.

A polyester film or aluminum sheet is preferable as the support used in the planographic printing plate base of this embodiment, and of these two, an aluminum sheet is particularly favorable because of its good dimensional stability and relatively low cost. A suitable aluminum sheet is a pure aluminum sheet or an alloy sheet whose main component is aluminum and which contains minute amounts of other elements. A plastic film laminated or vapor deposited with aluminum may also be used. The other elements contained in the aluminum alloy include silicon, iron, manganese, copper, magnesium, chromium, zinc, bismuth, nickel, and titanium. The amount in which the other elements are contained in the alloy is at most 10 wt % or less. Pure aluminum is particularly favorable in this embodiment, but since perfectly pure aluminum is difficult to manufacture due to refining constraints, it may contain very small amounts of other elements. There are no restrictions on the composition of the aluminum sheet used in this embodiment, and any aluminum sheet known in the past can be utilized. The thickness of the aluminum sheet used in this embodiment is about 0.1 to 0.6 mm, and preferably 0.15 to 0.4 mm, with 0.2 to 0.3 mm being particularly favorable.

Prior to the roughening of the aluminum sheet, a degreasing treatment may be performed as desired with a surfactant, organic solvent, or alkaline aqueous solution, for example, in order to remove any calendering oil from the surface.

The surface roughening of an aluminum sheet can be carried out by a variety of methods, examples of which include mechanical roughening, electrochemically dissolving and roughening the surface, and selectively dissolving the surface chemically. Any known method can be used as a mechanical method, such as ball peening, brushing, blasting, and buffing. Electrochemical roughening can be accomplished by using alternating or direct current in a hydrochloric acid or nitric acid electrolytic solution. The two methods may also be combined, as is disclosed in JP-A No. S54-63902.

The aluminum sheet that has thus been roughened is subjected as needed to alkali etching and neutralization, after which an anodization treatment is performed if desired in order to enhance wear resistance and the water retention of the surface. The electrolyte used in the anodization treatment of the aluminum sheet can be any of various types of electrolyte that form a porous oxide film, but generally sulfuric acid, phosphoric acid, oxalic acid, chromic acid, or a mixture of these is used. The concentration of these electrolytes is suitably determined according to the type of electrolyte.

The anodization treatment conditions will vary with the type of electrolyte, and as such cannot be unconditionally specified, but it is generally suitable to use a solution with an electrolyte concentration of 1 to 80 wt %, a temperature of 5 to 70° C., a current density of 5 to 60 A/dm$^2$, a voltage of 1 to 100 V, and an electrolysis time of 10 seconds to 5 minutes.

If the amount of anodization film is less than 1.0 g/m$^2$, the film will not be able to withstand printing adequately, the non-image areas of the planographic printing plate will be susceptible to scratching, and so-called "scratch soiling" will tend to occur, wherein ink adheres to the scratched portions during printing.

After the anodization treatment, the aluminum sheet is subjected to a hydrophilic treatment as needed. The hydrophilic treatment used in this embodiment includes the alkali metal silicate (such as sodium silicate aqueous solution) methods disclosed in U.S. Pat. Nos. 2,714,066, 3,181,461, 3,280,734, and 3,902,734. In these methods, the support is either dipped in a sodium silicate aqueous solution or electrolytically treated. In addition, the methods of treating with polyvinylphosphonic acid disclosed in U.S. Pat. Nos. 3,276,868, 4,153,461, and 4,689,272 or with potassium fluorozirconate as disclosed in Japanese Patent Publication S36-22063, for example, can be used.

The planographic printing plate base in this embodiment comprises a positive-type photosensitive layer containing the photosensitive composition of this embodiment provided over a support, but an undercoat layer can be provided between these as needed.

A variety of compounds can be used as the undercoat layer component. For example, these compounds can be selected from among carboxymethyl cellulose, dextrin, gum arabic, 2-aminoethylphosphonic acid and other such phosphonic acids having amino groups, substitutable phenylphosphonic acid, naphthylphosphonic acid, alkylphosphonic acids, glycerophosphonic acid, methylenediphosphonic acid, ethylenediphosphonic acid, and other such organic phosphonic acids, substitutable phenylphosphoric acid, naphthylphosphoric acid, alkylphosphoric acids, glycerophosphoric acid, and other such organic phosphoric acids, substitutable phenylphosphinic acid, naphthylphosphinic acid, alkylphosphinic acids, glycerophosphinic acid, and other such organic phosphinic acids, and triethanolamine hydrochloride and other such hydrochlorides of amines having hydroxy groups. A mixture of two or more types may also be used.

This organic undercoat layer can be provided by a method in which [one or more of] the above-mentioned organic compounds are dissolved in water or an organic solvent such as methanol, ethanol, or methyl ethyl ketone, or in a mixture of these solvents, and this solution is used to coat an aluminum sheet and then dried, or by a method in which an aluminum sheet is dipped in a solution produced by dissolving [one or more of] the above-mentioned organic compounds in water or an organic solvent such as methanol, ethanol, or methyl ethyl ketone, or in a mixture of these solvents, thereby causing the above-mentioned compounds to be adsorbed to the aluminum sheet, after which [the sheet] is washed with water or the like and dried to provide an organic undercoat layer. With the former method, a solution containing the above-mentioned organic compound in a concentration of 0.005 to 10 wt % can be applied by a variety of methods. With the latter method, the concentration of the solution is 0.01 to 20 wt %, and preferably 0.05 to 5 wt %, the dipping temperature is 20 to 90° C., and preferably 25 to 50° C., and the dipping time is 0.1 second to 20 minutes, and preferably 2 seconds to 1 minute. The solution used here can also be adjusted to a pH range of 1 to 12 by using a basic substance such as ammonia, triethylamine, or potassium hydroxide, or an acidic substance such as hydrochloric acid or phosphoric acid. A yellow dye can also be added in order to improve the tone reproducibility.

2 to 200 mg/m$^2$ is a suitable covering amount for the organic undercoat layer, with 5 to 100 mg/m$^2$ being preferable. Adequate printing durability will not be obtained if the above-mentioned covering amount is less than 2 mg/m$^2$, but no further improvement will result from exceeding 200 mg/m$^2$.

The positive-type planographic printing plate base produced above is usually subjected to image exposure and developing.

The source of active light rays used for the image exposure can be, for example, a mercury lamp, metal halide lamp, xenon lamp, chemical lamp, or carbon arc lamp. Types of radiation include electron beams, X rays, ion beams, and far infrared rays. g rays, i rays, deep UV light, and high-density energy beams (laser beams) can also be used. Examples of laser beams include helium/neon lasers, argon lasers, krypton lasers, helium/cadmium lasers, KrF excimer lasers, solid state lasers, and semiconductor lasers.

A light source having an emission wavelength from the near infrared to infrared band is preferable in this embodiment, and a solid state laser or semiconductor laser is particularly favorable.

Any alkali aqueous solution known in the past can be used as the developing solution or replenishing solution for the planographic printing plate base of this embodiment. Examples include sodium silicate, potassium silicate, sodium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide, lithium hydroxide, and other such inorganic alkali salts. It is also possible to use monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, and other such organic alkali agents.

These alkali agents can be used singly or in combinations of two or more types.

Among these alkali agents, a particularly favorable developing solution is an aqueous solution of a silicate such as sodium silicate or potassium silicate. The reason for this is that developability can be adjusted by means of the concentration and proportion of silicon oxide ($SiO_2$) and alkali metal oxide ($M_2O$) that are the components of the silicate. For example, the alkali metal silicates discussed in JP-A No. S54-62004 and Japanese Patent Publication S57-7427 can be used effectively.

It is known that when developing is performed using an automatic developing machine, the addition to the developing solution of an aqueous solution (replenishing solution) with a higher alkali strength than the developing solution allows a large quantity of PS plates to be treated without replacing the developing solution in the developing tank for an extended period. This replenishing system can be used to advantage in this embodiment as well. Various surfactants and organic solvents can be added as needed to the developing solution or replenishing solution for the purpose of promoting or inhibiting developability, dispersing developing gases, and enhancing the ink affinity of the image areas on the printing plate. Examples of favorable surfactants include anionic, cationic, nonionic, and amphoteric surfactants.

Furthermore, reducing agents such as potassium or sodium salts of inorganic acids such as sulfurous acid and hydrogensulfurous acid, hydroquinone, or resorcinol, as well as organic carboxylic acids, anti-foaming agents, and water softeners can also be added to the developing solution and replenishing solution as needed.

After being developed using the above-mentioned developing solution and replenishing solution, the printing plate is after-treated with washing water, a rinsing liquid containing a surfactant or the like, or a desensitizing solution containing gum arabic or a starch derivative. A combination of these treatments can be used as the after-treatment when the image recording material of this example is used as a printing plate.

Automatic developing machines for printing plates have been widely used in recent years in the plate making and printing industry for the purpose of rationalizing and standardizing the plate making industry. An automatic developing machine generally comprises a developing section and an after-treatment section, and includes the various treatment solution tanks, a sprayer, and an apparatus for conveying the printing plates. While an exposed printing plate is being conveyed horizontally, it is developed by being sprayed with the various treatment solutions that are pumped up and sprayed from a spray nozzle. Another method that has become known recently involves dipping and conveying a printing plate through a treatment solution with a guide roller or the like in a treatment solution tank filled with the solution. Automatic treatment such as this can be carried out while replenishing solution is added to the treatment solutions as dictated by the treatment amount, operating time, and so forth.

A so-called disposable treatment method, in which the treatment is performed with substantially unused treatment solution, can also be applied.

A photosensitive planographic printing plate base that makes use of the photosensitive composition of this embodiment will now be described. If there are any unnecessary image areas (such as film edge marks from the original film) on the planographic printing plate obtained by image exposure, developing, water washing and/or rinsing and/or gum coating, then these unnecessary image areas are erased. This erasure is preferably performed by a method in which the unnecessary image area is coated with an erasure solution, then allowed to stand for a specific length of time, and then washed with water, as discussed in Japanese Patent Publication H2-13293, but a method in which the unnecessary image area is irradiated with active light rays guided by an optical fiber, and then developed, as discussed in JP-A No. S59-174842, can also be utilized.

The planographic printing plate obtained above can be sent to the printing step after being coated with a desensitizing gum if desired, but burning is performed if a planographic printing plate with even higher printing durability is desired.

When the planographic printing plate is subjected to a burning treatment, it is preferable to treat it with a counter-etching solution as discussed in Japanese Patent Publications S61-2518 and S55-28062 and JP-A Nos. S62-31859 and S61-159655 prior to the burning treatment.

This is accomplished by using a sponge or absorbent cotton soaked with the counter-etching solution to coat the planographic printing plate, or by coating the printing plate by dipping it in a vat filled with counter-etching solution, or by coating it with an automatic coater, for example. Better results will be achieved by smoothing out the coating amount thereof with a squeegee or squeegee roller after coating.

A suitable coating amount of counter-etching solution is generally 0.03 to 0.8 g/$m^2$ (dry weight).

The planographic printing plate coated with counter-etching solution is dried if needed, after which it is heated to a high temperature with, for example, a burning processor (such as a "BP-1300," a burning processor available from Fuji Shashin Film). The heating temperature and time here will vary with the type of component that forms the image, but a range of 1 to 20 minutes between 180 and 300° C. is favorable.

The burning-treated planographic printing plate may be subjected to treatments performed past, such as washing with water, gum coating, and the like, if necessary, but when a counter-etching solution containing a water-soluble polymer or the like is used, the so-called desensitizing treatment such as gum coating or the like can be omitted.

The planographic printing plate obtained by such a treatment can be employed for making a plurality of prints using an offset printing press machine or the like.

EXAMPLES

This embodiment will now be described through examples, but the scope of the present invention is not limited to or by these examples.

Examples 1 to 8

(Production of Substrate)

After an aluminum sheet (type 1050) having a thickness of 0.3 mm was washed with trichloroethylene to degrease it, the surface was sand-blasted using a nylon brush and an aqueous suspension of 400 mesh pumice and washed well with water. This sheet was dipped in a 25% aqueous solution of sodium hydroxide at 45° C. for 9 seconds to etch it, washed with water, then dipped in 20% nitric acid for 20 seconds and again washed with water. At this point, the etched amount of the sand-blasted surface was about 3 g/$m^2$. Then, after 3 g/$m^2$ of a direct current anodization film had been formed on this sheet using 7% sulfuric acid as an electrolytic solution at a current density of 15 A/$dm^2$, the sheet was washed with water and dried. Then, the following undercoating solution was applied over this aluminum sheet and dried for 1 minute at 90° C. The coating amount after drying was 10 mg/$m^2$.

Composition of Coating Solution

β-alanine 0.5 g methanol 95 g water 5 g

The following photosensitive solutions 1 were prepared with the infrared absorbent varied as shown in Table 2 below, and the substrates obtained above were coated with these solutions such that the coating amount was 1.8 g/$m^2$, which yielded the planographic printing plate bases of Examples 1 to 8.

Composition of Photosensitive Solution 1 m- and p-cresol novolac (m/p ratio=6/4, weight average molecular weight: 3500, unreacted cresol content: 0.5 wt %) 1.0 g The alkali aqueous solution-soluble macromolecular compound Infrared absorbent shown in Table 2 0. 0.2 g The various compounds listed above as examples of phthalocyanine compounds were used Dye in which the counter anion of Victoria Blue BOH was a 1-naphthalenesulfonic acid anion 0.02 g Fluorine-based surfactant (Megafac F-177, made by Dainippon Ink & Chemicals) 0.05 g γ-Butyrolactone 3 g Methyl ethyl ketone 8 g 1-Methoxy-2-propanol 7 g

Examples 9 to 20

(Synthesis of Copolymer used as Alkali Aqueous Solution-Soluble Macromolecular Compound)

Synthesis Example (Copolymer 1)

1.0 g (0.36 mol) of methacrylic acid, 39.1 (0.36 mol) of ethyl chloroformate, and 200 mL of acetonitrile were put into a 500 mL three-necked flask equipped with an agitator, cooling pipe, and dropping funnel (condenser), and the mixture was agitated while being cooled in an ice water bath. 36.4 g (0.36 mol) of triethylamine was added dropwise to this mixture through the dropping funnel over a period of about 1 hour. Upon completion of the dropping, the ice water bath was taken away and the mixture was agitated for 30 minutes at room temperature.

To this reaction mixture was added 51.7 g (0.30 mol) of p-aminobenzenesulfonamide, and the mixture was agitated for 1 hour while being warmed to 70° C. with an oil bath. Upon completion of the reaction, this mixture was poured into 1 liter of water while the water was agitated, and the mixture thus obtained was agitated for another 30 minutes. This mixture was filtered to remove the precipitate, which was made into a slurry with 500 mL of water, after which this slurry was filtered, and the solids thus obtained were dried, which yielded N-(p-aminosulfonylphenyl) methacrylamide in the form of a white solid (yield: 46.9 g).

Then, 5.04 g (0.0210 mol) of N-(p-aminosulfonylphenyl)-methacrylamide, 2.05 g (0.0180 mol) of ethyl methacrylate, 1.11 g (0.021 mol) of acrylonitrile, and 20 g of N,N-dimethylacetamide were put into a 100 mL three-necked flask equipped with an agitator, cooling pipe (condenser), and dropping funnel, and the mixture was agitated while being heated to 65° C. by a hot water bath. 0.15 g of "V-65" (made by Wako Jun'yaku Industries) was added to this mixture, and the mixture was agitated for 2 hours under a nitrogen gas flow while being held at 65° C. To this mixture, another mixture of 5.04 g of N-(p-aminosulfonylphenyl) methacrylamide, 2.05 g of ethyl methacrylate, 1.11 g of acrylonitrile, 20 g of N,N-dimethylacetamide, and 0.15 g of "V-65" was added dropwise through the dropping funnel over a period of 2 hours. Upon completion of the dropping, the mixture thus obtained was agitated for another 2 hours at 65° C. Upon completion of the reaction, 40 g of methanol was added to the mixture, and the mixture was cooled. The mixture thus obtained was poured into 2 liters of water while the water was being agitated, and the resulting mixture was agitated for 30 minutes, after which the precipitate was filtered off and dried, which yielded 15 g of a white solid. The weight average molecular weight (polystyrene standard) of this copolymer 1 was measured by gel permeation chromatography and found to be 53,000.

The following photosensitive solutions 2 were prepared with the infrared absorbent varied as shown in Table 3 below, and substrates obtained in the same manner as in Examples 1 to 8 were coated with these solutions such that the coating amount was 1.8 g/$m^2$, which yielded the planographic printing plate bases of Examples 9 to 20.

Composition of Photosensitive Solution 2

| | |
|---|---|
| The above-mentioned copolymer 1 | 1.0 g |
| Infrared absorbent shown in Table 3 | 0.1 g |
| *The various compounds listed above as examples of phthalocyanine compounds were used | |
| Dye in which the counter anion of Victoria Blue BOH was a 1-naphthalenesulfonic acid anion | 0.02 g |
| Fluorine-based surfactant (Megafac F-177, made by Dainippon Ink & Chemicals) | 0.05 g |
| γ-Butyrolactone | 8 g |
| Methyl ethyl ketone | 8 g |
| 1-Methoxy-2-propanol | 4 g |

Comparative Examples 1 and 2

Other than changing the infrared absorbent (the phthalocyanine compound compounded in photosensitive solution 1) used in Example 1 to an infrared absorbent B-1 or B-2 having structures as shown below, the planographic printing plate bases of Comparative Examples 1 and 2 were obtained in exactly the same manner as in Example 1.

B-1

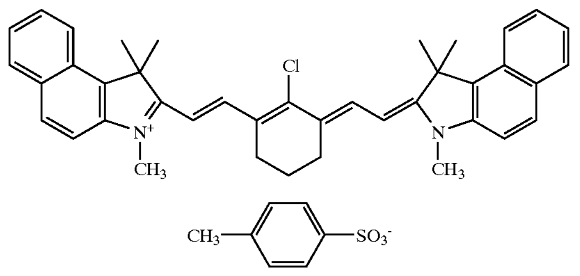

-continued

B-2

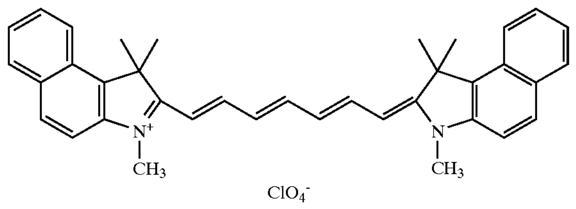

Comparative Examples 3 and 4

Other than changing the infrared absorbent (the phthalocyanine compound compounded in photosensitive solution 2) used in Example 9 to an infrared absorbent B-1 or B-2 having structures as shown below, the planographic printing plate bases of Comparative Examples 3 and 4 were obtained in exactly the same manner as in Example 9.

Performance Evaluation of Planographic Printing Plate Base

The various planographic printing plate bases of Examples 1 to 20 and Comparative Examples 1 to 4 produced above were subjected to performance evaluation according to the following standards. The evaluation results are given in Tables 2 and 3.

Image Formability: Evaluation of Sensitivity and Developing Latitude

Each of the planographic printing plate bases thus obtained was exposed using a semiconductor laser with a wavelength of 840 nm, after which it was developed using an automatic developing machine ("PS Processor 900VR," made by Fuji Shashin Film) stocked with developing solution DP-4 and rinsing solution FR-3 (1:7) made by Fuji Shashin Film. Two levels of DP-4 were used here; one diluted to 1:6 and one diluted to 1:12. The line width of the non-image areas obtained with each developing solution was measured, the irradiation energy of the laser corresponding to this line width was determined, and this was termed the sensitivity. The difference between the developing solution diluted to 1:6 (standard) and the one diluted to 1:12 was recorded. The smaller is this difference, the better is the developing latitude, with a practical level being 20 mJ/$cm^2$ or less.

Evaluation of Storage Stability

The planographic printing plate base thus obtained was stored for 3 days at 60° C. prior to laser exposure, after which laser exposure and developing were carried out in the same manner as above, sensitivity was measured in the same manner, and the change in the amount of energy over time was measured. Storage stability was judged to be good if the fluctuation in sensitivity was no more than 20 mJ/$cm^2$, which is a practical level.

TABLE 2

| | Infrared absorbing dye | Sensitivity | Developing latitude | Exposure wavelength | Change in energy over time |
|---|---|---|---|---|---|
| Example 1 | IR1-8 | 120 | 10 | 840 nm | 15 |
| Example 2 | IR1-10 | 120 | 10 | 840 nm | 15 |
| Example 3 | IR2-1 | 120 | 10 | 1064 nm | 10 |
| Example 4 | IR2-2 | 120 | 5 | 1064 nm | 10 |
| Example 5 | IR3-2 | 115 | 10 | 840 nm | 10 |
| Example 6 | IR3-5 | 110 | 10 | 840 nm | 10 |
| Example 7 | IR5-15 | 115 | 5 | 840 nm | 5 |
| Example 8 | IR5-17 | 110 | 5 | 840 nm | 5 |
| Comparative Example 1 | B-1 | 135 | 25 | 840 nm | 20 |

TABLE 2-continued

| | Infrared absorbing dye | Sensitivity | Developing latitude | Exposure wavelength | Change in energy over time |
|---|---|---|---|---|---|
| Comparative Example 2 | B-2 | 125 | 25 | 840 nm | 20 |

TABLE 3

| | Infrared absorbing dye | Sensitivity | Developing latitude | Exposure wavelength | Change in energy over time |
|---|---|---|---|---|---|
| Example 9 | IR1-6 | 120 | 15 | 840 nm | 15 |
| Example 10 | IR1-11 | 120 | 10 | 840 nm | 15 |
| Example 11 | IR2-1 | 120 | 10 | 1064 nm | 15 |
| Example 12 | IR2-4 | 120 | 10 | 840 nm | 10 |
| Example 13 | IR2-5 | 120 | 10 | 840 nm | 15 |
| Example 14 | IR3-1 | 115 | 10 | 840 nm | 10 |
| Example 15 | IR3-6 | 115 | 5 | 840 nm | 10 |
| Example 16 | IR3-16 | 115 | 10 | 840 nm | 10 |
| Example 17 | IR3-17 | 110 | 5 | 840 nm | 5 |
| Example 18 | IR5-1 | 115 | 10 | 840 nm | 5 |
| Example 19 | IR5-2 | 110 | 5 | 840 nm | 5 |
| Example 20 | IR5-18 | 110 | 5 | 840 nm | 5 |
| Comparative Example 3 | B-1 | 135 | 25 | 840 nm | 20 |
| Comparative Example 4 | B-2 | 125 | 25 | 840 nm | 20 |

It can be seen from the results in Tables 2 and 3 that all of the planographic printing plate bases of Examples 1 to 20 shows higher sensitivity for infrared laser than those of Comparative Examples to 1 to 4. It was also confirmed that the difference in sensitivity between developing solutions of two dilution concentrations was markedly smaller, the level of 20 $mJ/cm^2$ or less required for practical purposes was attained, and the developing latitude was excellent in the planographic printing plate bases of Examples 1 to 20.

Furthermore, the storage stability evaluation results tell us that all of the planographic printing plate bases in this embodiment had a fluctuation in sensitivity before and after storage that reached the level of 20 $mJ/cm^2$ or less required for practical purposes, meaning that storage stability was excellent.

It was confirmed that those which contained a phthalocyanine compound having an onium salt structure exhibited an especially outstanding effect.

To summarize the above, this embodiment provides a photosensitive composition with high sensitivity and with good stability with respect to storage and concentration of the developing solution, that is, good storage stability and developing latitude. Also, a planographic printing plate base in which this photosensitive composition is used can be applied to direct plate making using an infrared laser, and will exhibit an excellent effect in terms of good storage stability and developing latitude and high sensitivity.

Next, the photosensitive composition in the second embodiment of the present invention will be described in detail.

The positive-type photosensitive composition in this embodiment contains at least a macromolecular compound having acidic groups and an infrared absorbent expressed by the above-mentioned General Formula 2, and further contains other components as needed.

The above-mentioned macromolecular compound having acidic groups is a macromolecular compound that is insoluble in water and soluble in an alkali aqueous solution. This macromolecular compound having acidic groups will hereinafter be called an "alkali-soluble polymer."

The action of the above-mentioned infrared absorbent suppresses the solubility of the positive-type photosensitive composition of this embodiment in an alkali aqueous solution prior to infrared irradiation, and the composition becomes soluble in an alkali aqueous solution upon infrared irradiation.

Infrared Absorbent Expressed by General Formula 2

The positive-type photosensitive composition of this embodiment is characterized by containing an infrared absorbent expressed by the following General Formula 2.

General formula 2

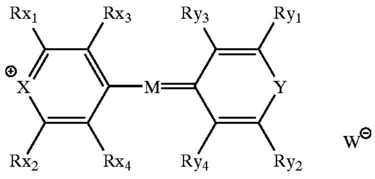

(In General Formula 2, X and Y represent chalcogen atoms, and each represents an oxygen atom, sulfur atom, selenium atom, or tellurium atom. Because synthesis is easier, oxygen atoms and sulfur atoms are preferred, and oxygen atoms are particularly favorable because of their interaction with the above-mentioned alkali-soluble polymer.

In the above General Formula 2, M represents a methine chain with at least five conjugated carbons, and may have a substituent or ring structure. The number of conjugated carbons is related to the absorption wavelength, so for an infrared laser, 5 to 13 is preferable, and 5, 7, and 9 are particularly favorable.

It is preferable in terms of solvent solubility for the methine chain to have a substituent. Examples of this substituent include a halogen atom, cyano group, alkyl group, aryl group, alkenyl group, alkynyl group, carbonyl group, thio group, sulfonyl group, sulfinyl group, oxy group, and amino group. A halogen atom, alkyl group, aryl group, thio group, amino group, or oxy group is particularly favorable.

Specific examples of these substituents are the same as the specific examples of substituents represented by Rx1 to Rx4 and Ry1 to Ry4, which are defined below.

It is particularly favorable for the above-mentioned substituent to be an alkyl group or substituted alkyl group with at least two carbons, and a linear form is better than a ring structure. It is particularly favorable for the above-mentioned substituent to be present at the α position of a pyrylium ring because miscibility with the alkali-soluble polymer will be then better and there will be less adsorption to the substrate and less soiling.

Ideally, for use with a laser having an exposure wavelength of 830 nm, M is a pentamethine chain with at least five conjugated carbons, and the infrared absorbent expressed by the following General Formula 9 is used.

General formula 9

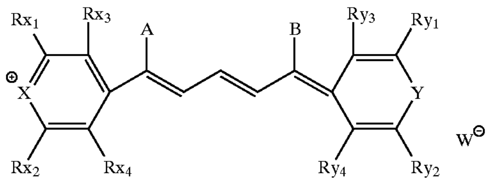

In General Formula 9, A and B represent substituents, and alkyl groups and aryl groups are particularly favorable as these substituents. Specific examples of these alkyl groups and aryl groups are the same as the specific examples of substituents expressed by Rx1 to Rx4, which are defined below.

Rx1 to Rx4 and Ry1 to Ry4 in General Formula 9 above may be the same or different and represent each a hydrogen atom, halogen atom, cyano group, alkyl group, aryl group, alkenyl group, alkynyl group, carbonyl group, thio group, sulfonyl group, sulfinyl group, oxy group, or amino group, and these may have substituents.

When any of Rx1 to Rx4 and Ry1 to Ry4 represents an alkyl group, examples of this alkyl group include linear, branched, and cyclic alkyl groups with from 1 to 20 carbon atoms. Specific examples include the methyl group, ethyl group, propyl group, butyl group, pentyl group, hexyl group, heptyl group, octyl group, nonyl group, decyl group, undecyl group, dodecyl group, tridecyl group, hexadecyl group, octadecyl group, eicosyl group, isopropyl group, isobutyl group, s-butyl group, t-butyl group, isopentyl group, neopentyl group, 1-methylbutyl group, isohexyl group, 2-ethylhexyl group, 2-methylhexyl group, cyclohexyl group, cyclopentyl group, and 2-norbornyl group. Of these, alkyl groups that are linear and have from 1 to 12 carbon atoms, are branched and have from 3 to 12 carbon atoms, and are cyclic and have from 5 to 10 carbon atoms are preferable.

These alkyl groups may have a substituent, and any monovalent non-metal atom group except for hydrogen can be used as this substituent. Favorable examples include a halogen atom (—F, —Br, —Cl, —I), hydroxyl group, alkoxy group, aryloxy group, mercapto group, alkylthio group, arylthio group, alkyldithio group, aryldithio group, amino group, N-alkylamino group, N,N-dialkylamino group, N-arylamino group, N,N-diarylamino group, N-alkyl-N-arylamino group, acyloxy group, carbamoyloxy group, N-alkylcarbamoyloxy group, N-arylcarbamoyloxy group, N,N-dialkylcarbamoyloxy group, N,N-diarylcarbamoyloxy group, N-alkyl-N-arylcarbamoyloxy group, alkylsulfoxy group, arylsulfoxy group, acylthio group, acylamino group, N-alkylacylamino group, N-arylacylamino group, ureido group, N'-alkylureido group, N',N'-dialkylureido group, N'-arylureido group, N',N'-diarylureido group, N'-alkyl-N'-arylureido group, N-alkylureido group, N-arylureido group, N'-alkyl-N-alkylureido group, N'-alkyl-N-arylureido group, N',N'-dialkyl-N-alkylureido group, N',N'-dialkyl-N-arylureido group, N'-aryl-N-alkylureido group, N'-aryl-N-arylureido group, N',N'-diaryl-N-alkylureido group, N',N'-diaryl-N-arylureido group, N'-alkyl-N'-aryl-N-alkylureido group, N'-alkyl-N'-aryl-N-arylureido group, alkoxycarbonylamino group, aryloxycarbonylamino group, N-alkyl-N-alkoxycarbonylamino group, N-alkyl-N-aryloxycarbonylamino group, N-aryl-N-alkoxycarbonylamino group, N-aryl-N-aryloxycarbonylamino group, formyl group, acyl group, carboxyl group and conjugated base group thereof (hereinafter referred to as "carboxylato group"), alkoxycarbonyl group, aryloxycarbonyl group, carbamoyl group, N-alkylcarbamoyl group, N,N-dialkylcarbamoyl group, N-arylcarbamoyl group, N,N-diarylcarbamoyl group, N-alkyl-N-arylcarbamoyl group, alkylsulfinyl group, arylsulfinyl group, alkylsulfonyl group, arylsulfonyl group, sulfo group (—$SO_3H$) and conjugated base group thereof (hereinafter referred to as "sulfonato group"), alkoxysulfonyl group, aryloxysulfonyl group, sulfinamoyl group, N-alkylsulfinamoyl group, N,N-dialkylsulfinamoyl group, N-arylsulfinamoyl group, N,N-diarylsulfinamoyl group, N-alkyl-N-arylsulfinamoyl group, sulfamoyl group, N-alkylsulfamoyl group, N,N-dialkylsulfamoyl group, N-arylsulfamoyl group, N,N-diarylsulfamoyl group, N-alkyl-N-arylsulfamoyl group, N-acrylsulfamoyl group and conjugated base group thereof, N-alkylsulfonylsulfamoyl group (—$SO_2NHSO_2R$, where R is an alkyl group) and conjugated base group thereof, N-arylsulfonylsulfamoyl group (—$SO_2NHSO_2Ar$, where Ar is an aryl group) and conjugated base group thereof, N-alkylsulfonylcarbamoyl group (—$CONHSO_2R$, where R is an alkyl group) and conjugated base group thereof, N-arylsulfonylcarbamoyl group (—$CONHSO_2Ar$, where Ar is an aryl group) and conjugated base group thereof, alkoxysilyl group (—$Si(OR)_3$, where R is an alkyl group), aryloxysilyl group (—$Si(OAr)_3$, where Ar is an aryl group), hydroxysilyl group (—$Si(OH)_3$) and conjugated base group thereof, phosphono group (—$PO_3H_2$) and conjugated base group thereof (hereinafter referred to as "phosphonato group"), dialkylphosphono group (—$PO_3R_2$, where R is an alkyl group), diarylphosphono group (—$PO_3Ar_2$, where Ar is an aryl group), alkylarylphosphono group (—$PO_3(R)(Ar)$, where R is an alkyl group and Ar is an aryl group), monoalkylphosphono group (—$PO_3H(R)$, where R is an alkyl group) and conjugated base group thereof (hereinafter referred to as "alkylphosphonato group"), monoarylphosphono group (—$PO_3H(Ar)$, where Ar is an aryl group) and conjugated base group thereof (hereinafter referred to as "arylphosphonato group"), phosphono-oxy group (—$OPO_3H_2$) and conjugated base group thereof (hereinafter referred to as "phosphonato-oxy group"), dialkylphosphono-oxy group (—$OPO_3 (R)_2$, where R is an alkyl group), diarylphosphono-oxy group (—$OPO_3(Ar)_2$, where Ar is an aryl group), alkylarylphosphono-oxy group (—$OPO_3(R)$ (Ar)2, where R is an alkyl group and Ar is an aryl group), monoalkylphosphono-oxy group (—$OPO_3H$ (R), where R is an alkyl group) and conjugated base group thereof (hereinafter referred to as "alkylphosphonato-oxy group"), monoarylphosphono-oxy group (—$OPO_3H(Ar)$, where Ar is an aryl group) and conjugated base group thereof (hereinafter referred to as "arylphosphonato-oxy group"), cyano group, nitro group, aryl group, alkenyl group, and alkynyl group.

Specific examples of the alkyl groups in these substituents include the alkyl groups already listed as examples of Rx1 to Rx4 and Ry1 to Ry4, and specific examples of the aryl groups include the phenyl group, biphenyl group, naphthyl group, tolyl group, xylyl group, mesityl group, cumenyl group, fluorophenyl group, chlorophenyl group, bromophenyl group, chloromethylphenyl group, hydroxyphenyl group, methoxyphenyl group, ethoxyphenyl group, phenoxyphenyl group, acetoxyphenyl group, benzoyloxyphenyl group, methylthiophenyl group, phenylthiophenyl group, methylaminophenyl group, dimethylaminophenyl group, acetylaminophenyl. group, carboxyphenyl group, methoxycarbonylphenyl group, ethoxycarbonylphenyl group, phenoxycarbonylphenyl group, N-phenylcarbamoylphenyl group, nitrophenyl group, cyanophenyl group, sulfophenyl group, sulfonatophenyl group, phosphonophenyl group, and phosphonatophenyl group. Specific examples of alkenyl groups in the above-mentioned substituents include the vinyl group, 1-propenyl group, 1-butenyl group, cinnamyl group, and 2-chloro-l-ethenyl group; Specific examples of alkynyl groups include the ethynyl group, 1-propynyl group, 1-butynyl group, trimethylsilylethynyl group, and phenylethynyl group. Examples of the acyl group (R1CO—) in the above-mentioned substituents include those in which R1 is a hydrogen atom or one of the above-mentioned alkyl groups, aryl groups, alkenyl groups, or alkynyl groups.

Of these substituents, particularly favorable examples include a halogen atom (—F, —Br, —Cl, —I), alkoxy group, aryloxy group, alkylthio group, arylthio group, N-alkylamino group, N,N-dialkylamino group, acyloxy group, N-alkylcarbamoyloxy group, N-arylcarbamoyloxy group, acylamino group, formyl group, acyl group, carboxyl group, alkoxycarbonyl group, aryloxycarbonyl group, carbamoyl group, N-alkylcarbamoyl group, N,N-dialkylcarbamoyl group, N-arylcarbamoyl group, N-alkyl-N-arylcarbamoyl group, sulfo group, sulfonato group, sulfamoyl group, N-alkylsulfamoyl group, N,N-dialkylsulfamoyl group, N-arylsulfamoyl group, N-alkyl-N-arylsulfamoyl group, phosphono group, phosphonato group, dialkylphosphono group, diarylphosphono group, monoalkylphosphono group, alkylphosphonato group, monoarylphosphono group, arylphosphonato group, phosphono-oxy group, phosphonato-oxy group, aryl group, and alkenyl group.

Meanwhile, examples of the alkylene groups in the substituted alkyl groups include the above-mentioned C1 to C20 alkyl groups in which one of the hydrogen atoms has been removed, leaving a divalent organic residue. Preferable examples include alkylene groups that are linear and have from 1 to 12 carbon atoms, are branched and have from 3 to 12 carbon atoms, and are cyclic and have from 5 to 10 carbon atoms.

Specific, favorable examples of substituted alkyl groups obtained by combining these substituents and alkylene groups include the chloromethyl group, bromomethyl group, 2-chloroethyl group, trifluoromethyl group, methoxymethyl group, methoxyethoxyethyl group, allyloxymethyl group, phenoxymethyl group, methylthiomethyl group, tolylthiomethyl group, ethylaminoethyl group, diethylaminopropyl group, morpholinopropyl group, acetyloxymethyl group, benzoyloxymethyl group, N-cyclohexylcarbamoyloxyethyl group, N-phenylcarbamoyloxyethyl group, acetylaminoethyl group, N-methylbenzoylaminopropyl group, 2-oxoethyl group, 2-oxopropyl group, carboxypropyl group, methoxycarbonylethyl group, methoxycarbonylmethyl group, methoxycarbonylbutyl group, allyloxycarbonylbutyl group, chlorophenoxycarbonylmethyl group, carbamoylmethyl group, N-methylcarbamoylethyl group, N,N-dipropylcarbamoylmethyl group, N-(methoxyphenyl) carbamoylethyl group, N-methyl-N-(sulfophenyl) carbamoylmethyl group, sulfopropyl group, sulfobutyl group, sulfonatobutyl group, sulfamoylbutyl group, N-ethylsulfamoylmethyl group, N,N-dipropylsulfamoylpropyl group, N-tolylsulfamoylpropyl group, N-methyl-N-(phosphonophenyl)sulfamoyloctyl group, phosphonobutyl group, phosphonohexyl group, diethylphosphonobutyl group, diphenylphosphonopropyl group, methylphosphonobutyl group, methylphosphonatobutyl group, tolylphosphonohexyl group, tolylphosphonatohexyl group, phosphono-oxypropyl group, phosphonatooxybutyl group, benzyl group, phenethyl group, α-methylbenzyl group, 1-methyl-1-phenylethyl group, p-methylbenzyl group, cinnamyl group, allyl group, 1-propenylmethyl group, 2-butenyl group, 2-methylallyl group, 2-methylpropenylmethyl group, 2-propynyl group, 2-butynyl group, and 3-butynyl group.

When any of the Rx1 to Rx4 and Ry1 to Ry4 groups is an aryl group, examples of this aryl group include those in which from one to three benzene rings have formed a condensed ring, and those in which a benzene ring and a five-member unsaturated ring have formed a condensed ring. Specific examples include the phenyl group, naphthyl group, anthryl group, phenanthryl group, indenyl group, acenaphthenyl group, and fluorenyl group. Of these, the phenyl group and naphthyl group are particularly favorable.

When any of the Rx1 to Rx4 and Ry1 to Ry4 groups represents a substituted aryl group, the substituted aryl group is one having a monovalent non-metal atom group other than hydrogen as the substituent on the ring-forming carbon atoms of the above-mentioned aryl groups. Examples of preferable substituents include the above-mentioned alkyl groups, substituted alkyl groups, and groups listed as substituents in these substituted alkyl groups.

Specific, favorable examples of substituted aryl groups include the biphenyl group, tolyl group, xylyl group, mesityl group, cumenyl group, chlorophenyl group, bromophenyl group, fluorophenyl group, chloromethylphenyl group, trifluoromethylphenyl group, hydroxyphenyl group, methoxyphenyl group, methoxyethoxyphenyl group, allyloxyphenyl group, phenoxyphenyl group, methylthiophenyl group, tolylthiophenyl group, phenylthiophenyl group, ethylaminophenyl group, diethylaminophenyl group, morpholinophenyl group, acetyloxyphenyl group, benzoyloxyphenyl group, N-cyclohexylcarbamoyloxyphenyl group, N-phenylcarbamoyloxyphenyl group, acetylaminophenyl group, N-methylbenzoylaminophenyl group, carboxyphenyl group, methoxycarbonylphenyl group, allyloxycarbonylphenyl group, chlorophenoxycarbonylphenyl group, carbamoylphenyl group, N-methylcarbamoylphenyl group, N,N-dipropylcarbamoylphenyl group, N-(methoxyphenyl) carbamoylphenyl group, N-methyl-N-(sulfophenyl) carbamoylphenyl group, sulfophenyl group, sulfonatophenyl group, sulfamoylphenyl group, N-ethylsulfamoylphenyl group, N,N-dipropylsulfamoylphenyl group, N-tolylsulfamoylphenyl group, N-methyl-N-(phosphonophenyl)sulfamoylphenyl group, phosphonophenyl group, phosphonatophenyl group, diethylphosphonatophenyl group, diphenylphosphonophenyl group, methylphosphonophenyl group, methylphosphonatophenyl group, tolylphosphonophenyl group, tolylphosphonatophenyl group, allyl group, 1-propenylmethyl group, 2-butenyl group, 2-methylallylphenyl group, 2-methylpropenylphenyl group, 2-propynylphenyl group, 2-butynylphenyl group, and 3-butynylphenyl group.

When any of Rx1 to Rx4 and Ry1 to Ry4 represents an alkenyl group, substituted alkenyl group, alkynyl group, or substituted alkynyl group (—C(R2)═C(R3)(R4) and —C≡C(R5)), then R2, R3, R4, and R5 are monovalent non-metal atom groups. Favorable examples of R2, R3, R4, and R5 include a hydrogen atom, halogen atom, alkyl group, substituted alkyl group, aryl group, and substituted aryl group. Specific examples of these are the same as listed above. Examples of favorable substituents for R2, R3, R4, and R5 include a hydrogen atom, halogen atom, or linear, branched, or cyclic alkyl group with 1 to 10 carbon atoms.

Specific examples of R2, R3, R4, and R5 include the methyl group, ethyl group, propyl group, butyl group, pentyl group, hexyl group, heptyl group, octyl group, nonyl group, decyl group, undecyl group, dodecyl group, tridecyl group, hexadecyl group, octadecyl group, eicosyl group, isopropyl group, isobutyl group, s-butyl group, t-butyl group, isopentyl group, neopentyl group, 1-methylbutyl group, isohexyl group, 2-ethylhexyl group, allyl group, 1-propenylmethyl group, 2-butenyl group, 2-methylallyl group, 2-methylpropenyl group, 2-propynyl group, 2-butynyl group, 3-butynyl group, benzyl group, phenethyl group, α-methylbenzyl group, 1-methyl-1-phenethyl group, p-methylbenzyl group, cinnamyl group, hydroxyethyl group, methoxyethyl group, phenoxydiethyl group, allyloxyethyl group, methoxyethoxyethyl group, ethoxyethoxyethyl group, morpholinoethyl group, morpholinopropyl group, sulfopropyl group, sulfonatopropyl group, sulfobutyl group, sulfonatobutyl group, carboxydimethyl group, carboxydiethyl group, carboxypropyl group, methoxycarbonylethyl group, 2-ethylhexyloxycarbonylethyl group, phenoxycarbonylmethyl group, methoxycarbonylpropyl group, N-methylcarbamoylethyl group, N,N-ethylaminocarbamoylmethyl group, N-phenylcarbamoylpropyl group, N-tolylsulfamoylbutyl group, p-trienesulfonylaminopropyl group, benzoylaminohexyl group, phosphonomethyl group, phosphonoethyl group, phosphonopropyl group, p-phosphonobenzylaminocarbonylethyl group, phosphonatomethyl group, phosphonatopropyl group, phosphonatobutyl group, p-phosphonatobenzylaminocarbonylethyl group, vinyl group, and ethynyl group.

When any of Rx1 to Rx4 and Ry1 to Ry4 represents a substituted carbonyl group (R6CO—), then R6 represents a monovalent non-metal atom group. Favorable examples of substituted carbonyl groups include a formyl group, acyl group, carboxyl group, alkoxycarbonyl group, aryloxycarbonyl group, carbamoyl group, N-alkylcarbamoyl group, N,N-dialkylcarbamoyl group, N-arylcarbamoyl group, N,N-dialkylcarbamoyl group, and N-alkyl-N-arylcarbamoyl group. Examples of the alkyl groups and aryl groups in these include those listed above as examples of alkyl groups, substituted alkyl groups, aryl groups, and substituted aryl groups. Of these, examples of preferred substituted carbonyl groups include a formyl group, acyl group, carboxyl group, alkoxycarbonyl group, aryloxycarbonyl group, carbamoyl group, N-alkylcarbamoyl group, N,N-dialkylcarbamoyl group, and N-arylcarbamoyl group, and especially favorable examples include a formyl group, acyl group, alkoxycarbonyl group, and aryloxycarbonyl group. Specific examples of favorable substituted carbonyl groups include a formyl group, acetyl group, benzoyl group, carboxyl group, methoxycarbonyl group, allyloxycarbonyl group, N-methylcarbamoyl group, N-phenylcarbamoyl group, N,N-diethylcarbamoyl group, and morpholinocarbonyl group.

When any of Rx1 to Rx4 and Ry1 to Ry4 represents a substituted thio group (R7S—), then R7 represents a monovalent non-metal atom group other than hydrogen. Examples of favorable substituted thio groups include an alkylthio group, arylthio group, alkyldithio group, aryldithio group, and acylthio group. Examples of the alkyl groups and aryl groups in these include those listed above as examples of alkyl groups, substituted alkyl groups, aryl groups, and substituted aryl groups. of these, alkylthio groups and arylthio groups are preferred. Specific examples of favorable substituted thio groups include a methylthio group, ethylthio group, phenylthio group, ethoxyethylthio group, carboxyethylthio group, and methoxycarbonylthio group.

When Rx1 to Rx4 and Ry1 to Ry4 represent substituted sulfonyl groups ($R8SO_2^-$), then R8 represents a monovalent non-metal atom group. Preferred examples include alkylsulfonyl groups and arylsulfonyl groups. Examples of the alkyl groups and aryl groups in these include those listed above as examples of alkyl groups, substituted alkyl groups, aryl groups, and substituted aryl groups. Specific examples of substituted sulfonyl groups include a butylsulfonyl group and chlorophenylsulfonyl group.

When Rx1 to Rx4 and Ry1 to Ry4 represent substituted sulfinyl groups (R9SO—), then R9 represents a monovalent non-metal atom group. Preferred examples include an alkylsulfinyl group, arylsulfinyl group, sulfinamoyl group, N-alkylsulfinamoyl group, N,N-dialkylsulfinamoyl group, N-arylsulfinamoyl group, N,N-diarylsulfinamoyl group, and N-alkyl-N-arylsulfinamoyl group. Examples of the alkyl groups and aryl groups in these include those listed above as examples of alkyl groups, substituted alkyl groups, aryl groups, and substituted aryl groups. of these, preferred examples include alkylsulfinyl groups and arylsulfinyl groups. Specific examples of these substituted sulfinyl groups include a hexylsulfinyl group, benzylsulfinyl group, and tolylsulfinyl group.

When Rx1 to Rx4 and Ry1 to Ry4 represents substituted oxy groups (R100—), then R10 represents a monovalent non-metal atom group other than hydrogen. Examples of favorable substituted oxy groups include an alkoxy group, aryloxy group, acyloxy group, carbamoyloxy group, N-alkylcarbamoyloxy group, N-arylcarbamoyloxy group, N,N-dialkylcarbamoyloxy group, N,N-diarylcarbamoyloxy group, N-alkyl-N-arylcarbamoyloxy group, alkylsulfoxy group, arylsulfoxy group, phosphono-oxy group, and phosphonato-oxy group. Examples of the alkyl groups and aryl groups in these include those listed above as examples of alkyl groups, substituted alkyl groups, aryl groups, and substituted aryl groups.

Examples of the acyl group (R1CO—) in the above-mentioned acyloxy group include those in which R1 is one of the above-mentioned alkyl groups, aryl groups, alkenyl groups, or alkynyl groups. Of these substituents, particularly favorable examples include an alkoxy group, aryloxy group, acyloxy group, and arylsulfoxy group. Specific examples of favorable substituted oxy groups include the methoxy group, ethoxy group, propyloxy group, isopropyloxy group, butyloxy group, pentyloxy group, hexyloxy group, dodecyloxy group, benzyloxy group, allyloxy group, phenethyloxy group, carboxyethyloxy group, methoxycarbonylethoxy group, ethoxycarbonylethyloxy group, methoxyethoxy group, phenoxyethoxy group, methoxyethoxyethoxy group, ethoxyethoxyethoxy group, morpholinoethoxy group, morpholinopropyloxy group, allyloxyethoxyethoxy group, phenoxy group, tolyloxy group, xylyloxy group, mesityloxy group, cumenyloxy group, methoxyphenyloxy group, ethoxyphenyloxy group, chlorophenyloxy group, bromophenyloxy group, acetyloxy group, benzoyloxy group, naphthyloxy group, phenylsulfonyloxy group, phosphono-oxy group, and phosphonato-oxy group.

When Rx1 to Rx4 and Ry1 to Ry4 represent substituted amino groups (R11NH—, (R12)(R13)N—), the above-mentioned R11, R12, and R13 represent each a monovalent non-metal-atom group other than hydrogen. Examples of favorable substituted amino groups include an N-alkylamino group, N,N-dialkylamino group, N-arylamino group, N,N-diarylamino group, N-alkyl-N-arylamino group, acylamino group, N-alkylacylamino group, N-arylacylamino group, ureido group, N'-alkylureido group, N',N'-dialkylureido group, N'-arylureido group, N',N'-diarylureido group, N'-alkyl-N'-arylureido group, N-alkylureido group, N-arylureido group, N'-alkyl-N-alkylureido group, N'-alkyl-N-arylureido group, N',N'-dialkyl-N-alkylureido group, N',N'-dialkyl-N-arylureido group, N'-aryl-N-alkylureido group, N'-aryl-N-arylureido group, N',N'-diaryl-N-alkylureido group, N',N'-diaryl-N-arylureido group, N'-alkyl-N'-aryl-N-alkylureido group, N'-alkyl-N'-aryl-N-arylureido group, alkoxycarbonylamino group, aryloxycarbonylamino group, N-alkyl-N-alkoxycarbonylamino group, N-alkyl-N-aryloxycarbonylamino group, N-aryl-N-alkoxycarbonylamino group, and N-aryl-N-aryloxycarbonylamino group.

Examples of the alkyl groups and aryl groups in these include those listed above as examples of alkyl groups, substituted alkyl groups, aryl groups, and substituted aryl groups, and R1 of the acyl group (R1CO—) in the acylamino group, N-alkylacylamino group, and N-arylacylamino group is defined as above. Of these, favorable examples include N-alkylamino groups, N,N-dialkylamino groups, N-arylamino groups, and acylamino groups.

Specific examples of favorable substituted amino groups include a methylamino group, ethylamino group, diethylamino group, morpholino group, piperidino group, pyrrolidino group, phenylamino group, benzoylamino group, acetylamino group, and onium salt.

Out of all the above, it is preferable in terms of coloring material solvent-solubility, stability, and so forth for the substituents expressed by Rx1 to Rx4 and Ry1 to Ry4 to be hydrogen atoms, halogen atoms, alkyl groups, aryl groups, and oxy groups.

In General Formula 2 above, $W^-$ (hereinafter referred to as a "counter anion) represents a monovalent or polyvalent anion. $W^-$ may be any anion, but an anion that is not highly nucleophilic is preferable.

Specific examples of $W^-$ include halogen ions such as $ClO_4^-$, $IO_4^-$, or $BF_4^-$, $Ph_4B^-$, $SO4^{2-}$, a carbonate (such as $CF_3CO_3^-$), an alkylsulfonate (such as methane sulfonate), an aryl sulfonate (such as p-toluene sulfonate), and $SbCl_6^-$.

Examples of the alkyl group in the alkylsulfonate and the aryl group in the arylsulfonate include those listed above as examples of alkyl groups, substituted alkyl groups, aryl groups, and substituted aryl groups.

Examples of preferred counter anions include those can generate heat upon decomposition, such as $ClO_4^-$, and organic salts that are miscible with the alkali-soluble polymer, such as carboxylates.

The cationic coloring material skeleton of the infrared absorbent expressed by General Formula 2 above is a pyrylium-based coloring material, and because the positive charges of the coloring material are delocalized, the following examples express the same structure.

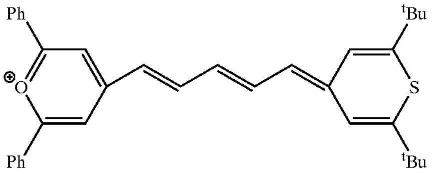

=

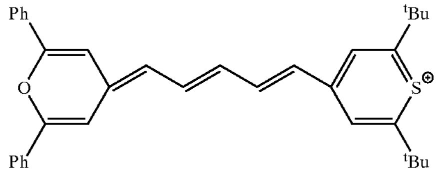

=

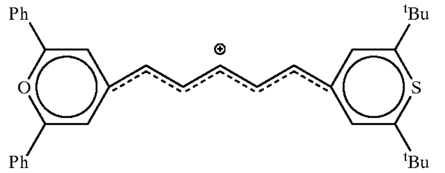

=

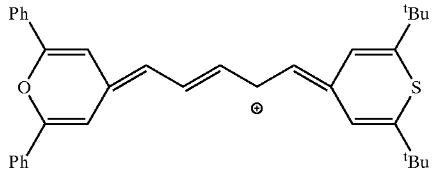

=

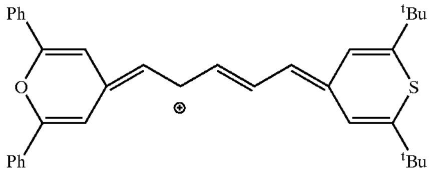

Specific examples of the cationic coloring material skeleton of the infrared absorbent expressed by General Formula 2 above are given below, but this embodiment is not limited to these specific examples.

IR-1
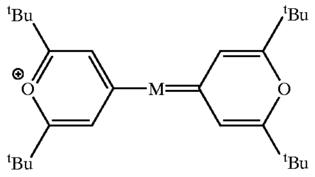
—M=
IR-1-1
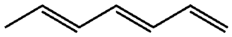
IR-1-2
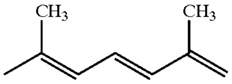
IR-1-3
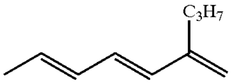
IR-1-4
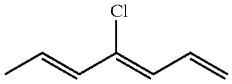
IR-1-5
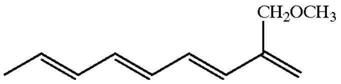
IR-1-6
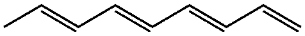
IR-1-7
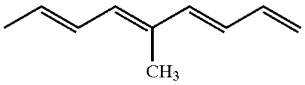
IR-1-8
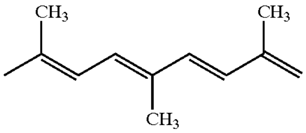
IR-1-9
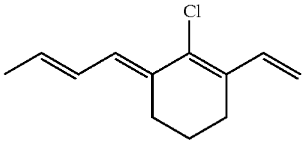
IR-1-10
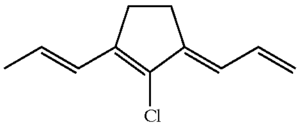
IR-1-11
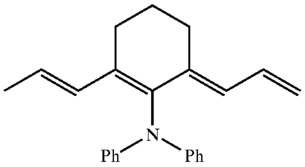

-continued
IR-1-12
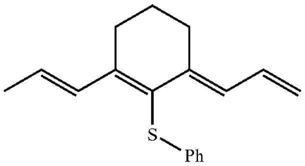
IR-1-13
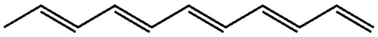
IR-1-14
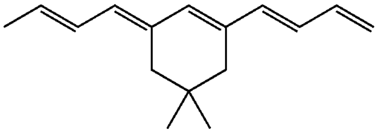
IR-1-15
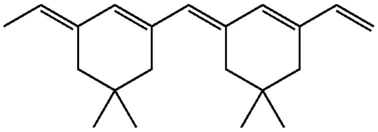
IR-1-16
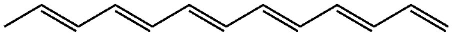
IR-1-17
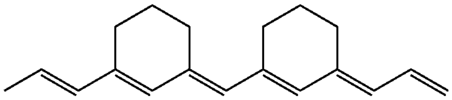
IR-1-18
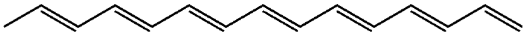
IR-2
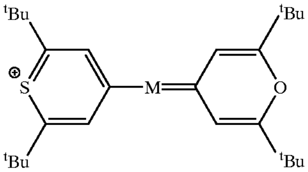
—M=
IR-2-1
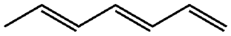
IR-2-2
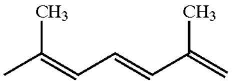
IR-2-3
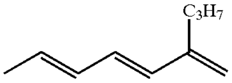
IR-2-4
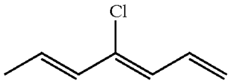
IR-2-5
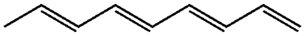
IR-2-6
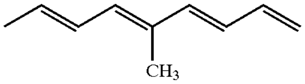

-continued
IR-2-7 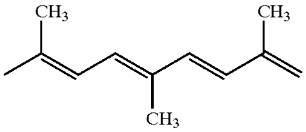
IR-2-8 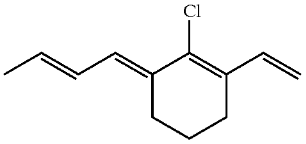
IR-2-9 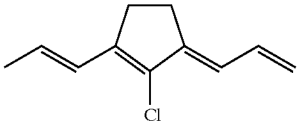
IR-2-10 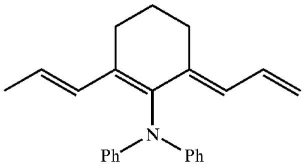
IR-2-11 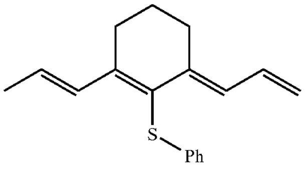
IR-2-12 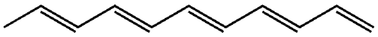
IR-2-13 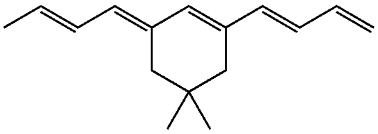
IR-2-14 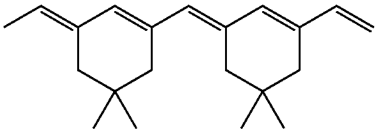
IR-2-15 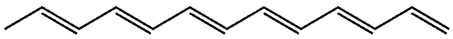
IR-2-16 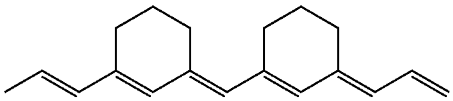
IR-2-17 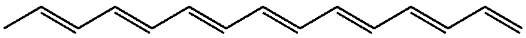

-continued
| IR-3 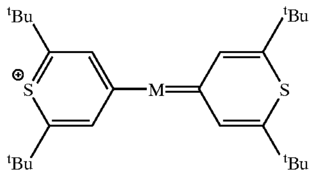 | |
|---|---|
| | —M= |
| IR-3-1 | 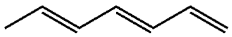 |
| IR-3-2 | 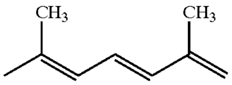 |
| IR-3-3 | 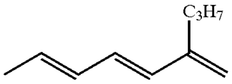 |
| IR-3-4 | 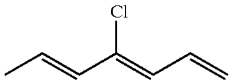 |
| IR-3-5 | 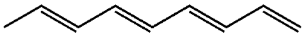 |
| IR-3-6 | 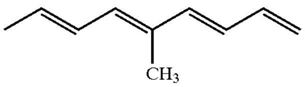 |
| IR-3-7 | 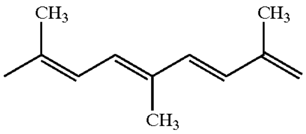 |
| IR-3-8 | 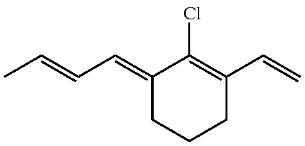 |
| IR-3-9 | 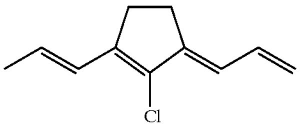 |
| IR-3-10 | 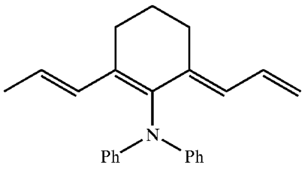 |
| IR-3-11 | 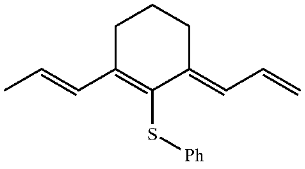 |
| IR-3-12 | 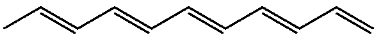 |

-continued
IR-3-13
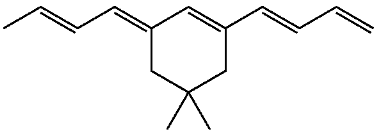
IR-3-14
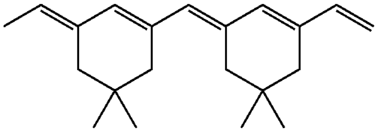
IR-3-15
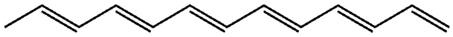
IR-3-16
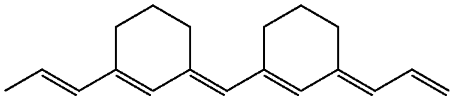
IR-3-17
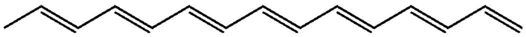
IR-4
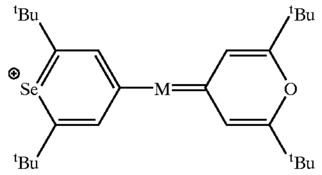
—M=
IR-4-1
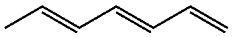
IR-4-2
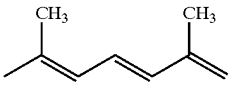
IR-4-3
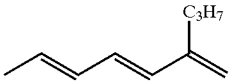
IR-4-4
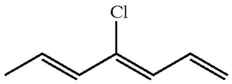
IR-4-5
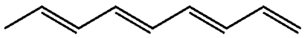
IR-4-6
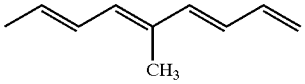
IR-4-7
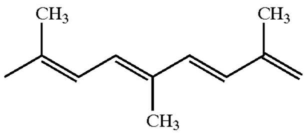
IR-4-8
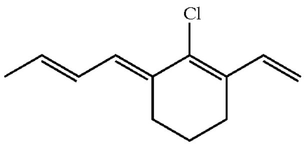

-continued
| | |
|---|---|
| IR-4-9 | 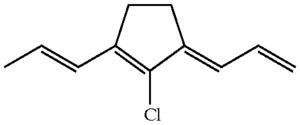 |
| IR-4-10 | 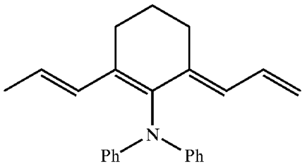 |
| IR-4-11 | 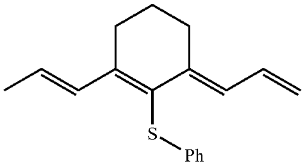 |
| IR-4-12 | 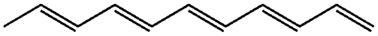 |
| IR-4-13 | 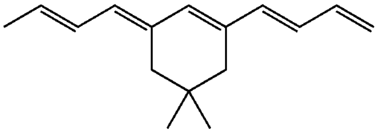 |
| IR-4-14 | 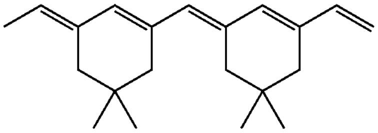 |
| IR-4-15 | 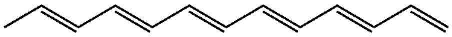 |
| IR-4-16 | 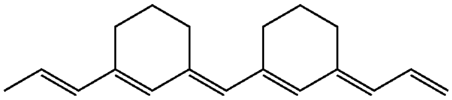 |
| IR-4-17 | 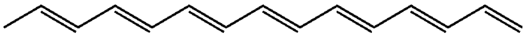 |
IR-5 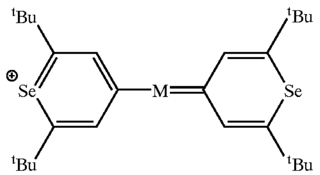
| | —M= |
|---|---|
| IR-5-1 | 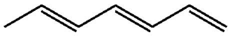 |
| IR-5-2 | 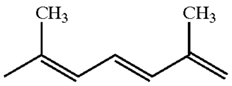 |
| IR-5-3 | 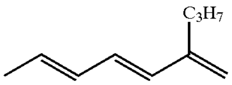 |

-continued
IR-5-4
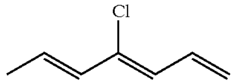
IR-5-5
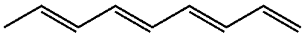
IR-5-6
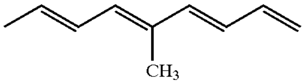
IR-5-7
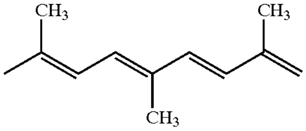
IR-5-8
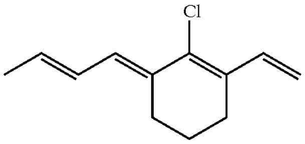
IR-5-9
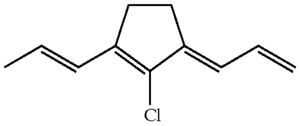
IR-5-10
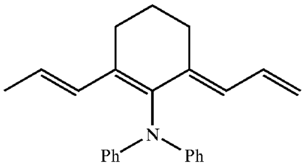
IR-5-11
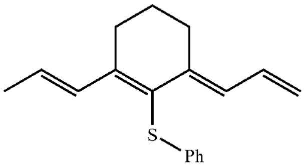
IR-5-12
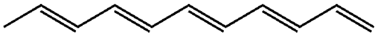
IR-5-13
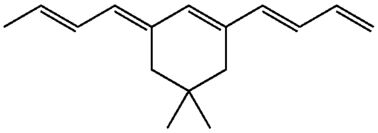
IR-5-14
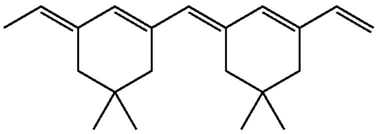
IR-5-15
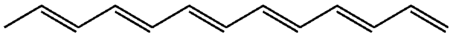
IR-5-16
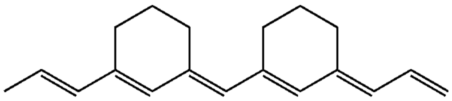

-continued
IR-5-17 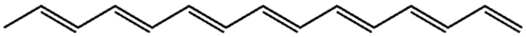
IR-6 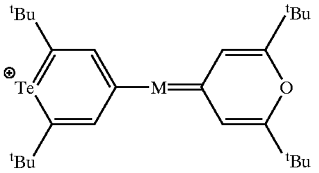
—M═
IR-6-1 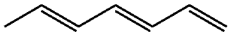
IR-6-2 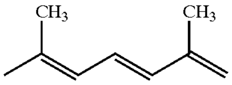
IR-6-3 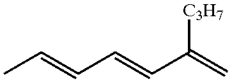
IR-6-4 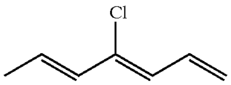
IR-6-5 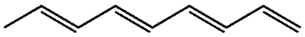
IR-6-6 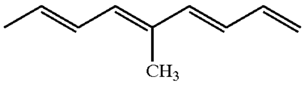
IR-6-7 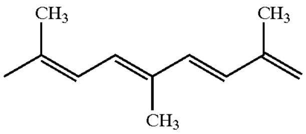
IR-6-8 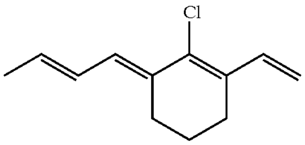
IR-6-9 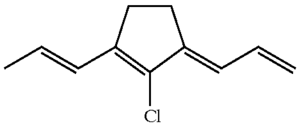
IR-6-10 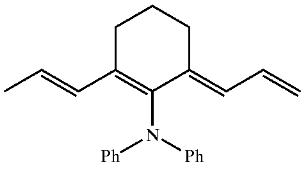
IR-6-11 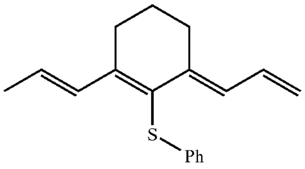

-continued
IR-6-12 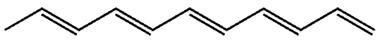
IR-6-13 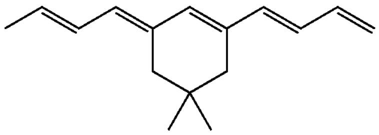
IR-6-14 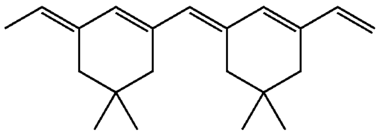
IR-6-15 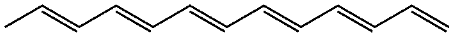
IR-6-16 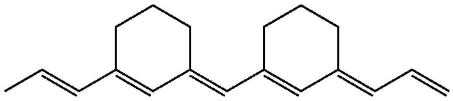
IR-6-17 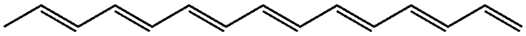
IR-7 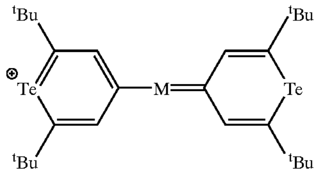
—M═
IR-7-1 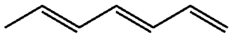
IR-7-2 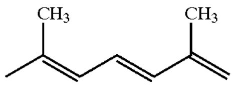
IR-7-3 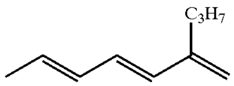
IR-7-4 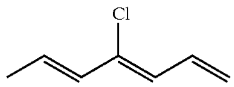
IR-7-5 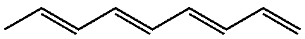
IR-7-6 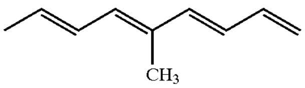
IR-7-7 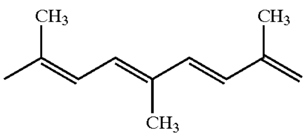

-continued
IR-7-8
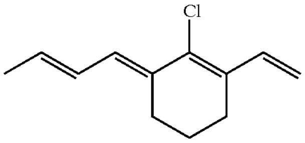
IR-7-9
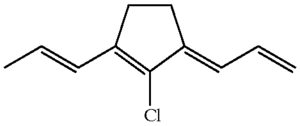
IR-7-10
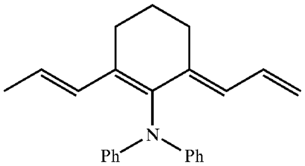
IR-7-11
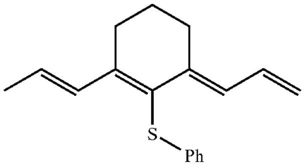
IR-7-12
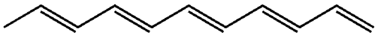
IR-7-13
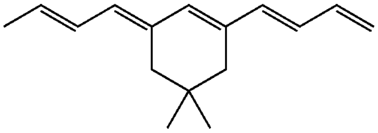
IR-7-14
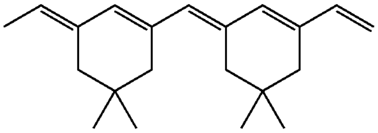
IR-7-15
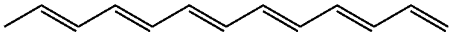
IR-7-16
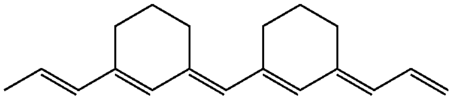
IR-7-17
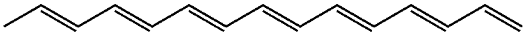
IR-8
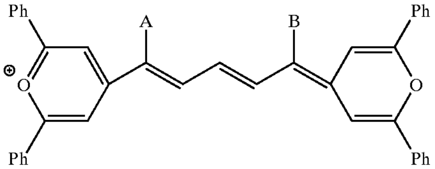
(X = Y = O, $Rx_1 = Rx_2 = Ry_1 = Ry_2$ = Ph, $Rx_3 = Rx_4 = Ry_3 = Ry_4$ = H)
| | A | B |
|---|---|---|
| IR-8-1 | $—CH_3$ | $—CH_3$ |
| IR-8-2 | $—C_3H_7$ | $—C_3H_7$ |
| IR-8-3 | $—CH{=}CH_2$ | $—CH{=}CH_2$ |
| IR-8-4 | $—CH_2OCH_3$ | $—CH_2OCH_3$ |

-continued
| | | |
|---|---|---|
| IR-8-5 | —H | $—C_5H_{11}$ |
| IR-8-6 | $—CH_2OCH_2CH_2OCH_3$ | $—CH_2OCH_2CH_2OCH_3$ |
| IR-8-7 | —H | —H |
IR-9 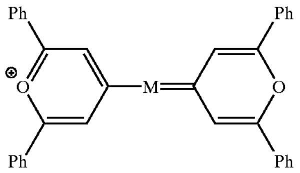
| | —M= |
|---|---|
| IR-9-1 | 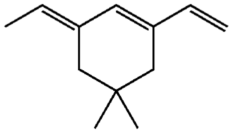 |
| IR-9-2 | 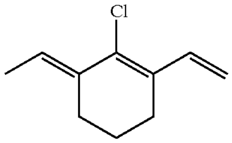 |
| IR-9-3 | 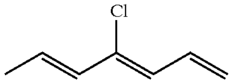 |
| IR-9-4 | 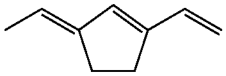 |
| IR-9-5 | 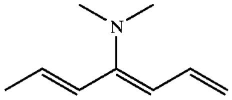 |
| IR-9-6 | 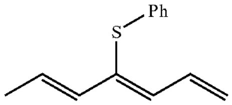 |
| IR-9-7 | 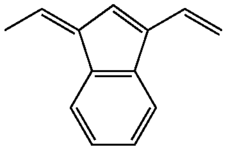 |
| IR-9-8 | 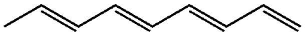 |
| IR-9-9 | 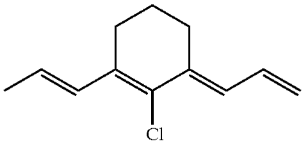 |
| IR-9-10 | 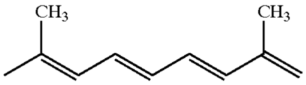 |

-continued
IR-9-11
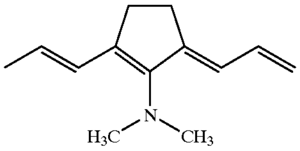
IR-9-12
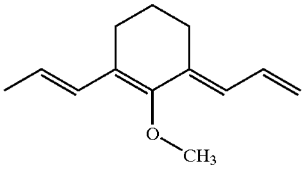
IR-9-13
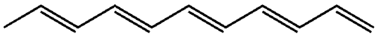
IR-9-14
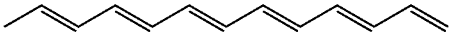
IR-9-15
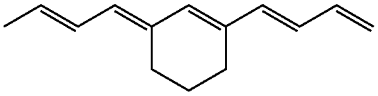
IR-10
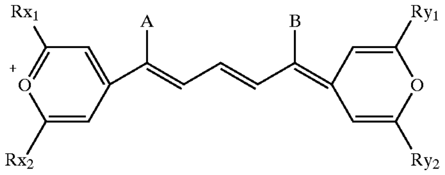
(X = Y = O, $Rx_3 = Rx_4 = Ry_3 = Ry_4 = H$)
| | $Rx_1$ | $Rx_2$ | $Ry_1$ |
|---|---|---|---|
| IR-10-1 | —Ph | 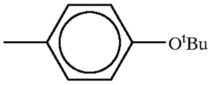 | —Ph |
| IR-10-2 | —Ph | 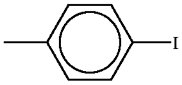 | —Ph |
| IR-10-3 | —$^t$Bu | —Ph | —$^t$Bu |
| IR-10-4 | —$^t$Bu | —Ph | —$^t$Bu |
| IR-10-5 | —$^t$Bu | —Ph | —Ph |
| IR-10-6 | 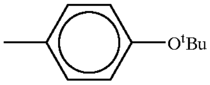 | —Ph | 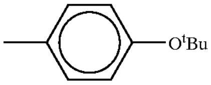 |
| IR-10-7 | 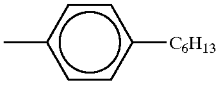 | —Ph | —Ph |
| IR-10-8 | —CN | —CN | —CN |
| IR-10-9 | 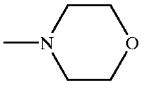 | 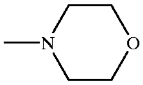 | —Ph |
| IR-10-10 | —$SCH_3$ | —$SCH_3$ | —$SCH_3$ |
| IR-10-11 | —Cl | —Cl | —$^t$Bu |

-continued
| | | | |
|---|---|---|---|
| IR-10-12 | —$OCH_3$ | —$OCH_3$ | 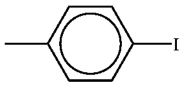 |
| IR-10-13 | 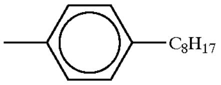 | —Ph | 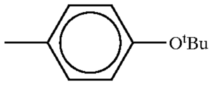 |
| IR-10-14 | —$CO_2CH_3$ | —$CO_2CH_3$ | —Ph |
| IR-10-15 | 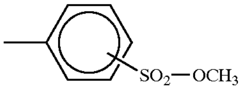 | —Ph | 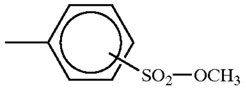 |
| | $Ry_2$ | A | B |
|---|---|---|---|
| IR-10-1 | 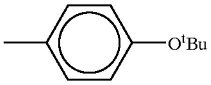 | —$CH_2OCH_3$ | —$CH_2OCH_3$ |
| IR-10-2 | —Ph | —$CH_3$ | —$CH_3$ |
| IR-10-3 | —Ph | —$^nC_5H_{11}$ | —$^nC_5H_{11}$ |
| IR-10-4 | —Ph | —$CH_2OCH_3$ | —$CH_2OCH_3$ |
| IR-10-5 | —Ph | —H | —$^nC_3H_7$ |
| IR-10-6 | —Ph | —$^nC_3H_7$ | —$^nC_3H_7$ |
| IR-10-7 | 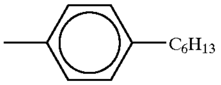 | —$CH_3$ | —$CH_3$ |
| IR-10-8 | —CN | —$CH_3$ | —$CH_3$ |
| IR-10-9 | —Ph | —$CH_2OC_2H_4OCH_3$ | —$CH_2OC_2H_4OCH_3$ |
| IR-10-10 | —$SCH_3$ | —$CH_3$ | —$CH_3$ |
| IR-10-11 | —$^tBu$ | —Ph | —Ph |
| IR-10-12 | —Ph | —$COCH_3$ | —$COCH_3$ |
| IR-10-13 | —Ph | —$^nC_3H_7$ | —$^nC_3H_7$ |
| IR-10-14 | —Ph | —Cl | —Cl |
| IR-10-15 | —Ph | —$C_2H_4Ph$ | —$C_2H_4Ph$ |
IR-11-1
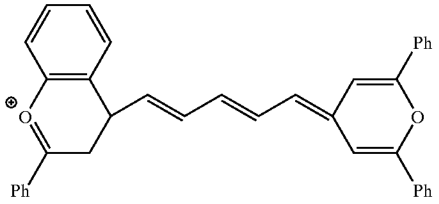
IR-11-2
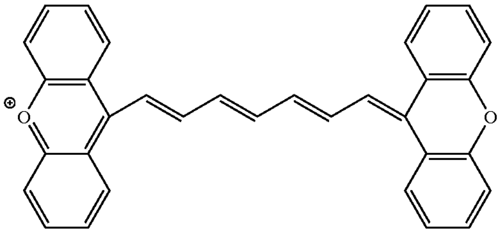
IR-11-3
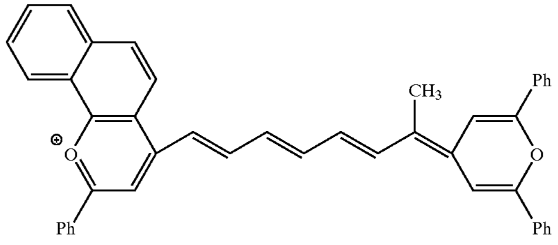

-continued
IR-11-4
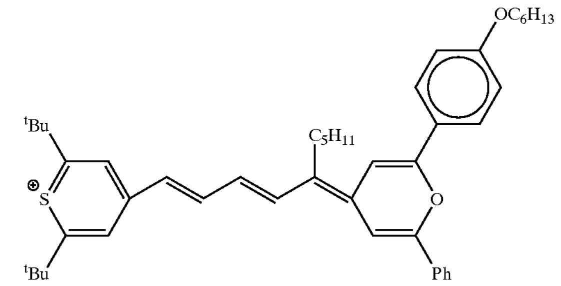
IR-11-5
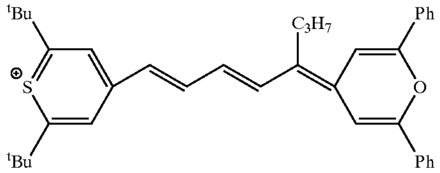
IR-11-6
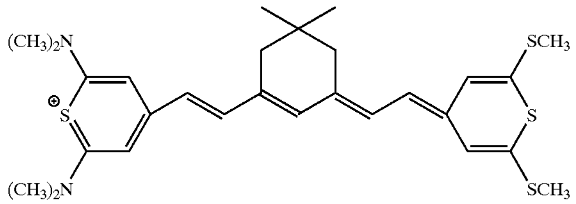
IR-11-7
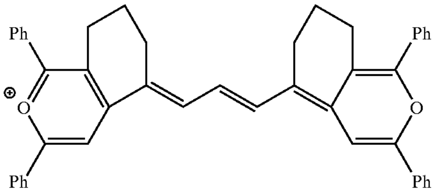
IR-11-8
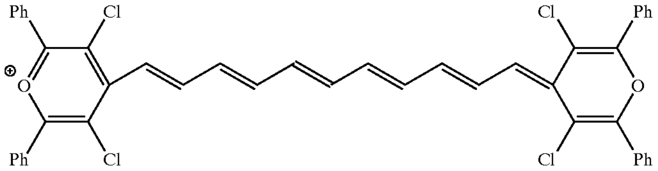
IR-11-9
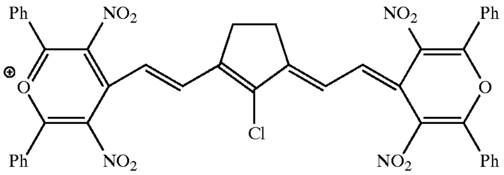

-continued
IR-11-10
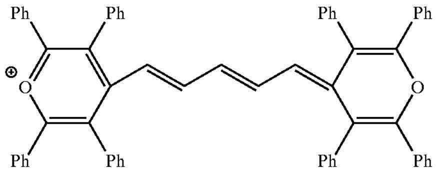
IR-11-11
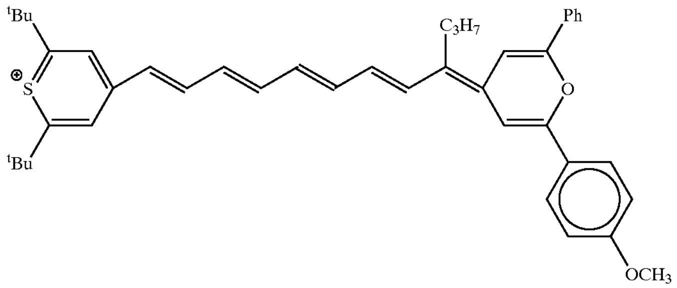
IR-11-12
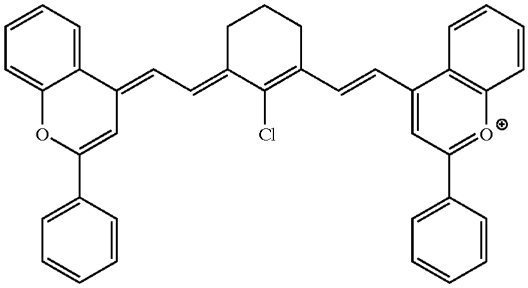
IR-11-13
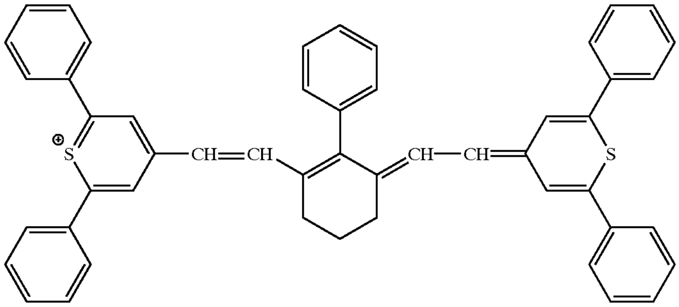
IR-11-14
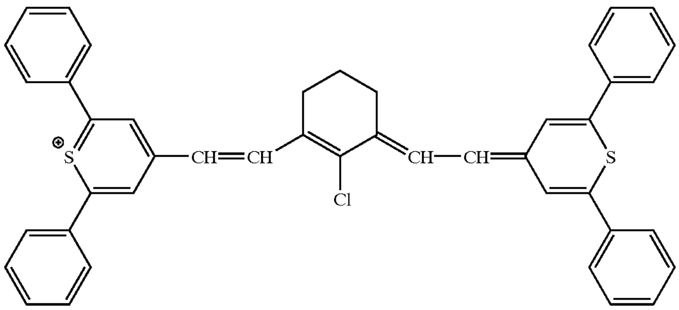
IR-11-15
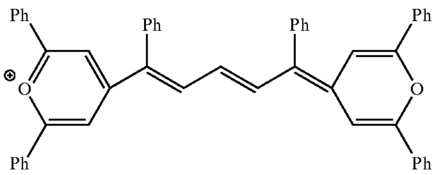

Synthesis Examples

The infrared absorbent expressed by General Formula 2 above can be synthesized by using the method discussed in JP-A No. S61-26044. Specifically, it can be synthesized by condensing a pyrylium nucleus and a methine chain source as shown in the following scheme.

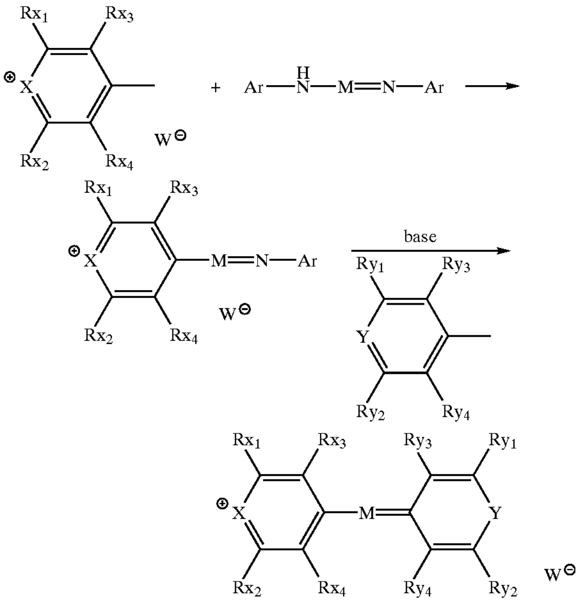

Synthesis Example 1

Synthesis of Infrared Absorbent IR-8-7.$ClO_4^-$

Pyrylium nuclei S-1 (0.01 mol) and methine chain source S-2 (0.005 mol) were mixed with 15 mL of acetic anhydride and heated for 30 minutes at 120° C. Sodium acetate (0.012 mol) was added to this mixture, and another 2 mL of acetic anhydride was added, after which the mixture was heated for 40 minutes at 120° C. This reaction product was put in 100 mL of water, and the precipitated solids were filtered off. After the solids were thoroughly washed with water, they were further washed with hexane to obtain the infrared absorbent IR-8-7.$ClO_4^-$ (λmax 792 nm in $CH_3CN$). The reaction formula is given below.

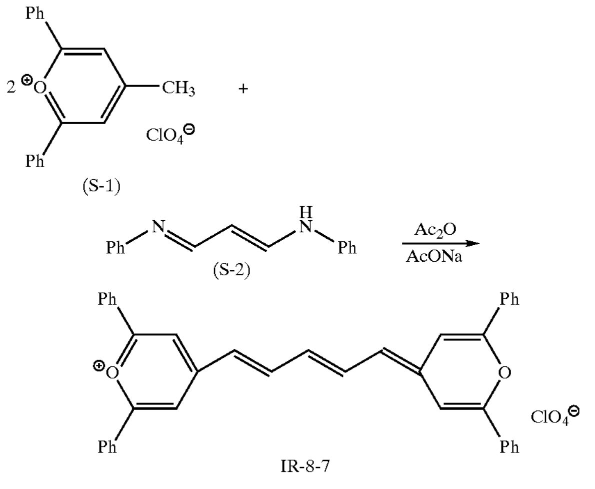

(S-1) (S-2) IR-8-7

Synthesis Example 2

Synthesis of Infrared Absorbent IR-8-2.$ClO_4^-$

Other than changing the pyrylium nuclei S-1 used in Synthesis Example 1 to pyrylium nuclei S-3, the infrared absorbent IR-8-2.$ClO_4^-$ (λmax 813 nm in $CH_3CN$) was obtained in the same manner as in Synthesis Example 1. The reaction formula is given below.

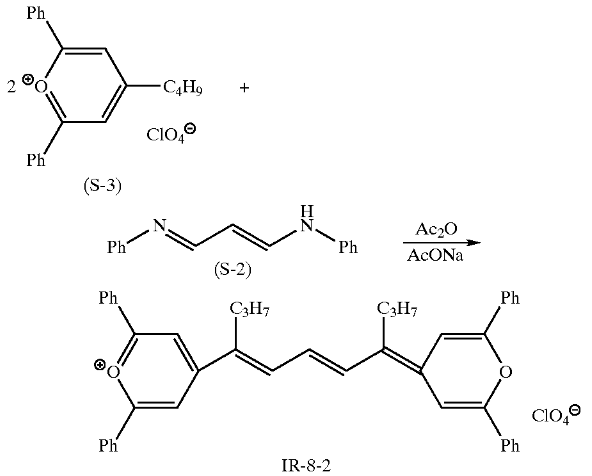

(S-3) (S-2) IR-8-2

In this embodiment, these infrared absorbents can be added in a proportion of 0.01 to 50 wt %, and preferably 0.1 to 20 wt %, and even more preferably 0.5 to 15 wt %, with respect to the total solids of the positive-type photosensitive composition. An image cannot be formed from this positive-type photosensitive composition if the added amount is less than 0.01 wt %, but if 50 wt % is exceeded, there is the danger that the non-image portions will be soiled when the composition is used for the photosensitive layer of a planographic printing plate base.

Other pigments or dyes that exhibit infrared absorption can be added to the positive-type photosensitive composition in this embodiment in addition to the above infrared absorbents, as long as the effect of the embodiment is not compromised. These pigments or dyes are the same as those discussed in the first embodiment, and will not be discussed again in this embodiment.

Alkali-soluble polymers that can be used are the same as those discussed in the first embodiment, and will not be discussed again in this embodiment.

Examples of alkali-soluble polymers that can be used favorably in this embodiment include those having a phenol structure having at least one electron attractive substituent on an aromatic ring, which are discussed in Japanese Patent Application H11-47019. It is particularly favorable for this alkali-soluble polymer to be used together with the infrared absorbent expressed by General Formula 2 above because storage stability will be especially good. This is probably because of the strong hydrogen bond interaction between the phenolic hydroxyl groups and the chalcogen atoms of the infrared absorbent. An improvement in storage stability will be realized if these phenolic hydroxyl groups having electron attractive substituents on aromatic rings are present in a proportion of about 1 mol % of the alkali-soluble polymer.

In the present embodiment, just as in the previous embodiment, a single type of alkali-soluble polymer or a combination of two or more types may be used. The alkali-soluble polymer is added in an amount of 30 to 99 wt %, and preferably 40 to 95 wt %, and even more preferably 50 to 90 wt %, of the total solids of the positive-type photosensitive composition. The durability of the photosensitive layer will suffer if the alkali-soluble polymer is added in an amount less than 30 wt %, but exceeding 99 wt % is undesirable in terms of both sensitivity and durability.

Other Components

The infrared absorbent in this embodiment can be combined with a polyfunctional water-soluble amine discussed in Japanese Patent Application H11-36074 as an additive. The use of this amine compound is desirable from the standpoint of storage stability. This amine compound interacts with the alkali-soluble groups of the alkali-soluble polymer, but because interaction with the chalcogen atoms of the infrared absorbent is also possible in this embodiment, a stronger interaction is produced, which is believed to result in even better storage stability.

A variety of additives can be added to the positive-type photosensitive composition of this embodiment as needed. These additives will not be described in detail because they are the same as those described in the first embodiment.

Just as with the photosensitive composition of the first embodiment, the positive-type photosensitive composition of the present embodiment, which is structured as above, can be used favorably for a planographic printing plate base. The planographic printing plate used in this embodiment will not be described in detail because it is basically the same as that described in the first embodiment.

Examples

Examples of this embodiment will be given, but this embodiment is not limited to or by these examples.

Example 1

Production of Substrate

The substrate used in this embodiment was produced in the same manner as the substrate of the first embodiment, and will therefore not be described in detail.

Production of Planographic Printing Plate Base

A photosensitive solution 1 with the following composition was prepared, and this was applied in a coating amount of 1.8 g/m$^2$ over the above-mentioned substrate (support) to produce the planographic printing plate base of Example 1.

Composition of coating solution 1 m- and p- cresol novolac (m/p ratio=6/4, weight average molecular weight:

3500, unreacted cresol content: 0.5 wt %) . . . 1.0 g

Infrared absorbent shown in Table 4 . . . 0.2 g

Dye in which the counter anion of Victoria Blue BOH was a 1-naphthalenesulfonic acid anion . . . 0.02 g Fluorine-based surfactant (Megafac F-177, made by Dainippon Ink & Chemicals) . . . 0.05 g γ-Butyrolactone . . . 3 g Methyl ethyl ketone . . . 8 g 1-Methoxy-2-propanol . . . 7 g

Examples 2 to 5

Other than using the infrared absorbents shown in Table 4 instead of the infrared absorbent used in the preparation of the photosensitive solution 1 in Example 1, the planographic printing plate bases of Examples 2 to 5 were produced in the same manner as in Example 1.

Comparative Examples 1 and 2

Other than changing the infrared absorbent used in Example 1 to an infrared absorbent B-1 or B-2 expressed by the following formulas, the planographic printing plate bases of Comparative Examples 1 and 2 were obtained in the same manner as in Example 1.

B-1

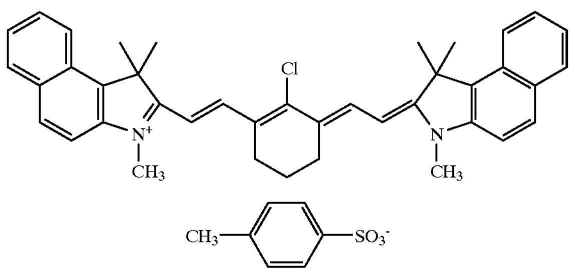

B-2

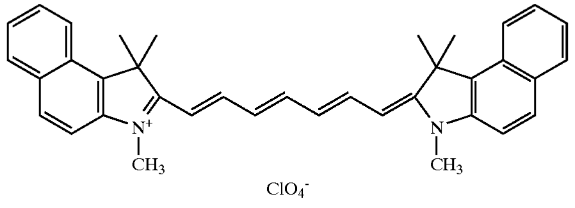

Example 6

Synthesis of Copolymer 1 (Alkali-soluble Polymer)

31.0 g (0.36 mol) of methacrylic acid, 39.1 g (0.36 mol) of ethyl chloroformate, and 200 mL of acetonitrile were put into a 500 mL three-necked flask equipped with an agitator, cooling pipe (condenser), and dropping funnel, and the mixture was agitated while being cooled in an ice water bath. 36.4 g (0.36 mol) of triethylamine was added dropwise to this mixture through the dropping funnel over a period of about 1 hour. Upon completion of the dropping, the ice water bath was taken away and the mixture was agitated for 30 minutes at room temperature.

To this reaction mixture was added 51.7 g (0.30 mol) of p-aminobenzenesulfonamide, and the mixture was agitated for 1 hour while being warmed to 70° C. with an oil bath. Upon completion of the reaction, this mixture was poured into 1 liter of water while the water was agitated, and the mixture thus obtained was agitated for another 30 minutes. This mixture was filtered to remove the precipitate, which was made into a slurry with 500 mL of water, after which this slurry was filtered, and the solids thus obtained were dried, which yielded N-(p-aminosulfonylphenyl) methacrylamide in the form of a white solid (yield: 46.9 g).

Then, 5.04 g (0.0210 mol) of N-(p-aminosulfonylphenyl)-methacrylamide, 2.05 g (0.0180 mol) of ethyl methacrylate, 1.11 g (0.021 mol) of acrylonitrile, and 20 g of N,N-dimethylacetamide were put into a 100 mL three-necked flask equipped with an agitator, cooling pipe (condenser), and dropping funnel, and the mixture was agitated while being heated to 65° C. by a hot water bath. 0.15 g of "V-65" (made by Wako Jun'yaku) was added to this mixture, and the mixture was agitated for 2 hours under a nitrogen gas flow while being held at 65° C. To this mixture, another mixture of 5.04 g of N-(p-aminosulfonylphenyl)methacrylamide, 2.05 g of ethyl methacrylate, 1.11 g of acrylonitrile, 20 g of N,N-dimethylacetamide, and 0.15 g of "V-65" was added dropwise through the dropping funnel over a period of 2 hours. Upon completion of the dropping, the mixture thus obtained was agitated for another 2 hours at 65° C. Upon completion of the reaction, 40 g of methanol was added to the mixture, and the mixture was cooled. The mixture was poured into 2 liters of water while the water was being agitated, and the mixture thus obtained was agitated for 30 minutes, after which the precipitate was filtered off and dried, which yielded 15 g of a white solid. The weight average molecular weight (polystyrene standard) of this copolymer 1 was measured by gel permeation chromatography and found to be 53,000.

Production of Planographic Printing Plate base

Other than using a photosensitive solution 2 with the following composition instead of the photosensitive solution 1 used in Example 1, the planographic printing plate base of Example 6 was produced in the same manner as in Example 1.

Composition of Photosensitive Solution 2

The above-mentioned copolymer 1 . . . 1.0 g

Infrared absorbent shown in Table 2 . . . 0.1 g

Dye in which the counter anion of Victoria Blue BOH was a 1-naphthalenesulfonic acid anion . . . 0.02 g Fluorine-based surfactant (Megafac F-177, made by Dainippon Ink & Chemicals) . . . 0.05 g γ-Butyrolactone . . . 8 g Methyl ethyl ketone . . . 8 g 1-Methoxy-2-propanol . . . 4 g Examples 7 to 10

Other than changing the infrared absorbent used in the preparation of photosensitive solution 2 in Example 6 to the infrared absorbents shown in Table 5, the planographic printing plate bases of Examples 7 to 10 were obtained in the same manner as in Example 6.

Comparative Examples 3 and 4

Other than changing the infrared absorbent used in the preparation of photosensitive solution 2 in Example 6 to an infrared absorbent B-1 or B-2 expressed by the above structural formulas, the planographic printing plate bases of Comparative Examples 3 and 4 were obtained in the same manner as in Example 6.

Example 11

Synthesis of Copolymer 2 (Alkali-soluble Polymer)

4.61 g (0.0192 mol) of N-(p-aminosulfonylphenyl-methacrylamide, 2.94 g (0.0258 mol) of ethyl methacrylate, 0.80 g (0.015 mol) of acrylonitrile, and 20 g of N,N-dimethylacetoamide were put into a 100 mL three-necked flask equipped with an agitator, cooling pipe (condenser), and dropping funnel, and the mixture was agitated while being heated at 65° C. with a hot bath. 0.15 g of "V-65" (made by Wako Jun'yaku) was added to this mixture, and the mixture was agitated for 2 hours under a nitrogen gas flow while being held at 65° C. To this mixture, a mixture of 4.61 g of N-(p-aminosulfonylphenyl)-methacrylamide, 2.94 g of ethyl methacrylate, 0.80 g of acrylonitrile, 20 g of N,N-dimethylacetoamide and 0.15 g of "V-65" were added dropwise through the dropping funnel over a period of 2 hours. Upon completion of the dropping, the mixture thus obtained was agitated for another 2 hours at 65° C. Upon completion of the reaction, 40 g of methanol was added to the mixture, and the mixture was cooled. The mixture thus obtained was poured into 2 liters of water while the water was being agitated, and the mixture thus obtained was agitated for 30 minutes, after which the precipitate was filtered off and dried, which yielded 15 g of a white solid. The weight average molecular weight (polystyrene standard) of this copolymer 2 was measured by gel permeation chromatography and found to be 53,000.

Production of Planographic Printing Plate Base

Other than using a photosensitive solution 3 with the following composition instead of the photosensitive solution 1 used in Example 1, the planographic printing plate base of Example 11 was produced in the same manner as in Example 1.

Composition of coating solution 3

The above-mentioned copolymer 2 . . . 0.75 g m- and p- cresol novolac (m/p ratio=6/4, weight average molecular weight: 3500, unreacted cresol content: 0.5 wt %) . . . 0.25 g Tetrahydrophthalic anhydride . . . 0.03 g Infrared absorbent shown in Table 6 . . . 0.017 g Dye in which the counter anion of Victoria Blue BOH was a 1-naphthalenesulfonic acid anion . . . 0.015 g Fluorine-based surfactant (Megafac F-177, made by Dainippon Ink & Chemicals) . . . 0.05 g γ-Butyrolactone . . . 10 g Methyl ethyl ketone . . . 10 g 1-Methoxy-2-propanol . . . 1 g Examples 12 to 19

Other than changing the infrared absorbent used in the preparation of photosensitive solution 3 in Example 11 to the infrared absorbents shown in Table 6, the planographic printing plate bases of Examples 12 to 19 were obtained in the same manner as in Example 11.

Comparative Examples 5 and 6

Other than changing the infrared absorbent used in the preparation of photosensitive solution 3 in Example 11 to an infrared absorbent B-1 or B-2 expressed by the above structural formulas, the planographic printing plate bases of Comparative Examples 5 and 6 were obtained in the same manner as in Example 11.

Example 20

Synthesis of Alkali-soluble Polymer A 12 weight parts m- and p- cresol novolac (m/p ratio=6/4, weight average molecular weight: 3500, unreacted cresol content: 0.5 wt %) was dissolved in 100 weight parts tetrahydrofuran and agitated at room temperature. 4 weight parts sulfuryl chloride ($So_2Cl_2$) was gradually added dropwise to this solution. The reaction solution was agitated for 8 hours at room temperature, after which it was poured into 1000 weight parts water. The separated alkali-soluble polymer A was taken out and washed with water, which yielded 13 weight parts alkali-soluble polymer A with a chlorination rate of 30 mol % (proportion with respect to phenolic hydroxyl groups). The pKa value of the phenolic hydroxyl groups in which chlorine had been introduced as the above-mentioned electron attractive substituent was 7 to 9.

Production of Planographic Printing Plate Base

Other than using a photosensitive solution 4 with the following composition instead of the photosensitive solution 1 used in Example 1, the planographic printing plate base of Example 20 was produced in the same manner as in Example 1.

Composition of coating solution 4

- The above alkali-soluble polymer A . . . 1.10 g
- Infrared absorbent shown in Table 7 . . . 0.20 g
- Dye in which the counter anion of Victoria Blue BOH was a 1-naphthalenesulfonic acid anion . . . 0.02 g
- Fluorine-based surfactant (Megafac F-177, made by Dainippon Ink & Chemicals) . . . 0.05 g
- γ-Butyrolactone . . . 3.0 g
- Methyl ethyl ketone . . . 8.0 g
- 1-Methoxy-2-propanol . . . 7.0 g

Examples 21 to 24

Other than changing the infrared absorbent used in the preparation of photosensitive solution 4 in Example 20 to the infrared absorbents shown in Table 7, the planographic printing plate bases of Examples 21 to 24 were obtained in the same manner as in Example 20.

Comparative Examples 7 and 8

Other than changing the infrared absorbent used in the preparation of photosensitive solution 4 in Example 20 to an infrared absorbent B-1 or B-2 expressed by the above structural formulas, the planographic printing plate bases of Comparative Examples 7 and 8 were obtained in the same manner as in Example 20.

Example 25

Production of Planographic Printing Plate Base

Other than using a photosensitive solution 5 with the following composition instead of the photosensitive solution 1 used in Example 1, the planographic printing plate base of Example 25 was produced in the same manner as in Example 1.

Composition of Coating Solution 5

- Polyfunctional amine compound A expressed by the following structural formula . . . 0.10 g
- m- and p- cresol novolac (m/p ratio=6/4, weight average molecular weight: 3500, unreacted cresol content: 0.5 wt %) . . . 1.0 g
- Infrared absorbent shown in Table 5 . . . 0.20 g
- Dye in which the counter anion of Victoria Blue BOH was a 1-naphthalenesulfonic acid anion . . . 0.02 g
- Fluorine-based surfactant (Megafac F-177, made by Dainippon Ink & Chemicals) . . . 0.05 g
- γ-Butyrolactone . . . 3.0 g
- Methyl ethyl ketone . . . 8.0 g
- 1-Methoxy-2-propanol . . . 7.0 g

A

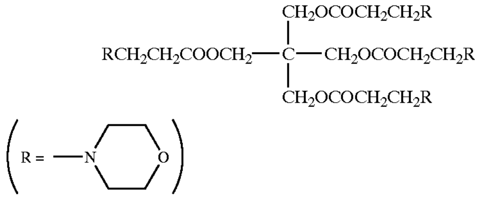

Examples 26 to 29

Other than changing the infrared absorbent used in the preparation of photosensitive solution 5 in Example 25 to the infrared absorbents shown in Table 8, the planographic printing plate bases of Examples 26 to 29 were obtained in the same manner as in Example 25.

Comparative Examples 9 and 10

Other than changing the infrared absorbent used in the preparation of photosensitive solution 5 in Example 25 to an infrared absorbent B-1 or B-2 expressed by the above structural formulas, the planographic printing plate bases of Comparative Examples 9 and 10 were obtained in the same manner as in Example 25.

Evaluation of Sensitivity and Developing Latitude

Each of the planographic printing plate bases of Examples 1 to 29 and Comparative Examples 1 to 10 was exposed using a semiconductor laser with a wavelength of 840 nm or a YAG laser with a wavelength of 1064 nm as shown in tables 4 to 8. The selection of the laser was made according to the absorption wavelength of the infrared absorbing dye that was contained. After exposure, the planographic base was developed using an automatic developing machine ("PS Processor 900VR," made by Fuji Shashin Film) stocked with developing solution DP-4 and rinsing solution FR-3 (1:7) made by Fuji Shashin Film. Two levels of DP-4 were used here; one diluted to 1:7 and one diluted to 1:12.

The line width of the non-image areas obtained with the above-mentioned DP-4 developing solution (diluted to 1:7) was measured, the irradiation energy of the laser corresponding to this line width was determined, and this was termed an index of sensitivity ($mJ/cm^2$). The smaller is this measured value ($mJ/cm^2$), the higher is the sensitivity of the planographic printing plate.

Next, the line widths of the non-image areas obtained with the developing solution diluted to 1:7 (standard) and with the developing solution diluted to 1:12 (more dilute) were measured, the irradiation energy of the laser corresponding to this line widths was determined, and the difference between the two sensitivity levels was termed an index of developing latitude. The smaller is this difference, the better is the developing latitude, with a practical level being 20 $mJ/cm^2$ or less.

Evaluation of Storage Stability

The planographic printing plate bases of Examples 1 to 29 and Comparative Examples 1 to 10 were each stored for 3 days at a temperature of 60° C., after which laser exposure and developing were carried out in the same manner as above, sensitivity was determined in the same manner, this was compared with the above results, and the resulting difference was termed an index of storage stability. Storage stability was judged to be good if the fluctuation in sensitivity was no more than 20 $mJ/cm^2$, which is a practical level.

TABLE 4

| | Infrared absorbent | | | | | |
|---|---|---|---|---|---|---|
| | Infrared absorbing coloring material | Counter anion | Sensitivity | Developing latitude | Exposure wavelength (nm) | Change in energy over time |
| Example 1 | IR-1-10 | $SbCl_6^-$ | 115 | 5 | 840 | 15 |
| Example 2 | IR-2-3 | 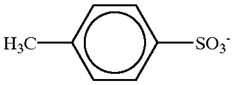 | 110 | 5 | 840 | 15 |
| Example 3 | IR-3-1 | $BF_4^-$ | 120 | 10 | 840 | 15 |
| Example 4 | IR-10-6 | $C_8H_{17}SO_3^-$ | 110 | 15 | 840 | 15 |
| Example 5 | IR-3-6 | $CF_3C_2^-$ | 120 | 10 | 1064 | 10 |
| Comparative Example 1 | B-1 | | 135 | 30 | 840 | 30 |
| Comparative Example 2 | B-2 | | 135 | 40 | 840 | 25 |

TABLE 5

| | Infrared absorbent | | | | | |
|---|---|---|---|---|---|---|
| | Infrared absorbing coloring material | Counter anion | Sensitivity | Developing latitude | Exposure wavelength (nm) | Change in energy over time |
| Example 6 | IR-8-1 | $ClO_4^-$ | 110 | 10 | 840 | 15 |
| Example 7 | IR-8-2 | $ClO_4^-$ | 105 | 5 | 840 | 15 |
| Example 8 | IR-8-7 | $ClO_4^-$ | 120 | 10 | 840 | 15 |
| Example 9 | IR-5-5 | $Ph_4B^-$ | 125 | 10 | 1064 | 15 |
| Example 10 | IR-9-13 | 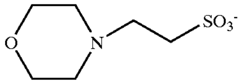 | 115 | 15 | 1064 | 15 |
| Comparative Example 3 | B-1 | | 130 | 30 | 840 | 40 |
| Comparative Example 4 | B-2 | | 145 | 25 | 840 | 35 |

TABLE 6

| | Infrared absorbent | | | | | |
|---|---|---|---|---|---|---|
| | Infrared absorbing coloring material | Counter anion | Sensitivity | Developing latitude | Exposure wavelength (nm) | Change in energy over time |
| Example 11 | IR-9-1 | $PhSO_3^-$ | 115 | 15 | 840 | 15 |
| Example 12 | IR-9-7 | $Br^-$ | 120 | 10 | 840 | 15 |
| Example 13 | IR-10-1 | 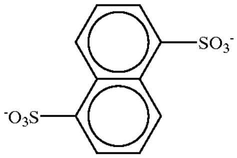 | 110 | 15 | 840 | 15 |
| Example 14 | IR-10-6 | $ClO_4^-$ | 105 | 10 | 840 | 15 |
| Example 15 | IR-10-13 | 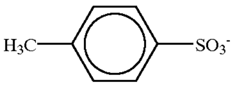 | 110 | 10 | 840 | 15 |

TABLE 6-continued

| | Infrared absorbent | | | | | |
|---|---|---|---|---|---|---|
| | Infrared absorbing coloring material | Counter anion | Sensitivity | Developing latitude | Exposure wavelength (nm) | Change in energy over time |
| Example 16 | IR-11-5 | 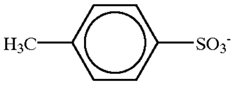 | 110 | 10 | 840 | 15 |
| Example 17 | IR-11-7 | 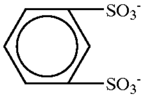 | 115 | 15 | 840 | 10 |
| Example 18 | IR-9-14 | $CF_3SO_3^-$ | 125 | 10 | 1064 | 15 |
| Example 19 | IR-11-11 | $CH_3SO_3^-$ | 115 | 10 | 1064 | 15 |
| Comparative Example 5 | B-1 | | 135 | 30 | 840 | 40 |
| Comparative Example 6 | B-2 | | 130 | 40 | 840 | 30 |

TABLE 7

| | Infrared absorbent | | | | | |
|---|---|---|---|---|---|---|
| | Infrared absorbing coloring material | Counter anion | Sensitivity | Developing latitude | Exposure wavelength (nm) | Change in energy over time |
| Example 20 | IR-1-10 | $Ph_4B^-$ | 120 | 5 | 840 | 10 |
| Example 21 | IR-2-3 | $ClO_4^-$ | 110 | 5 | 840 | 5 |
| Example 22 | IR-8-2 | $BF_4^-$ | 105 | 10 | 840 | 5 |
| Example 23 | IR-10-6 | $C_8H_{17}SO_3^-$ | 110 | 10 | 840 | 10 |
| Example 24 | IR-9-13 | 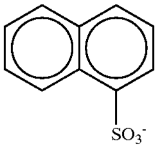 | 120 | 10 | 1064 | 5 |
| Comparative Example 7 | B-1 | | 135 | 25 | 840 | 20 |
| Comparative Example 8 | B-2 | | 135 | 25 | 840 | 20 |

TABLE 8

| | Infrared absorbent | | | | | |
|---|---|---|---|---|---|---|
| | Infrared absorbing coloring material | Counter anion | Sensitivity | Developing latitude | Exposure wavelength (nm) | Change in energy over time |
| Example 25 | IR-8-2 | $ClO_4^-$ | 110 | 10 | 840 | 5 |
| Example 26 | IR-9-1 | $ClO_4^-$ | 115 | 5 | 840 | 10 |
| Example 27 | IR-8-7 |  | 120 | 10 | 840 | 5 |
| Example 28 | IR-10-6 | $Ph_4B^-$ | 110 | 10 | 840 | 5 |
| Example 29 | IR-9-13 | $I^-$ | 120 | 15 | 1064 | 10 |
| Comparative Example 9 | B-1 | | 130 | 25 | 840 | 20 |
| Comparative Example 10 | B-2 | | 145 | 25 | 840 | 20 |

It can be seen from the above results that the planographic printing plate bases of Examples 1 to 29 had higher sensitivity to an infrared laser than the planographic printing plate bases of Comparative Examples 1 to 10, and that the difference in sensitivity between developing solutions of the two dilution concentrations was markedly smaller, with the developing latitude being well within a practical range.

Furthermore, all of the planographic printing plate bases of Examples 1 to 29 had a fluctuation in sensitivity before and after storage that was far smaller than with the planographic printing plate bases of Comparative Examples 1 to 10, meaning that storage stability was superior and was well within the practical range.

If we look at Examples 1 to 19, we see that coloring materials having a side chain on a methine chain (IR2-8, 8-1, 8-2, 10-1, 10-6, 10-13, 11-5, and 11-11) tend to have particularly high sensitivity. It is probably because the generated heat is transmitted to the alkali-soluble polymer efficiently due to the good miscibility of these coloring materials with the alkali-soluble polymer. Sensitivity was also higher with an organic anion such as $ClO_4^-$, a sulfonate, or a carboxylate. The reason for this seems to be that $ClO_4^-$ and the like are able to generate heat through decomposition, and that an organic anion has superior miscibility with the alkali-soluble polymer.

If we look at Examples 20 to 24, we see that the developing latitude is particularly good, with little change in the amount of energy and little fluctuation over time, when the infrared absorbent expressed by the above General Formula 2 and an alkali-soluble polymer containing a phenol having electron attractive groups are used.

Furthermore, if we look at Examples 25 to 29, we see that the developing latitude is also particularly good, with little change in the amount of energy and little fluctuation over time, when the infrared absorbent expressed by the above General Formula 2 and a polyfunctional amine compound are used.

In summary, this embodiment provides a positive-type photosensitive composition with which direct plate making is possible by using a solid state laser or semiconductor laser that emit infrared rays and recording from the digital data of a computer or the like, and which has high sensitivity to the above-mentioned infrared lasers and good developing latitude and storage stability.

What is claimed is:

1. A positive-working photosensitive composition, comprising:

(a) a macromolecular compound having alkali-soluble groups; and (b) a compound that has a phthalocyanine skeleton, has in its molecule at least one group which can form a bond by interaction with the alkali-soluble group in said macromolecular compound and is defined by General Formula 1 below, wherein said alkali-soluble groups of said (a) macromolecular compound is selected from the group consisting of a phenolic hydroxyl group (—Ar—OH wherein Ar is an unsubstituted or substituted divalent aryl group), a sulfonamide group ($—SO_2NH—R$ wherein R is an unsubstituted or substituted hydrocarbon group) and an active imide group ($—SO_2NHCOR$, $—SO_2NHSO_2R$, $—CONHSO_2R$ wherein R is an unsubstituted or substituted hydrocarbon group), and said photosensitive composition becomes substantially soluble in an alkali aqueous solution upon irradiation with infrared rays General Formula 1

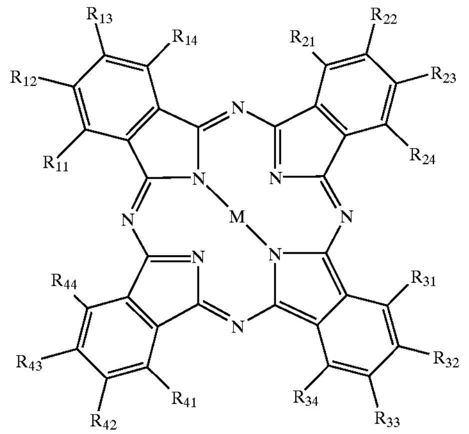

wherein $R_{11}$ to $R_{14}$, $R_{21}$ to $R_{24}$, $R_{31}$ to $R_{34}$ and $R_{41}$ to $R_{44}$ each independently represent a substitutable hydrogen atom, halogen atom, cyano group, alkyl group, aryl group, alkenyl group, alkynyl group, hydroxyl group, carbonyl group, thio group, sulfonyl group, sulfinyl group, oxy group, amino group, or onium salt structure, and at least one of $R_{11}$ to $R_{14}$, $R_{21}$ to $R_{24}$, $R_{31}$ to $R_{34}$ and $R_{41}$ to $R_{44}$ is selected from the group consisting of an amino group, hydroxyl group, thio group, carbonyl group, sulfonyl group, sulfinyl group, oxy group, and onium salt structure; two or more of the $R_{11}$ to $R_{44}$ groups may be bonded together to form a ring; and M represents two hydrogen or metal atoms, a halometal group, or oxymetal group.

2. The positive-working photosensitive composition according to claim 1, wherein said compound that has a phthalocyanine skeleton includes M which is a metal atom selected from the metals consisting of Group IA, IIA, IIIB, and IVB of the Periodic Table, a transition metal from the first, second, and third period, and a lanthanoid element.

3. The positive-working photosensitive composition according to claim 2, wherein said metal atom is selected from the group consisting of copper, magnesium, iron, zinc, cobalt, aluminum, titanium, and vanadium.

4. The positive-working photosensitive composition according to claim 1, wherein the halogen atom in said halometal group is selected from the group consisting of chlorine, fluorine, bromine, and iodine.

5. The positive-working photosensitive composition according to claim 1, wherein said compound that has a phthalocyanine skeleton, exhibits solubility of at least 0.001 wt % in a solution used for coating.

6. A planographic printing plate, comprising:

(a) a support; and (b) a positive-working photosensitive composition provided on the support, the photosensitive composition including:

(i) a macromolecular compound having alkali-soluble groups; and (ii) a compound having a phthalocyanine skeleton defined by a General Formula 1 below, and at least one group in its molecule bondable by interaction with the alkali-soluble group in said macromolecular compound, wherein said photosensitive composition becomes substantially soluble in an alkali aqueous solution upon irradiation with infrared rays, thereby permitting image formation by developing with said alkali aqueous solution General Formula 1

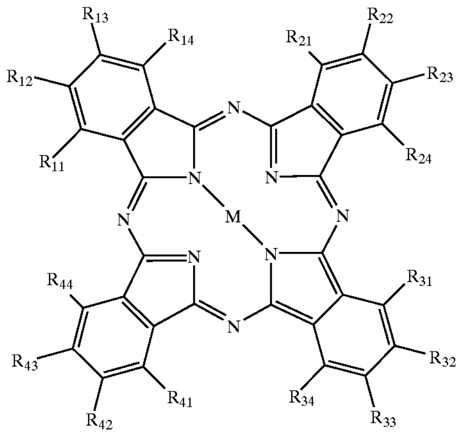

wherein $R_{11}$ to $R_{14}$, $R_{21}$ to $R_{24}$, $R_{31}$ to $R_{34}$ and $R_{41}$ to $R_{44}$ each independently represent a substitutable hydrogen atom, halogen atom, cyano group, alkyl group, aryl group, alkenyl group, alkynyl group, hydroxyl group, carbonyl group, thio group, sulfonyl group, sulfinyl group, oxy group, amino group, or onium salt structure, and at least one of $R_{11}$ to $R_{14}$, $R_{21}$ to $R_{24}$, $R_{31}$ to $R_{34}$ and $R_{41}$ to $R_{44}$ is selected from the group consisting of an amino group, hydroxyl group, thio group, carbonyl group, sulfonyl group, sulfinyl group, oxy group, and onium salt structure; two or more of the $R_{11}$ to $R_{44}$ groups may be bonded together to form a ring; and M represents two hydrogen or metal atoms, a halometal group, or oxymetal group.

* * * * *